US010761147B2

(12) United States Patent
Beaudet et al.

(10) Patent No.: US 10,761,147 B2
(45) Date of Patent: Sep. 1, 2020

(54) TRANSFORMER MONITORING AND DATA ANALYSIS SYSTEMS AND METHODS

(71) Applicant: Grid2020, Inc., Richmond, VA (US)

(72) Inventors: Joseph O. Beaudet, Disputanta, VA (US); Sergio Angeli, San Clemente, CA (US)

(73) Assignee: GRID20/20, Inc., Richmond, VA (US)

( * ) Notice: Subject to any disclaimer, the term of this patent is extended or adjusted under 35 U.S.C. 154(b) by 0 days.

(21) Appl. No.: 15/701,023

(22) Filed: Sep. 11, 2017

(65) Prior Publication Data

US 2018/0143237 A1    May 24, 2018

Related U.S. Application Data

(63) Continuation-in-part of application No. 15/357,766, filed on Nov. 21, 2016, now abandoned.

(51) Int. Cl.
| | | |
|---|---|---|
| *G01R 31/40* | (2020.01) | |
| *G01R 31/62* | (2020.01) | |
| *G01R 22/06* | (2006.01) | |
| *G01R 19/25* | (2006.01) | |
| *H04Q 9/02* | (2006.01) | |
| *G01R 31/42* | (2006.01) | |
| *G01R 31/00* | (2006.01) | |
| *H04Q 9/00* | (2006.01) | |
| *G01R 19/165* | (2006.01) | |

(Continued)

(52) U.S. Cl.
CPC ....... *G01R 31/62* (2020.01); *G01R 19/16538* (2013.01); *G01R 19/25* (2013.01); *G01R 19/2513* (2013.01); *G01R 22/063* (2013.01); *G01R 31/002* (2013.01); *G01R 31/40* (2013.01); *G01R 31/42* (2013.01); *H04Q 9/00* (2013.01); *H04Q 9/02* (2013.01); *G01K 13/00* (2013.01); *H02S 50/00* (2013.01); *H02S 50/10* (2014.12); *H04L 67/12* (2013.01); *H04Q 2209/40* (2013.01); *H04Q 2209/60* (2013.01); *Y04S 40/18* (2018.05)

(58) Field of Classification Search
CPC ...... G01R 31/40; G01R 31/42; G01R 31/025; G01R 19/16538; G01R 19/2513; H02S 50/10; H02S 50/00
USPC ......... 324/71, 378, 403, 415, 425, 500, 537, 324/764.01
See application file for complete search history.

(56) References Cited

U.S. PATENT DOCUMENTS

| | | | | |
|---|---|---|---|---|
| 2009/0187284 A1* | 7/2009 | Kreiss | .................... | G06Q 50/06 700/291 |
| 2010/0036624 A1* | 2/2010 | Martin | ................... | G01R 22/10 702/61 |

(Continued)

*Primary Examiner* — Raul J Rios Russo
(74) *Attorney, Agent, or Firm* — Dennen IP Law, LLC

(57) ABSTRACT

A monitoring system has one or more voltage sensors configured integral in a single housing for detecting a voltage of a power cable of a transformer and one or more current sensors integral in the single housing configured for detecting a current in the power cable of a transformer. Further, the monitoring sensor has at least one internal sensor integral with the voltage sensor and the current sensor, the internal sensor configured for detecting operational data corresponding to the distribution transformer and a processor configured to receive operational data indicative of the detected operational value and perform an action based upon the operational data received.

31 Claims, 29 Drawing Sheets

(51) Int. Cl.
  *G01K 13/00* (2006.01)
  *H04L 29/08* (2006.01)
  *H02S 50/10* (2014.01)
  *H02S 50/00* (2014.01)

(56) References Cited

U.S. PATENT DOCUMENTS

| | | | | |
|---|---|---|---|---|
| 2013/0335061 A1* | 12/2013 | de Buda | ................ | G01R 21/06 324/127 |
| 2013/0335062 A1* | 12/2013 | de Buda | ................ | G01R 21/00 324/142 |
| 2014/0300344 A1* | 10/2014 | Turner | ................ | G01R 21/133 324/107 |
| 2015/0276890 A1* | 10/2015 | Turner | ................... | G01R 31/40 324/764.01 |
| 2019/0277898 A1* | 9/2019 | Beaudet | ................ | G01R 31/42 |

* cited by examiner

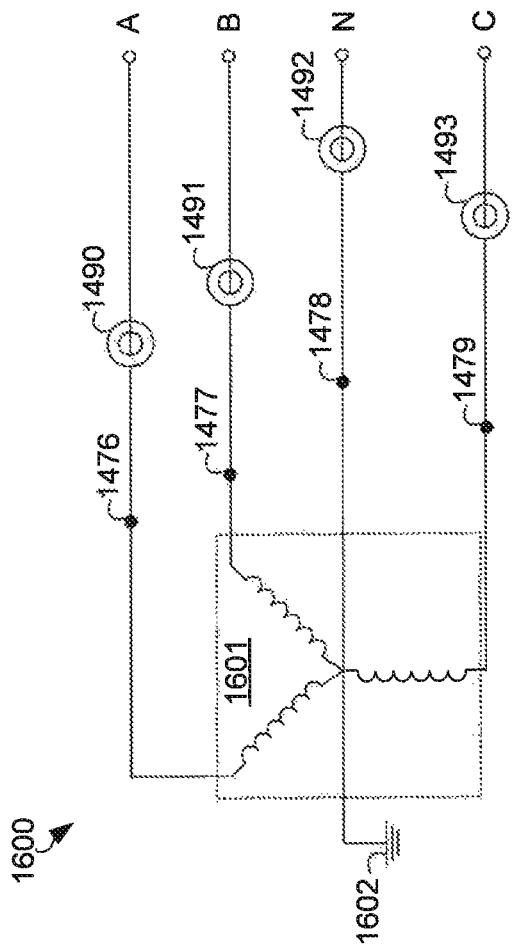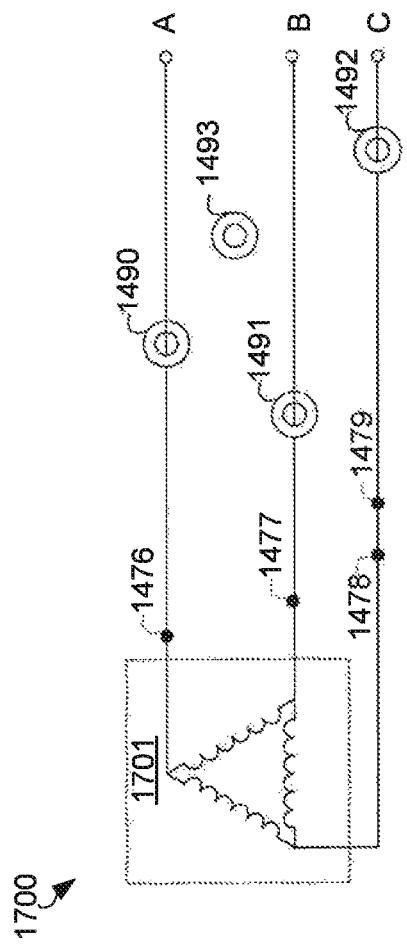

TRANSFORMER MONITORING AND DATA ANALYSIS SYSTEMS AND METHODS

CROSS REFERENCE TO RELATED APPLICATIONS

This application is a continuation in part and claims priority to U.S. patent application Ser. No. 15/357,766 entitled Transformer Monitoring and Data Analysis Systems and Methods, filed Nov. 21, 2016, which claims priority to U.S. patent application Ser. No. 14/231,578 entitled Power Monitoring System and Method, filed Mar. 31, 2014, which claims priority to U.S. Provisional Patent Application Ser. No. 61/806,513 entitled Power Monitoring System and Method, filed Mar. 29, 2013, each of which is incorporated herein by reference in their entirety.

BACKGROUND

Power is generated, transmitted, and distributed to a plurality of endpoints, such as for example, customer or consumer premises (hereinafter referred to as "consumer premises"). Consumer premises may include multiple-family residences (e.g., apartment buildings, retirement homes), single-family residences, office buildings, event complexes (e.g., coliseums or multi-purpose indoor arenas, hotels, sports complexes), shopping complexes, or any other type of building or area to which power is delivered.

The power delivered to the consumer premises is typically generated at a power station. A power station is any type of facility that generates power by converting mechanical power of a generator into electrical power. Energy to operate the generator may be derived from several different types of energy sources, including fossil fuels (e.g., coal, oil, natural gas), nuclear, solar, wind, wave, or hydroelectric. Further, the power station typically generates alternating current (AC) power.

The AC power generated at the power station is typically increased (the voltage is "stepped up") and transmitted via transmission lines typically to one or more transmission substations. The transmission substations are interconnected with a plurality of distribution substations to which the transmission substations transmit the AC power. The distribution substations typically decrease the voltage of the AC power received (the voltage is "stepped down") and transmit the reduced voltage AC power to distribution transformers that are electrically connected to a plurality of consumer premises. Thus, the reduced voltage AC power is delivered to a plurality of consumer premises. Such a web or network of interconnected power components, transmission lines, and distribution lines is oftentimes referred to as a power grid.

Throughout the power grid, measurable power is generated, transmitted, and distributed. In this regard, at midpoints or endpoints throughout the grid, measurements of power received and/or distributed may indicate information related to the power grid. For example, if power distributed at the endpoints on the grid is considerably less than the power received at, for example, distribution transformers, then there may be a system issue that is impeding delivery of power or power may be being diverted through malice. Such power data collection at any of the described points in the power grid and analysis of such data may further aid power suppliers in generating, transmitting, and distributing power to consumer premises.

SUMMARY

The present disclosure is a distribution transformer monitoring device for monitoring electric power grids. The distribution transformer monitoring device comprises one or more voltage sensors and one or more current sensors.

In one embodiment, the distribution transformer monitoring device may comprise one or more operational sensors to monitor operational values or measure other quantities, e.g., temperature, vibration, and geo-positioning. Additionally, the distribution transformer monitoring device may comprise one or more local interfaces to connect to other external sensors located in proximity of the device, e.g., a fault indicator or an external temperature probe. The interfaces can be wired, such as electrical or optical, or wireless, e.g., ZigBee or other short range radio interfaces.

Further, the distribution transformer monitoring device comprises at least one processor, and other components, such as memory, configured for collecting samples measured by the sensors and acting upon the collected data. In this regard, the processor is configured to act based upon pre-programmed logic, e.g., firmware. The processor, based upon the samples measured, is configured to perform calculations, store data, take actions based on the data values, and calculate results.

Additionally, the distribution transformer monitoring device may comprise non-volatile memory to store logic for executing the above-described actions. The non-volatile memory may also comprise configuration settings, e.g., pre-determined threshold values, collected data, and computed results.

The distribution transformer monitoring device may also comprise a long distance, two-way communication interface to communicate remotely with a central computing device. In this regard, the logic described hereinabove may report information to the remote central computing device, receive instructions, and receive new logic, or receive configuration settings from the central computing device.

In another embodiment, the distribution transformer monitoring device comprises a local user interface. The local user interface may display data and/or accept local user input.

The present disclosure further describes a central computing device that is configured to interact with a plurality of remotely located distribution transformer monitoring devices. In this regard, the central computing device comprises logic configured to collect data from the distribution transformer monitoring device, interpret data received from the distribution transformer monitoring device, and perform operations based upon the data received from the distribution transformer monitoring devices. The central computing device is further configured to transmit instructions, transmit new logic, or transmit new configuration data to the distribution transformer monitoring devices. Additionally, the central computing device is configured to perform remote diagnostics on the distribution transformer monitoring devices.

The central computing device also provides information to users of the central computing device via a graphical user interface (GUI). Further, the central computing device is configured to communicate with users, e.g., utility personnel, via e-mail, text messaging, file sharing, and other messaging.

The central computing device is further configured to interface with third party systems and applications, e.g., Supervisory Control and Data Acquisition (SCADA) systems, meter data management system, outage notification systems, and the like. Such communication with these third-party systems is effectuated using standard and/or proprietary protocols to retrieve and/or send information automatically or upon demand.

BRIEF DESCRIPTION OF THE DRAWINGS

The present disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

FIG. 16 is a diagram depicting a method of monitoring power with a PDTM of FIG. 14 in accordance with the system such as is depicted in FIG. 1 for a wye transformer configuration.

FIG. 17 is a diagram depicting a method of monitoring power with a PDTM of FIG. 14 in accordance with the system such as is depicted in FIG. 1 for a Delta transformer configuration.

DETAILED DESCRIPTION

Figure 1:
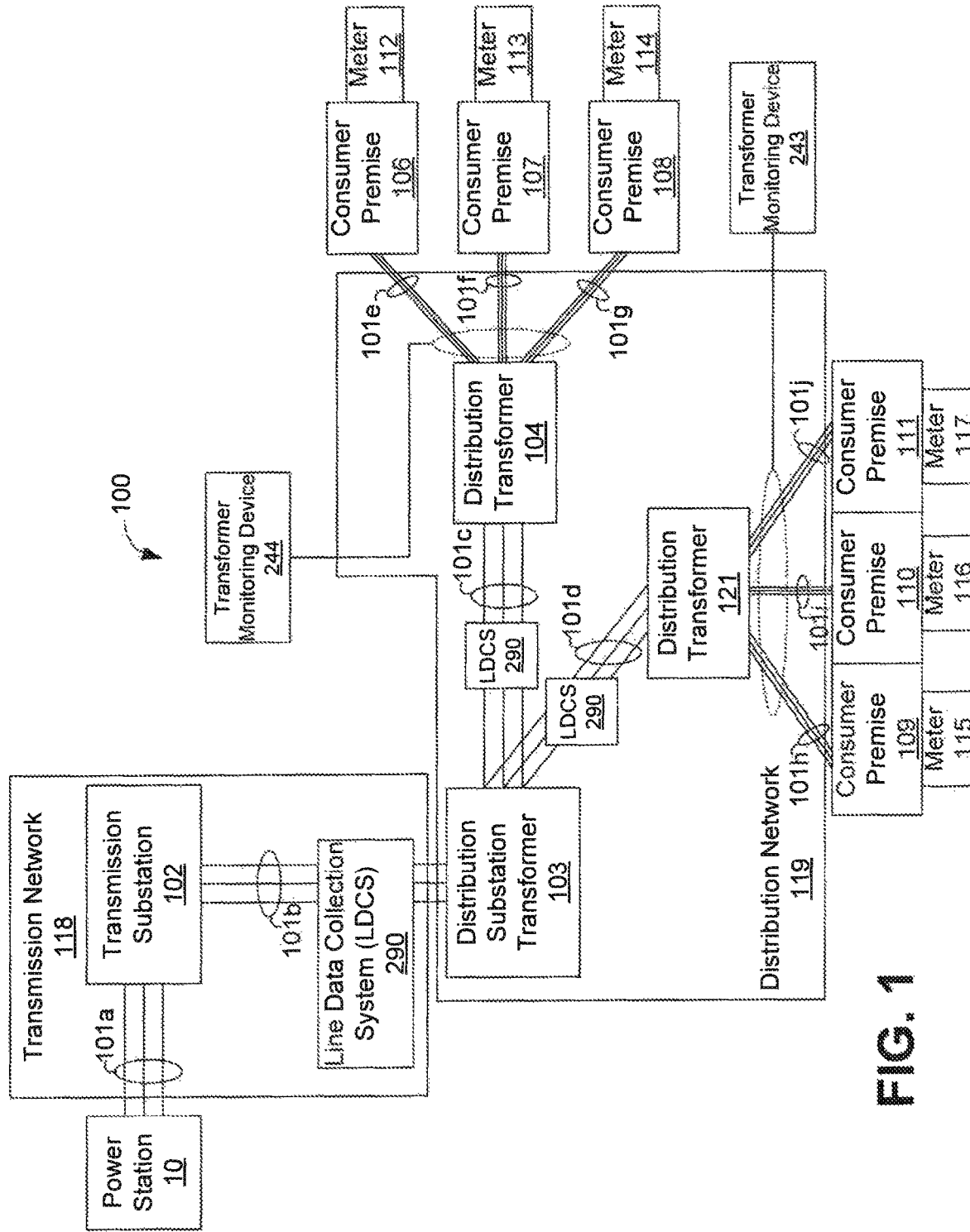
FIG. 1 is a diagram depicting an exemplary power transmission and distribution system in accordance with an embodiment of the present disclosure.

FIG. 1 is a block diagram illustrating a power transmission and distribution system 100 for delivering electrical power to one or more consumer premises 106-111. The one or more consumer premises 106-111 may be business consumer premises, residential consumer premises, or any other type of consumer premise. A consumer premise is any structure or area to which power is delivered.

The power transmission and distribution system 100 comprises at least one transmission network 118, at least one distribution network 119, and the consumer premises 106-111 (described above) interconnected via a plurality of power lines 101a-101j.

In this regard, the power transmission and distribution system 100 is an electric "grid" for delivering electricity generated by a power station 10 to the one or more consumer premises 106-111 via the transmission network 118 and the distribution network 119.

Note that the power lines 101a and 101b are exemplary transmission lines, while power lines 101c, 101d, are exemplary distribution lines. In one embodiment, the transmission lines 101a and 101b transmit electricity at high voltage (110 kV or above) and transmit electricity via overhead power lines. At distribution transformers, the AC power is transmitted over the distribution lines at lower voltage (e.g., 25 kV or less). Note that in such an embodiment, the power transmission described uses three-phase alternating current (AC). However, other types of power and/or power transmission may be used in other embodiments.

The transmission network 118 comprises one or more transmission substation 102 (only one is shown for simplicity). The power station 10 is electrically coupled to the transmission substation 102 via the power lines 101a, and the transmission substation 102 is electrically connected to the distribution network 119 via the power lines 101b. As described hereinabove, the power station 10 (transformers not shown located at the power station 10) increases the voltage of the power generated prior to transmission over the transmission lines 101a to the transmission substation 102. Note that three wires are shown making up the power lines 101a indicating that the power transmitted to the transmission substation 102 is three-phase AC power. However, other types of power may be transmitted in other embodiments.

In this regard, at the power station 10, electricity is generated, and the voltage level of the generated electricity is "stepped up," i.e., the voltage of the generated power is increased to high voltage (e.g., 110 kV or greater), to decrease the amount of losses that may occur during transmission of the generated electricity through the transmission network 118.

Note that the transmission network 118 depicted in FIG. 1 comprises only two sets of transmission lines 101a and 101b (three lines each for three-phase power transmissions as indicated hereinabove) and one transmission substation 102. The configuration of FIG. 1 is merely an exemplary configuration. The transmission network 118 may comprise additional transmission substations interconnected via a plurality of additional transmission lines. The configuration of the transmission network 118 may depend upon the distance that the voltage-increased electricity may need to travel to reach the desired distribution network 119.

The distribution network 119 transmits electricity from the transmission network 118 to the consumer premises 106-111. In this regard, the distribution network 119 comprises a distribution substation transformer 103 and one or more distribution transformers 104 and 121. Note that the configuration shown in FIG. 1 comprising the distribution substation transformer 103 and two distribution transformers 104 and 121 and showing the distribution substation transformer 103 physically separated from the two distribution transformers 104 and 121 is an exemplary configuration. Other configurations are possible in other embodiments.

As an example, the distribution substation transformer 103 and the distribution transformer 104 may be housed or combined in other configurations of the distribution network 119 (as well as distribution substation transformer 103 and distribution transformer 121). In addition, one or more transformers may be used to condition the electricity, i.e., transform the voltage of the electricity, to an acceptable voltage level for delivery to the consumer premises 106-111. The distribution substation transformer 103 and the distribution transformer 104 may "step down," i.e., decrease the voltage of the electricity received from the transmission network 118, before the distribution substation transformer 103 and the distribution transformers 104, 121 transmit the electricity to its intended destinations, e.g., the consumer premises 106-111.

As described hereinabove, in operation the power station 10 is electrically coupled to the transmission substation 102 via the power lines 101a. The power station 10 generates electricity and transmits the generated electricity via the power lines 101a to the transmission substation 102. Prior to transmission, the power station 10 increases the voltage of the electricity so that it may be transmitted over greater distances efficiently without loss that affects the quality of the electricity delivered. As further indicated hereinabove, the voltage of the electricity may need to be increased to minimize energy losses as the electricity is being transmitted on the power lines 101b. The transmission substation 102 forwards the electricity to the distribution substation transformer 103 of the distribution network 119.

When the electricity is received, the distribution substation transformer 103 decreases the voltage of the electricity to a range that is useable by the distribution transformers 104, 121. Likewise, the distribution transformers 104, 121 may further decrease the voltage of the electricity received to a range that is useable by the respective electrical systems (not shown) of the consumer premises 106-111.

In one embodiment of the present disclosure, the distribution transformers 104, 121 are electrically coupled to distribution transformer monitoring devices 244, 243, respectively. The distribution transformer monitoring devices 244, 243 of the present disclosure comprises one or more electrical devices that measure operational data via one or more electrical interfaces with the distribution transformers 104, 121. Exemplary operational data includes data related to electricity that is being delivered to or transmitted from the distribution transformers 104, 121, e.g., power measurements, energy measurements, voltage measurements, current measurements, etc. The operational data may also include data indicative of power received from energy sources on the customer premises, e.g., solar or wind power. In addition, the distribution transformer monitoring devices 244, 243 may collect operational data related to the environment in which the distribution transformers 104, 121 are situated, e.g., operating temperature of the distribution transformers 104, 121.

In accordance with one embodiment of the present disclosure, the distribution transformer monitoring devices 244, 243 electrically interface with power lines 101e-101j (e.g., a set of three power lines delivering power to consumer premises 106-111, if the power is three-phase). Thus, the distribution transformer monitoring devices 244, 243 collects the data, which represents the amount of electricity (i.e., power being used or power being delivered in the case of solar or wind energy) that is being delivered to or received from the consumer premises 106-111. In another embodiment, the distribution transformer monitoring devices 244, 243 may electrically interface with the power lines 101c-101d (i.e., the power lines deliver electricity from the transmission network 118).

Furthermore, each consumer premise 106-111 comprises an electrical system (not shown) for delivering electricity received from the distribution transformers 104, 121 to one or more electrical ports (not shown) of the consumer premise 106-111. Note that the electrical ports may be internal or external ports.

The electrical system of each consumer premise 106-111 interfaces with a corresponding consumer premise's electrical meter 112-117, respectively. Each electrical meter 112-117 measures the amount of electricity consumed by or received from the consumer premises' electrical system to which it is coupled. To charge a customer who is responsible for the consumer premise, a power company (e.g., a utility company or a metering company) retrieves data indicative of the measurements made by the electrical meters 112-117 and uses such measurements to determine the consumer's invoice dollar amount representative of how much electricity has been consumed at the consumer premise 106-111. Notably, readings taken from the meters 112-117 reflect the actual amount of power consumed by the respective consumer premise electrical system. Thus, in one embodiment of the present disclosure, the meters 112-117 store data indicative of the power consumed by the consumers.

As described hereinabove, the consumer premises may have solar panels, energy producing wind implements, or any other means of distributed energy generation systems. In such an embodiment, the alternative energy source may inject energy into the distribution network 119 instead of consuming it. In this regard, the meters 112-117 and the distributed transformer monitoring devices 244, 243 may register this reverse energy in cases where the energy flow goes the opposite way of consumption, i.e., injection into the distribution network 119.

During operation, the meters 112-117 may be queried using any number of methods to retrieve and store data indicative of the amount of power being consumed by the meter's respective consumer premise electrical system or the power being generated at the consumer premise. Utility personnel may physically go to the consumer premises 106-111 and read the consumer premise's respective meter 112-117. In such a scenario, the personnel may enter data indicative of the readings into an electronic system, e.g., a hand-held device, a personal computer (PC), or a laptop computer. Periodically, the data entered may be transmitted to an analysis repository (not shown). Additionally, meter data retrieval may be electronic and automated. For example, the meters 112-117 may be communicatively coupled to a network (not shown), e.g., a wireless network, and periodically the meters 112-117 may automatically transmit data to the repository, described herein with reference to FIG. 2A.

As will be described further herein, meter data (not shown) (i.e., data indicative of readings taken by the meters 112-117) and transformer data (not shown) (i.e., data indicative of readings taken by the distribution transformer monitoring devices 244, 243) may be stored, compared, and analyzed in order to determine whether particular events have occurred, for example, whether electricity theft is occurring or has occurred between the distribution transformers 104, 121 and the consumer premises 106-111 or to determine whether power usage trends and/or power delivery trends (e.g., from solar panels) indicate a need or necessity for more or less power supply equipment. With respect to the theft analysis, if the amount of electricity being received at the distribution transformers 104, 121 is much greater than the cumulative (or aggregate) total of the electricity that is being delivered to the consumer premises 106-117, then there is a possibility that an offender may be stealing electricity from the utility providing the power.

Another cause for a difference between the power or energy measured by the meters 112-117 and the energy consumption measured at the distribution transformers 104, 121 is that there may be an incorrect mapping or association of the distribution transformers 104, 121 and the meters 112-117. In this regard, more or fewer meters 112-117 may be incorrectly mapped to the distribution transformers 104, 121, which would cause the mismatch between the cumulative power measured by the meters and the power consumption measure by the transformer monitoring devices 244, 243.

In another embodiment, power usage data is compiled over time. The compilation of the power usage data may be used in many ways. For example, it may be predetermined that a power usage signature, e.g., power usage which can be illustrated as a graphed footprint over a period, indicates nefarious activity. Such is described further herein.

In one embodiment, the power transmission and distribution system 100 further comprises a line data collection system (LDCS) 290. The LDCS 290 collects line data from the transmission lines 101b-101d. The line data is data indicative of power/electricity measured. Such data may be compared, for example, to meter data (collected at consumer premises 106-111 described further herein) and/or the transformer data (collected at the distribution transformers 104, 121 described further herein) to determine losses of electricity along the power grid, electricity usage, power need, or power consumption operational data related to the power grid. In one embodiment, data collected may be used to determine whether electricity theft is occurring or has occurred between a transmission substation and a distribution substation or a distribution substation and a distribution transformer (i.e., the distribution transformer that transmits power to the consumer premise). Note that the LDCS 290 is coupled to the transmission lines 101b, 101c, and 101d, respectively, thus coupling to medium voltage (MV) power lines. The LDCS 290 measures and collects operational data, as described hereinabove. In one embodiment, the LDCS 290 may transmit operational data, such as, for example, power, energy, voltage, and/or current, related to the MV power lines 101b, 101c, and 101d.

Figure 2A:
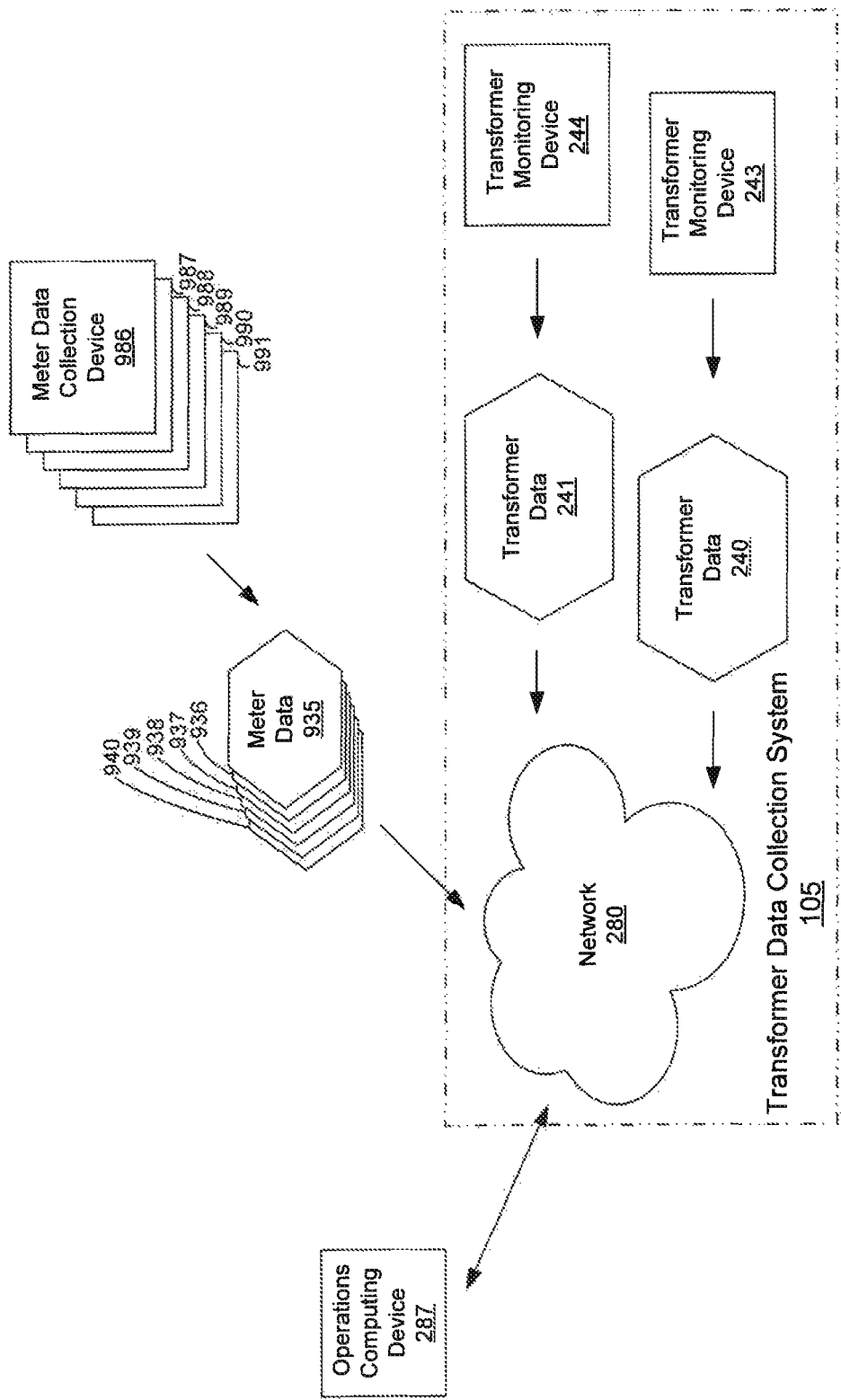
FIG. 2A is a diagram depicting a transformer and meter power usage data collection system in accordance with an embodiment of the present disclosure.

FIG. 2A depicts a transformer data collection system 105 in accordance with an embodiment of the present disclosure and a plurality of meter data collection devices 986-991. The transformer data collection system 105 comprises the one or more transformer monitoring devices 243, 244. Note that only two transformer monitoring devices 243, 244 are shown in FIG. 2A, but additional transformer monitoring devices may be used in other embodiments, including one or a plurality transformer monitoring devices for each distribution transformer 104, 121 (FIG. 1) being monitored, which is described in more detail herein.

Notably, in one embodiment of the present disclosure, the transformer monitoring devices 243, 244 are coupled to secondary side of the distribution transformers, 104, 121 respectively. Thus, measurements taken by the transformer monitoring devices 243, 244 are taken, in effect, at the distribution transformers 104, 121 between the distribution transformers 243, 244 and the consumer premises 106-111 (FIG. 1).

Additionally, the transformer monitoring devices 243, 244, the meter data collection devices 986-991, and an operations computing device 287 may communicate via a network 280. The network 280 may be any type of network over which devices may transmit data, including, but not limited to, a wireless network, a wide area network, a large area network, or any type of network known in the art or future-developed.

In another embodiment, the meter data 935-940 and the transformer data 240, 241, may be transmitted via a direct connection to the operations computing device 287 or manually transferred to the operations computing device 287. As an example, the meter data collection devices 986-991 may be directly connected to the operations computing device 287 via a direction connection, such as for example a T-carrier 1 (T1) line. Also, the meter data 935-940 may be collected on by a portable electronic device (not shown) that is then connected to the operations computing device 287 for transfer of the meter data 936-940 collected to the operations computing device 287. In addition, meter data 935-940 may be collected manually through visual inspection by utility personnel and provided to the operations computing device 287 in a format, e.g., comma separated values (CSV).

Note that in other embodiments of the present disclosure, the meter data collection devices 986-991 may be the meters 112-117 (FIG. 1) themselves, and the meters 112-117 may be equipped with network communication equipment (not shown) and logic (not shown) configured to retrieve readings, store readings, and transmit readings taken by the meters 112-117 to the operations computing device 287.

The transformer monitoring devices 243, 244 are electrically coupled to the distribution transformers 104, 121, respectively. In one embodiment, the devices 243, 244 are electrically coupled to the distribution transformers 104, 121, respectively, on a secondary side of the distribution transformers 104, 121.

The transformer monitoring devices 243, 244 each comprise one or more sensors (not shown) that interface with one or more power lines (not shown) connecting the distribution transformers 104, 121 to the consumer premises 106-111 (FIG. 1). Thus, the one or more sensors of the transformer monitoring devices 243, 244 senses electrical characteristics, e.g., voltage and/or current, present in the power lines as power is delivered to the consumer premises 106-111 through the power lines 101e-101j. Periodically, the transformer monitoring devices 243, 244 sense such electrical characteristics, translate the sensed characteristics into transformer data 240, 241 indicative of electrical characteristics, such as, for example power, and transmit transformer data 240, 241 to the operations computing device 287 via the network 280. Upon receipt, the operations computing device 287 stores the transformer data 240, 241 received.

Note that there is a transformer monitoring device depicted for each distribution transformer in the exemplary system, i.e., transformer monitoring device 243 for monitoring transformer 121 (FIG. 1) and transformer monitoring device 244 for monitoring transformer 104 (FIG. 1). There may be additional transformer monitoring devices for monitoring additional transformers in other embodiments.

The meter data collection devices 986-991 are communicatively coupled to the network 280. During operation, each meter data collection device 986-991 senses electrical characteristics of the electricity, e.g., voltage and/or current, that is transmitted by the distribution transformers 104, 121. Each meter data collection device 986-991 translates the sensed characteristics into meter data 935-940, respectively. The meter data 935-940 is data indicative of electrical characteristics, such as, for example power consumed in addition to specific voltage and/or current measurements. Further, each meter data collection device 986-991 transmits the meter data 935-940, respectively, to the operations computing device 287 via the network 280. Upon receipt, the operations computing device 287 stores the meter data 935-940 received from the meter data collection devices 986-991 indexed (or keyed) with a unique identifier corresponding to the meter data collection device 986-991 that transmits the meter data 935-940.

In one embodiment, each meter data collection device 986-991 may comprise Automatic Meter Reading (AMR) technology, i.e., logic (not shown) and/or hardware, or Automatic Metering Infrastructure (AMI) technology, e.g., logic (not shown) and/or hardware for collecting and transmitting data to a central repository, (or more central repositories) e.g., the operations computing device 287.

In such an embodiment, the AMR technology and/or AMI technology of each device 986-991 collects data indicative of electricity consumption by its respective consumer premise power system and various other diagnostics information. The meter logic of each meter data collection device 986-991 transmits the data to the operations computing device 287 via the network 280, as described hereinabove. Note that the AMR technology implementation may include hardware such as, for example, handheld devices, mobile devices and network devices based on telephony platforms (wired and wireless), radio frequency (RF), or power line communications (PLC).

Upon receipt, the operations computing device 287 compares aggregate meter data of those meters corresponding to a single transformer with the transformer data 240, 241 received from the transformer monitoring device 244, 243 that provided the transformer data 240, 241.

Thus, assume that meter data collection devices 986-988 are coupled to meters 112-114 (FIG. 1) and transmit meter data 935-937, respectively, and distribution transformer 104 is coupled to transformer monitoring device 243. In such a scenario, the meters 112-114 meter electricity provided by the distribution transformer 104 and consumed by the electrical system of the respective consumer premise 106-108 (FIG. 1). Therefore, the operations computing device 287 aggregates (e.g., sums) data contained in meter data 935-937 (e.g., power usage recorded by each meter 112-114) and compares the aggregate with the transformer data 240 provided by transformer monitoring device 243.

If the operations computing device 287 determines that the quantity of power that is being delivered to the consumer premises 106-108 connected to the distribution transformer 104 is substantially less than the quantity of power that is being transmitted to the distribution transformer 104, the operations computing device 287 may determine that power (or electricity) theft or transformer to meter mismatch is occurring.

Note that transformers 104, 121 (FIG. 1) are physically connected to customers premises 106-108 and 109-111 to deliver energy. In a typical system, a transformer is configured to deliver energy to a plurality of customers. As an example, the transformer is configured to provide energy to N customers, customers A, B, C, D, and E. The utility has a logical representation of the connections, e.g., meters to transformer association, in a geographic information system (GIS) mapping system. However, the representation does not often match the physical connection in the field. As an example, after a few years, a crew performs maintenance on the transformer and disconnects customer E from the transformer and connects the customer to a different transformer. If utility crews in the field fail to report the change to the utility, the GIS mapping of the transformers to meters may no longer be accurate.

In such a scenario, the transformer monitoring devices 243, 244 are configured to collect data indicative of power registered by the transformer monitoring device 243 or 244. In one embodiment, the data indicative of the collected power information may be compared to a sum of the individual power registered by the respective meters 112-117 by the transformer monitoring device. In this regard, the metering data may be transmitted to the transformer monitoring devices 243, 244 via the network 280. In another embodiment, the transformer monitoring devices may transmit the collected power information to the operations computing device 287, and the operations computing device 287 may compare the collected power information to meter data 935-940 collected via the network 280.

If the collected power data does not match the sum of the individual meters supposedly connected to the transformer being monitored by the transformer monitoring device 243 or 244, the mismatch may indicate a number of scenarios. The mismatch may indicate that there is ongoing theft of electricity. Additionally, the mismatch may be due to street lights or traffic lights or an error in mapping of transformers to meters. The actual cause of the apparent mismatch may then be investigated by utility personnel. In this regard, the operations computing device 287 may initiate a visual or audible warning that there is a mismatch in the power data collected and the meter data 935-940 and send an alert, including location information, to utility personnel. In one embodiment, the operations computing device 287 identifies, stores, and analyzes meter data 935-940 based on a unique identifier associated with the meter 112-117 to which the meter data collection devices 986-991 are coupled. Further, the operations computing device 287 identifies, stores, and analyzes transformer data 240, 241 based on a unique identifier associated with the distribution transformers 104, 121 that transmitted the transformer data 240, 241 to the operations computing device 287.

Thus, in one embodiment, prior to transmitting data to the operations computing device 287, both the meter data collection devices 986-991 and the transformer monitoring devices 243, 244 are populated internally with a unique identifier (i.e., a unique identifier identifying the meter data collection device 986-991 and a unique identifier identifying the transformer monitoring device 243, 244). Further, each meter data collection device 986-991 may be populated with the unique identifier of the transformer 104, 121 to which the meter data collection device 986-991 is coupled.

In such an embodiment, when the meter data collection device 986-991 transmits the meter data 935-940 to the operations computing device 287, the operations computing device 287 can determine which distribution transformer 104 or 121 services the consumer premises 106-111. As an example, during setup of a portion of the grid (i.e., power transmission and distribution system 100 (FIG. 1)) that comprises the distribution transformers 104, 121 and the meters 112-117, the operations computing device 287 may receive set up data from the distribution transformers 104, 121 and the meter data collection devices 986-991 identifying the device from which it was sent and a unique identifier identifying the component to which the meter data collection device 986-990 is connected.

Figure 2B:
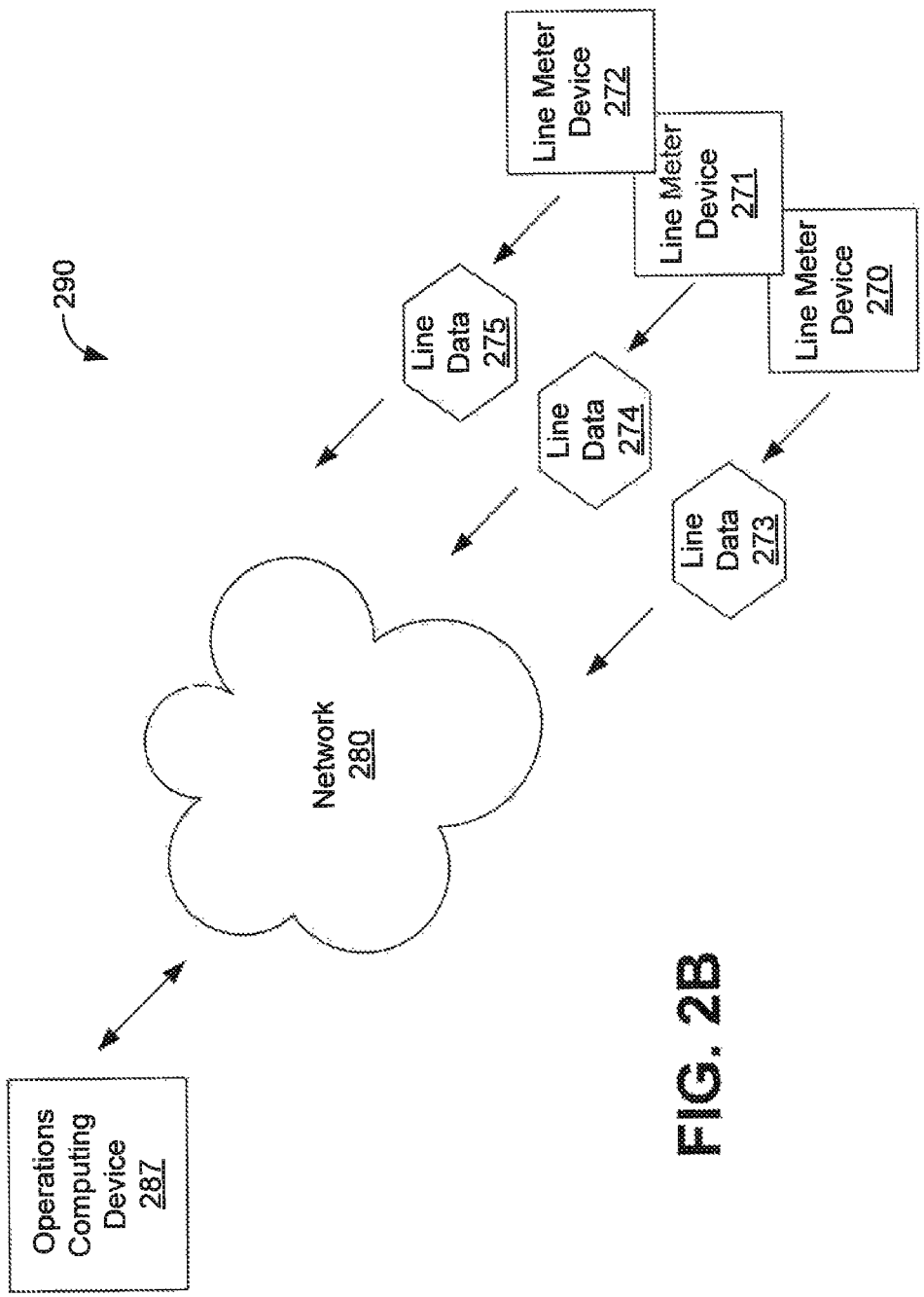
FIG. 2B is a diagram depicting a line power usage data collection system in accordance with an embodiment of the present disclosure.

FIG. 2B depicts the line data collection system 290 in accordance with an embodiment of the present disclosure. The line data collection system 290 comprises a plurality of line monitoring devices 270-272 and the operations computing device 287. Each line monitoring device 270-272 communicates with the operations computing device 287 via the network 280.

With reference to FIG. 1, the line monitoring devices 270-272 are electrically coupled to the transmission lines 101*b*, 101*c*, and 101*d*, respectively. In one embodiment, each line monitoring device 270-272 comprises one or more sensors (not shown) that interface with the transmission lines 101*b*, 101*c*, and 101*d* connecting the transmission substation 102 downstream to the distribution substation transformer 103 or connecting the distribution substation transformer 103 downstream to the distribution transformers 104, 121.

The one or more sensors of the line monitoring devices 270-272 sense electrical characteristics, e.g., voltage and/or current, present as current flows through transmission lines 101*b*, 101*c*, and 101*d*, respectively. Periodically, each line monitoring device 270-272 senses such electrical characteristics, translates the sensed characteristics into line data 273-275, respectively, indicative of such characteristics, and transmits the line data 273-275 to the operations computing device 287 via the network 280. Upon receipt, the operations computing device 287 stores the line data 273-275 received from the line monitoring devices 270-272.

Figure 3:
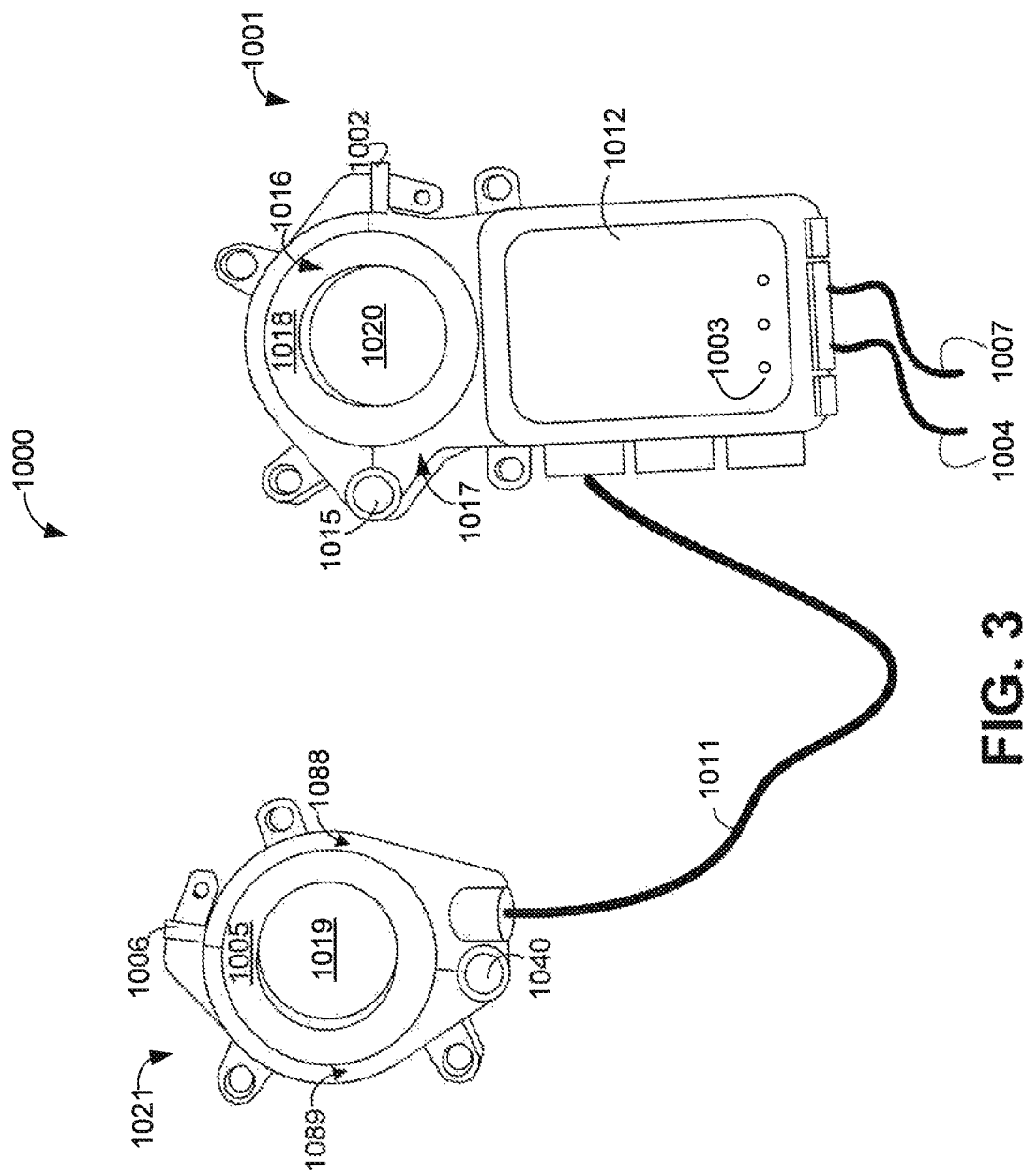
FIG. 3 is a drawing of a general-purpose transformer monitoring device, such as is depicted by FIG. 2A.

FIG. 3 depicts an embodiment of a general-purpose transformer monitoring device 1000 that may be used as the transformer monitoring devices 243, 244 depicted in FIG. 2A and/or line monitoring devices 270-272 (FIG. 2B). The transformer monitoring device 1000 may be installed on conductor cables (not shown) and used to collect data indicative of voltage and/or current from the conductor cables to which it is coupled.

The general-purpose transformer monitoring device 1000 comprises a satellite unit 1021 that is electrically coupled to a main unit 1001. In one embodiment, the satellite unit 1021 is coupled via a cable 1011. However, the satellite unit 1021 may be coupled other ways in other embodiments, e.g., wirelessly. The general-purpose transformer monitoring device 1000 may be used in many different methods to collect voltage and/or current data (i.e., transformer data 240, 241 (FIG. 2A) from the distribution transformers 104, 121 (FIG. 1) and from the power lines 101*b*-101*j* (FIG. 1).

To collect voltage and/or current data, the satellite unit 1021 and/or the main unit 1001 is installed around a conductor cable or connectors of conductor cables (also known as a "bushing"). The satellite unit 1021 of the general-purpose transformer monitoring device 1000 comprises two sections 1088 and 1089 that are hingedly coupled at hinge 1040. When installed and in a closed position (as shown in FIG. 3), the sections 1088 and 1089 connect via a latch 1006 and the conductor cable runs through an opening 1019 formed by coupling the sections 1088 and 1089.

The satellite unit 1021 further comprises a sensing unit housing 1005 that houses a current detection device (not shown) for sensing current flowing through the conductor cable around which the sections 1088 and 1089 are installed. In one embodiment, the current detection device may comprise an implementation of one or more coreless current sensor as described in U.S. Pat. No. 7,940,039, which is incorporated herein by reference.

The main unit 1001 comprises sections 1016 and 1017 that are hingedly coupled at hinge 1015. When installed and in a closed position (as shown in FIG. 3), the sections 1016 and 1017 connect via a latch 1002 and a conductor cable runs through an opening 1020 formed by coupling the sections 1016 and 1017.

The main unit 1001 comprises a sensing unit housing section 1018 that houses a current detection device (not shown) for sensing current flowing through the conductor cable around which the sections 1016 and 1017 are installed. As described hereinabove with respect to the satellite unit 1021, the current detection device may comprise an implementation of one or more Ragowski coils as described in U.S. Pat. No. 7,940,039, which is incorporated herein by reference.

Unlike the satellite unit 1021, the main unit section 1001 comprises an extended boxlike housing section 1012. Within the housing section 1012 resides one or more printed circuit boards (PCB) (not shown), semiconductor chips (not shown), and/or other electronics (not shown) for performing operations related to the general-purpose transformer monitoring device 1000. In one embodiment, the housing section 1012 is a substantially rectangular housing; however, differently sized and differently shaped housings may be used in other embodiments.

Additionally, the main unit 1001 further comprises one or more cables 1004, 1007. The cables 1004, 1007 may be coupled to a conductor cable or corresponding bus bars (not shown) and ground or reference voltage conductor (not shown), respectively, for the corresponding conductor cable, which will be described further herein.

Note that methods in accordance with an embodiment of the present disclosure use the described monitoring device 1000 for collecting current and/or voltage data. Further note that the monitoring device 1000 described is portable and easily connected and/or coupled to an electrical conductor and/or transformer posts. Due to the noninvasive method of installing the satellite unit and main unit around a conductor and connecting the leads 1004, 1007 to connection points, an operator (or utility personnel) need not de-energize a transformer 104, 121 (FIG. 1) for connection or coupling thereto. Further, no piercing (or other invasive technique) of the electrical line is needed during deployment to the power grid. Thus, the monitoring device 1000 is easy to install. Thus, deployment to the power grid is easy to effectuate.

During operation, the satellite unit 1021 and/or the main unit 1001 collects data indicative of current through a conductor cable. The satellite unit 1021 transmits its collected data via the cable 1011 to the main unit 1001. Additionally, the cables 1004, 1007 may be used to collect data indicative of voltage corresponding to a conductor cable about which the satellite unit is installed. The data indicative of the current and voltage sensed corresponding to the conductor may be used to calculate power usage.

As indicated hereinabove, there are many different methods that may be employed using the general-purpose monitoring device 1000 to collect current and/or voltage data and calculate power usage.

In one embodiment, the general-purpose transformer monitoring device 1000 may be used to collect voltage and current data from a three-phase system (if multiple general purpose transformer monitoring devices 100 are used) or a single-phase system.

The single-phase system has two conductor cables and a neutral cable. For example, electricity supplied to a typical home in the United States has two conductor cables (or hot cables) and a neutral cable. Note that the voltage across the conductor cables in such an example is 240 Volts (the total voltage supplied) and the voltage across one of the conductor cables and the neutral is 120 Volts. Such an example is typically viewed as a single-phase system.

In a three-phase system, there are typically three conductor cables and a neutral cable (sometimes there may not be a neutral cable). In one system, voltage measured in each conductor cable is 120° out of phase from the voltage in the other two conductor cables. Multiple general purpose transformer monitoring devices 1000 can obtain current readings from each conductor cable and voltage readings between each of the conductor cables and the neutral (or obtain voltage readings between each of the conductor cables). Such readings may then be used to calculate power usage.

Note that the main unit 1001 of the general-purpose transformer monitoring device 1000 further comprises one or more light emitting diodes (LEDs) 1003. The LEDs may be used by logic (not shown but referred to herein with reference to FIG. 4 as analytic logic 308) to indicate status, operations, or other functions performed by the general-purpose transformer monitoring device 1000.

Figure 4:
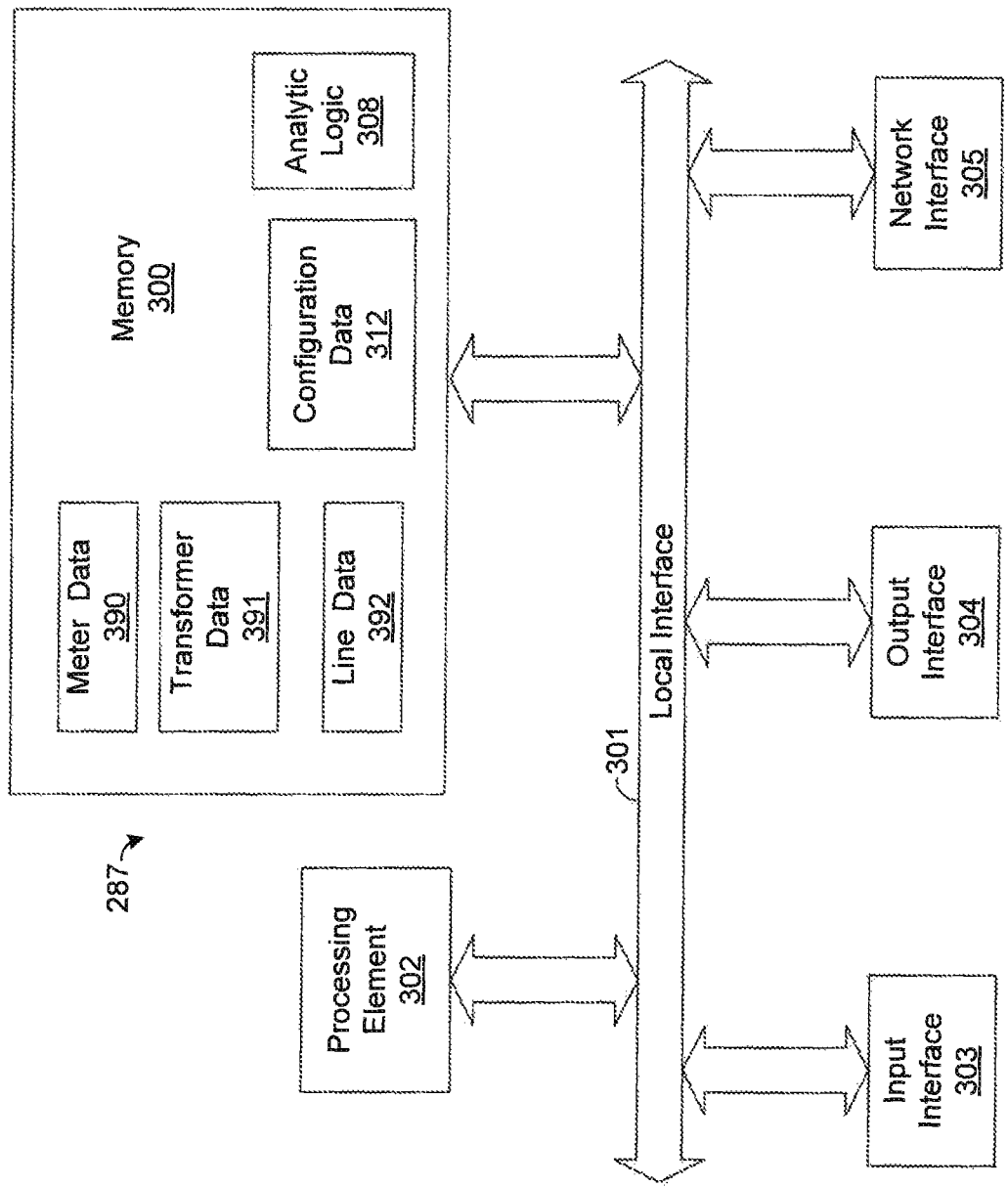
FIG. 4 is a block diagram depicting an exemplary operations computing device, such as is depicted in FIG. 2A.

FIG. 4 depicts an exemplary embodiment of the operations computing device 287 depicted in FIG. 2A. As shown by FIG. 4, the operations computing device 287 comprises analytic logic 308, meter data 390, transformer data 391, line data 392, and configuration data 312 all stored in memory 300.

The analytics logic 308 generally controls the functionality of the operations computing device 287, as will be described in more detail hereafter. It should be noted that the analytics logic 308 can be implemented in software, hardware, firmware or any combination thereof. In an exemplary embodiment illustrated in FIG. 4, the analytics logic 308 is implemented in software and stored in memory 300.

Note that the analytics logic 308, when implemented in software, can be stored and transported on any computer-readable medium for use by or in connection with an instruction execution apparatus that can fetch and execute instructions. In the context of this document, a "computer-readable medium" can be any means that can contain or store a computer program for use by or in connection with an instruction execution apparatus.

The exemplary embodiment of the operations computing device 287 depicted by FIG. 4 comprises at least one conventional processing element 302, such as a digital signal processor (DSP) or a central processing unit (CPU), that communicates to and drives the other elements within the operations computing device 287 via a local interface 301, which can include at least one bus. Further, the processing element 302 is configured to execute instructions of software, such as the analytics logic 308.

An input interface 303, for example, a keyboard, keypad, or mouse, can be used to input data by a user of the operations computing device 287. An output interface 304, for example, a printer or display screen (e.g., a liquid crystal display (LCD)), can be used to output data to the user. In addition, a network interface 305, such as a modem, enables the operations computing device 287 to communicate via the network 280 (FIG. 2A) to other devices in communication with the network 280.

As indicated hereinabove, the meter data 390, the transformer data 391, the line data 392, and the configuration data 312 are stored in memory 300. The meter data 390 is data indicative of power usage measurements and/or other electrical characteristics obtained from each of the meters 112-117 (FIG. 1). In this regard, the meter data 390 is an aggregate representation of the meter data 935-940 (FIG. 2A) received from the meter data collection devices 986-991 (FIG. 2A).

In one embodiment, the analytics logic 308 receives the meter data 935-940 and stores the meter data 935-940 (as meter data 390) such that the meter data 935-940 may be retrieved based upon the transformer 104 or 121 (FIG. 1) to which the meter data's corresponding meter 112-117 is coupled. Note that meter data 390 is dynamic and is collected periodically by the meter data collection devices 986-991 from the meters 112-117. For example, the meter data 390 may include, but is not limited to, data indicative of current measurements, voltage measurements, and/or power calculations over a period of time per meter 112-117 and/or per transformer 104 or 121. The analytic logic 308 may use the collected meter data 390 to determine whether the amount of electricity supplied by the corresponding transformer 104 or 121 is substantially equal to the electricity that is received at the consumer premises 106-111.

In one embodiment, each entry of the meter data 935-940 in the meter data 390 is associated with an identifier (not shown) identifying the meter 112-117 (FIG. 1) from which the meter data 935-940 is collected. Such identifier may be randomly generated at the meter 112-117 via logic (not shown) executed on the meter 112-117.

In such a scenario, data indicative of the identifier generated by the logic at the meter 112-117 may be communicated, or otherwise transmitted, to the transformer monitoring device 243 or 244 to which the meter is coupled. Thus, when the transformer monitoring devices 243, 244 transmit transformer data 240, 241 (FIG. 2), each transformer monitoring device 243, 244 can also transmit its unique meter identifier (and/or the unique identifier of the meter that sent the transformer monitoring device 243, 244 the meter data). Upon receipt, the analytics logic 308 may store the received transformer data 240, 241 (as transformer data 391) and the unique identifier of the transformer monitoring device 243, 244 and/or the meter unique identifier such that the transformer data 391 may be searched on the unique identifiers when performing calculations. In addition, the analytics logic 308 may store the unique identifiers of the transformer monitoring devices 243, 244 corresponding to the unique identifiers of the meters 112-117 from which the corresponding transformer monitoring devices 243, 244 receive meter data. Thus, the analytics logic 308 can use the configuration data 312 when performing operations, such as aggregating meter data entries in meter data 390 to compare to transformer data 391.

The transformer data 391 is data indicative of aggregated power usage measurements obtained from the distribution transformers 104, 121. Such data is dynamic and is collected periodically. Note that the transformer data 240, 241 comprises data indicative of current measurements, voltage measurements, and/or power calculations over a period of time that indicates the amount of aggregate power provided to the consumer premises 106-111. Notably, the transformer data 391 comprises data indicative of the aggregate power that is being sent to a "group," i.e., two or more consumer premises being monitored by the transformer monitoring devices 243, 244, although the transformer data 391 can comprise power data that is being sent to only one consumer premises being monitored by the transformer monitoring device.

In one embodiment, during setup of a distribution network 119 (FIG. 1), the analytic logic 308 may receive data identifying the unique identifier for one or more transformers 104, 121. In addition, when a transformer monitoring device 243, 244 is installed and electrically coupled to one or more transformers 104, 121, data indicative of the unique identifier of the transformers 104, 121 may be provided to the meters 112-117 and/or to the operations computing device 287, as described hereinabove. The operations computing device 287 may store the unique identifiers (i.e., the unique identifier for the transformers) in configuration data 312 such that each meter 112-117 is correlated in memory with a unique identifier identifying the distribution transformer from which the consumer premises 106-111 associated with the meter 112-117 receives power.

The line data 273-275 is data indicative of power usage measurements obtained from the line data collection system 290 along transmission lines 101b-101d in the system 100. Such data is dynamic and is collected periodically. Note that the line data 273-274 comprises data indicative of current measurements, voltage measurements, and/or power calculations over a period of time that indicates the amount of aggregate power provided to the distribution substation transformer 103 and the distribution transformers 104, 121. Notably, the line data 392 comprises data indicative of the aggregate power that is being sent to a "group," i.e., one or more distribution substation transformers 103.

During operation, the analytic logic 308 receives meter data 935-940 via the network interface 305 from the network 280 (FIG. 2) and stores the meter data 935-940 as meter data 390 in memory 300. The meter data 390 is stored such that it may be retrieved corresponding to the distribution transformer 104, 121 supplying the consumer premise 106-111 to which the meter data corresponds. Note there are various methods that may be employed for storing such data including using unique identifiers, as described hereinabove, or configuration data 312, also described hereinabove.

The analytic logic 308 may perform a variety of functions to further analyze the power transmission and distribution system 100 (FIG. 1). As an example, the analytic logic 308 may use the collected transformer data 391, line data 392, and/or meter data 390 to determine whether electricity theft is occurring along the transmission lines 101a, 101b or the distribution lines 101c-101j. Additionally, the collected data may be used to determine a mismatch between the number of meters corresponding to a particular transformer.

The analytic logic 308 may compare the aggregate power consumed by the group of consumer premises (e.g., consumer premises 106-108 or 109-111) and compare the calculated aggregate with the actual power supplied by the corresponding distribution transformer 104 or 121. In addition, the analytic logic 308 may compare the power transmitted to the distribution substation transformer 103 and the aggregate power received by the distribution transformers 104, 121, or the analytic logic 308 may compare the power transmitted to the transmission substation 102 and the aggregate power received by one or more distribution substation transformers 103.

If comparisons indicate that electricity theft is occurring anywhere in the power and distribution system 100 (FIG. 1), the analytics logic 308 may notify a user of the operations computing device 287 that there may be a problem. In addition, the analytics logic 308 can pinpoint a location in the power transmission and distribution system 100 where theft may be occurring or where there may be a mismatch between transformers and meters. The analytic logic 308 may have a visual or audible alert to the user, which can include a map of the system 100 and a visual identifier locating the problem.

The analytics logic 308 may perform a variety of operations and analysis based upon the data received. As an example, the analytic logic 308 may perform a system capacity contribution analysis. In this regard, the analytic logic 308 may determine when one or more of the consumer premises 106-111 have coincident peak power usage (and/or requirements). The analytics logic 308 determines, based upon this data, priorities associated with the plurality of consumer premises 106-111, e.g. what consumer premises requires a peak load and at what time. Loads required by the consumer premises 106-111 may necessarily affect system capacity charges; thus, the priority may be used to determine which consumer premises 106-111 may benefit from demand management.

Additionally, the analytic logic 308 may use the meter data 390 (FIG. 4), the transformer data 391, the line data 392, and the configuration data 312 (collectively referred to as "operations computing device data") to determine asset loading. For example, analyses may be performed for substation and feeder loading, transformer loading, feeder section loading, line section loading, and cable loading. Also, the operations computing device 287 may be used to produce detailed voltage calculations and analysis of the system 100 and/or technical loss calculations for the components of the system 100, and to compare voltages experienced at each distribution transformer with the distribution transformer manufacturer minimum/maximum voltage ratings and identify such distribution transformer(s) which are operating outside of the manufacturer's suggested voltages range thereby helping to isolate power sag (a decrease in power) and power swell (an increase in power) instances, and identify distribution transformer sizing and longevity information.

In one embodiment, a utility company may install load control devices (not shown). In such an embodiment, the analytics logic 308 may use the operations computing device 287 to identify one or more locations of load control devices.

Figure 5:
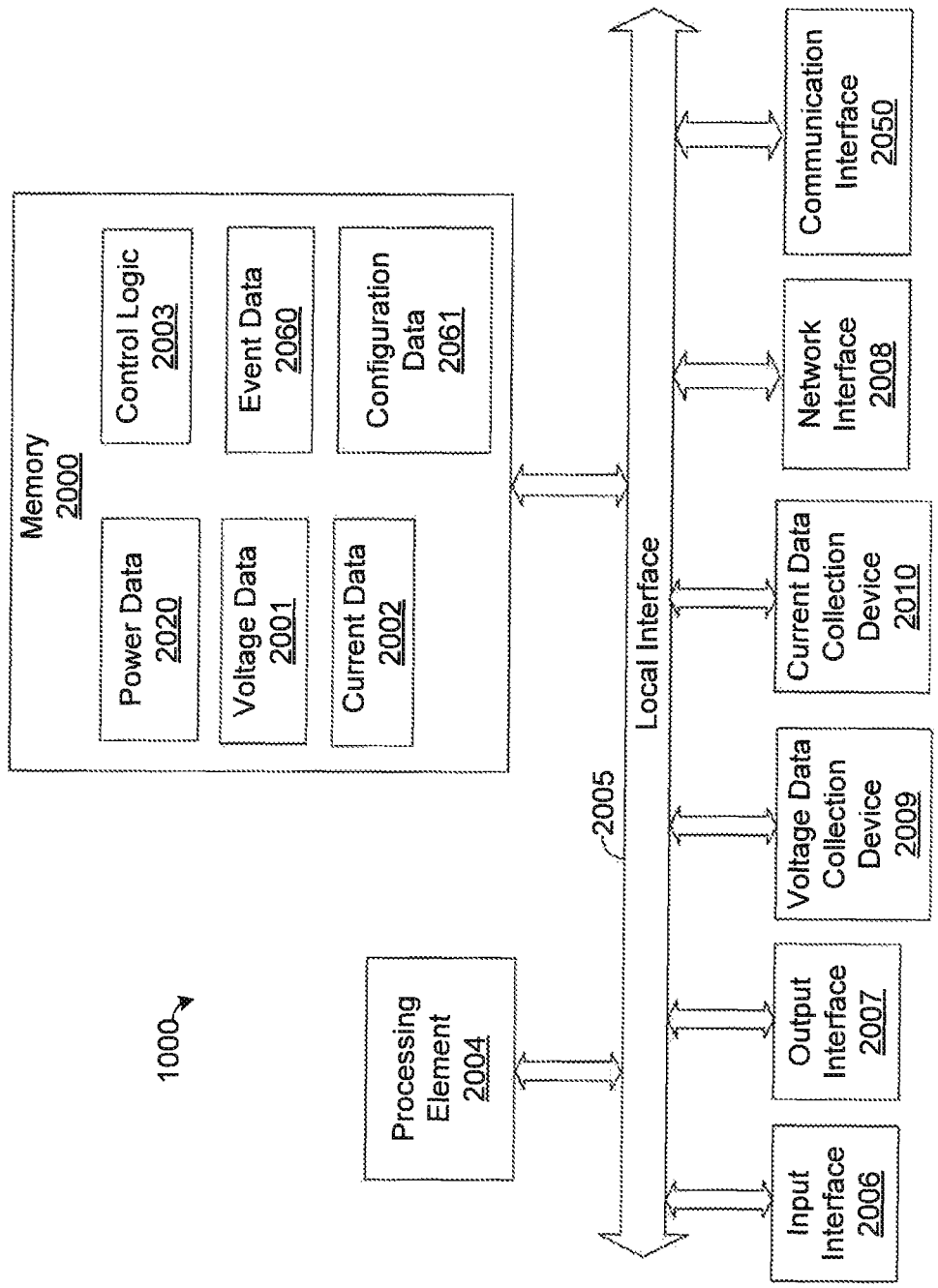
FIG. 5 is a block diagram depicting an exemplary transformer monitoring device, such as is depicted in FIG. 2A.

FIG. 5 depicts an exemplary embodiment of the transformer monitoring device 1000 depicted in FIG. 3. As shown by FIG. 5, the transformer monitoring device 1000 comprises control logic 2003, voltage data 2001, current data 2002, power data 2020, event data 2060, and configuration data 2061 stored in memory 2000.

The control logic 2003 controls the functionality of the operations transformer monitoring device 1000. The control logic 2003 can be implemented in software, hardware, firmware or any combination thereof. In an exemplary embodiment illustrated in FIG. 5, the control logic 2003 is implemented in software and stored in memory 2000.

Note that the control logic 2003, when implemented in software, can be stored and transported on any computer-readable medium for use by or in connection with an instruction execution apparatus that can fetch and execute instructions. In the context of this document, a "computer-readable medium" can be any means that can contain or store a computer program for use by or in connection with an instruction execution apparatus.

The exemplary embodiment of the transformer monitoring device 1000 depicted by FIG. 5 comprises at least one conventional processing element 2004, such as a digital signal processor (DSP) or a central processing unit (CPU), that communicates to and drives the other elements within the transformer monitoring device 1000 via a local interface 2005, which can include at least one bus. Further, the processing element 2004 is configured to execute instructions of software, such as the control logic 2003.

An input interface 2006, for example, a keyboard, keypad, or mouse, can be used to input data from a user of the transformer monitoring device 1000, and an output interface 2007, for example, a printer or display screen (e.g., a liquid crystal display (LCD)), can be used to output data to the user. In addition, a network interface 2008, such as a modem or wireless transceiver, enables the transformer monitoring device 1000 to communicate with the network 280 (FIG. 2A).

In one embodiment, the transformer monitoring device 1000 further comprises a communication interface 2050. The communication interface 2050 is any type of interface that when accessed enables power data 2020, voltage data 2001, current data 2002, or any other data collected or calculated by the transformer monitoring device 100 to be communicated to another system or device. As an example, the communication interface may be a serial bus interface that enables a device that communicates serially to retrieve the identified data from the transformer monitoring device 1000. As another example, the communication interface 2050 may be a universal serial bus (USB) that enables a device configured for USB communication to retrieve the identified data from the transformer monitoring device 1000. Other communication interfaces 2050 may use other methods and/or devices for communication including radio frequency (RF) communication, cellular communication, power line communication, wireless fidelity (Wi-Fi) or optical communications.

The transformer monitoring device 1000 further comprises one or more voltage data collection devices 2009 and one or more current data collection devices 2010. With respect to the transformer monitoring device 1000 depicted in FIG. 3, the transformer monitoring device 1000 comprises the voltage data collection device 2009 that may include the cables 1004, 1007 (FIG. 3) that sense voltages at nodes (not shown) on a transformer to which the cables are attached. As will be described further herein, the control logic 2003 receives data via the cables 1004, 1007 indicative of the voltages at the nodes and stores the data as voltage data 2001. The control logic 2003 performs operations on and with the voltage data 2001, including periodically transmitting the voltage data 2001 to the operations computing device 287 (FIG. 2A).

Further, with respect to the transformer monitoring device 1000 depicted in FIG. 3, the transformer monitoring device 1000 comprises the current sensors (not shown) contained in the sensing unit housing 1005 (FIG. 3) and the sensing unit housing section 1018 (FIG. 3). The current sensors sense current traveling through conductor cables (or neutral cables) around which the sensing unit housings 1005, 1018 are coupled. The control logic 2003 receives data indicative of current from the satellite sensing unit 1021 (FIG. 3) via the cable 1011 and data indicative of the current from the current sensor of the main unit 1001 contained in the sensing unit housing section 1018 (FIG. 3). The control logic 2003 stores the data indicative of the currents sensed as the current data 2002. The control logic 2003 performs operations on and with the current data 2002, including periodically transmitting the voltage data 2001 to, for example, the operations computing device 287 (FIG. 2A).

Note that the control logic 2003 may perform calculations with the voltage data 2001 and the current data 2002 prior to transmitting the voltage data 2001 and the current data 2002 to the operations computing device 287. In this regard, for example, the control logic 2003 may calculate power usage using the voltage data 2001 and current data 2002 over time and periodically store resulting values as power data 2020.

The configuration data 2061 comprises data indicative of thresholds for corresponding to operational data related to the transformers 104, 121 (FIG. 1) or the system 100 (FIG. 1) among other data. The configuration data 2061 comprises data indicative of values such that if a read value falls below, meets, or exceeds one of the threshold values stored in configuration data 2061, the control logic 2003 triggers an event. In this regard, the control logic 2003 compares the read value to a value in the configuration data 2061. If the comparison qualifies as an event, the control logic 2003 stores data indicative of the event in event data 2060. Further, the control logic 2003 transmits data indicative of the event to the operations computing device 287. Note that different types of events are described further herein.

Note that the control logic 2003 may transmit data to the operations computing device 287 via a power line communication (PLC) method. In other embodiments, the control logic 2003 may transmit the data via the network 280 (FIG. 2A) wirelessly, optically, or otherwise.

Figure 6:
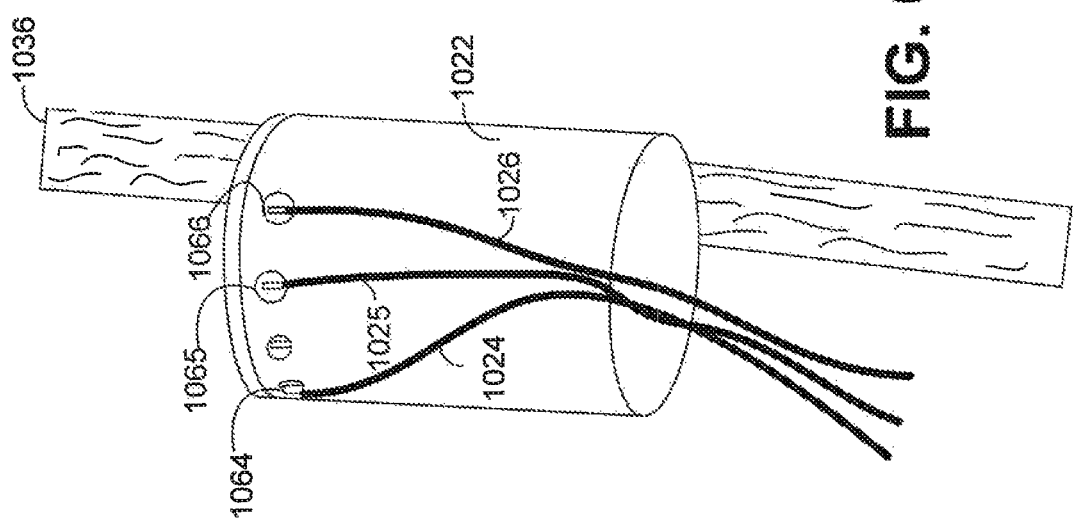
FIG. 6 is a drawing of a transformer can in accordance with an embodiment of the present disclosure.

FIGS. 6-10 depict one exemplary practical application, use, and operation of the transformer monitoring device 1000 shown in the drawing in FIG. 3. In this regard, FIG. 6 depicts a transformer can 1022, which houses a transformer (not shown), mounted on a utility pole 1036. One or more cables 1024-1026 carry current from the transformer can 1022 to a destination (not shown), e.g., consumer premises 106-111 (FIG. 1). The cables 1024-1026 are connected to the transformer can at nodes 1064-1066, respectively. Each node 1064-1066 comprises a conductive connector (part of which is sometimes referred to as a bus bar).

Figure 7:
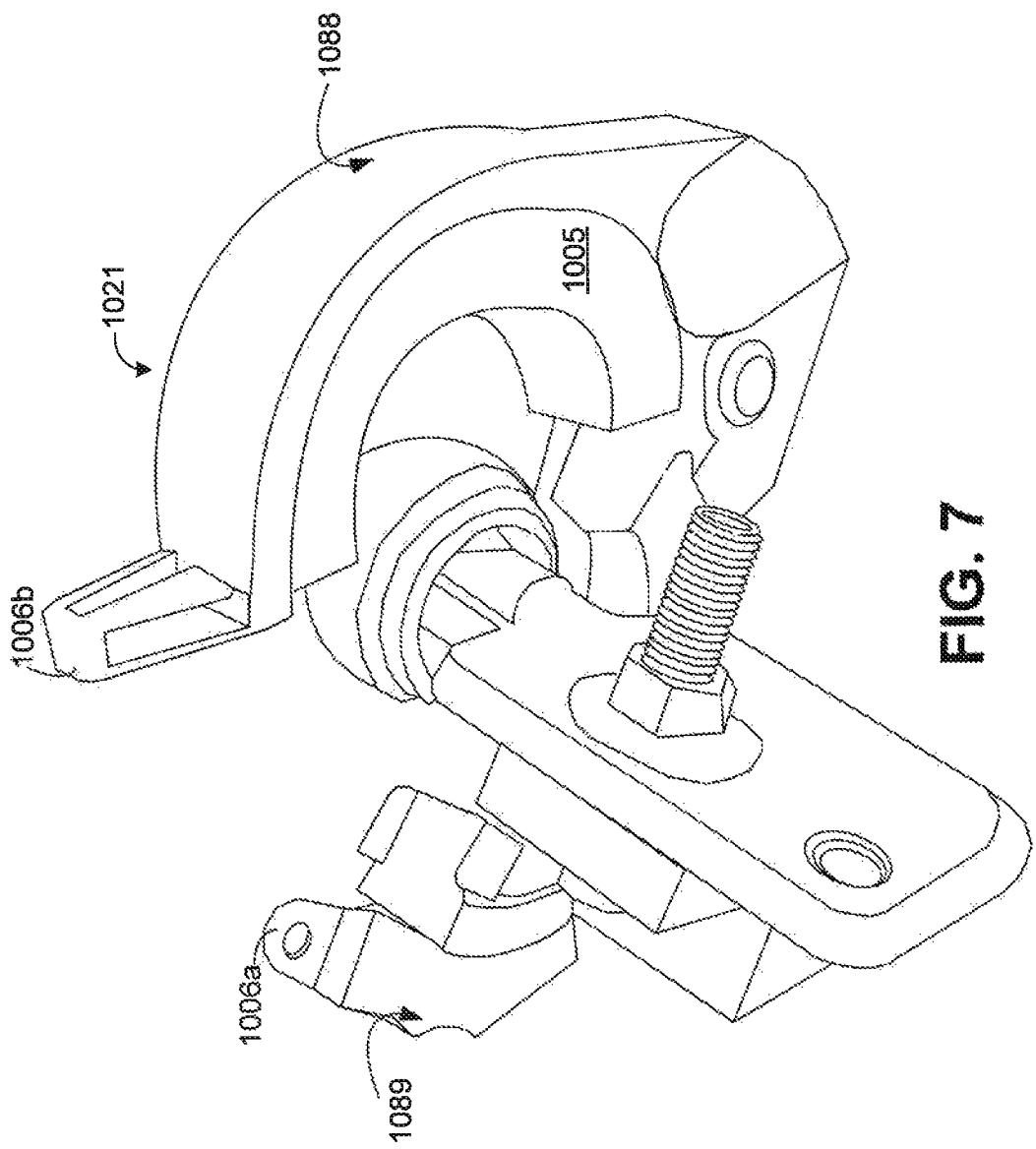
FIG. 7 is a drawing showing a satellite unit of the transformer monitoring device depicted in FIG. 3 being installed on the transformer can depicted in FIG. 6.
Figure 8:
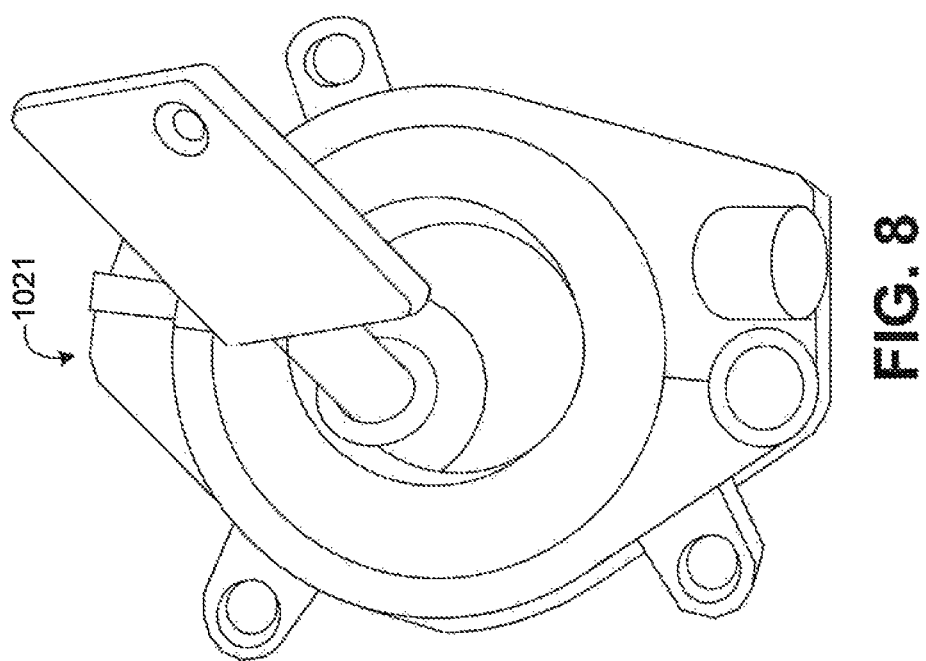
FIG. 8 is a drawing showing the satellite unit of the transformer monitoring device depicted in FIG. 3 installed on the transformer can depicted in FIG. 6.

FIG. 7 depicts the satellite unit 1021 of the transformer monitoring device 1000 being placed on one of the nodes 1064-1066 (FIG. 6), i.e., in an open position. A technician (not shown), e.g., an employee of a utility company (not shown), decouples the latch 1006 (FIG. 3), made up by decoupled sections 1006*a* and 1006*b*, and places the sections 1088 and 1089 around a portion of the node 1064-1066 such that the sensor unit (not shown) interfaces with the node and senses a current flowing through the node. FIG. 8 depicts the satellite unit 1021 of the transformer monitoring device 1000 latched around one of the nodes 1064-1066 in a closed position.

Figure 9:
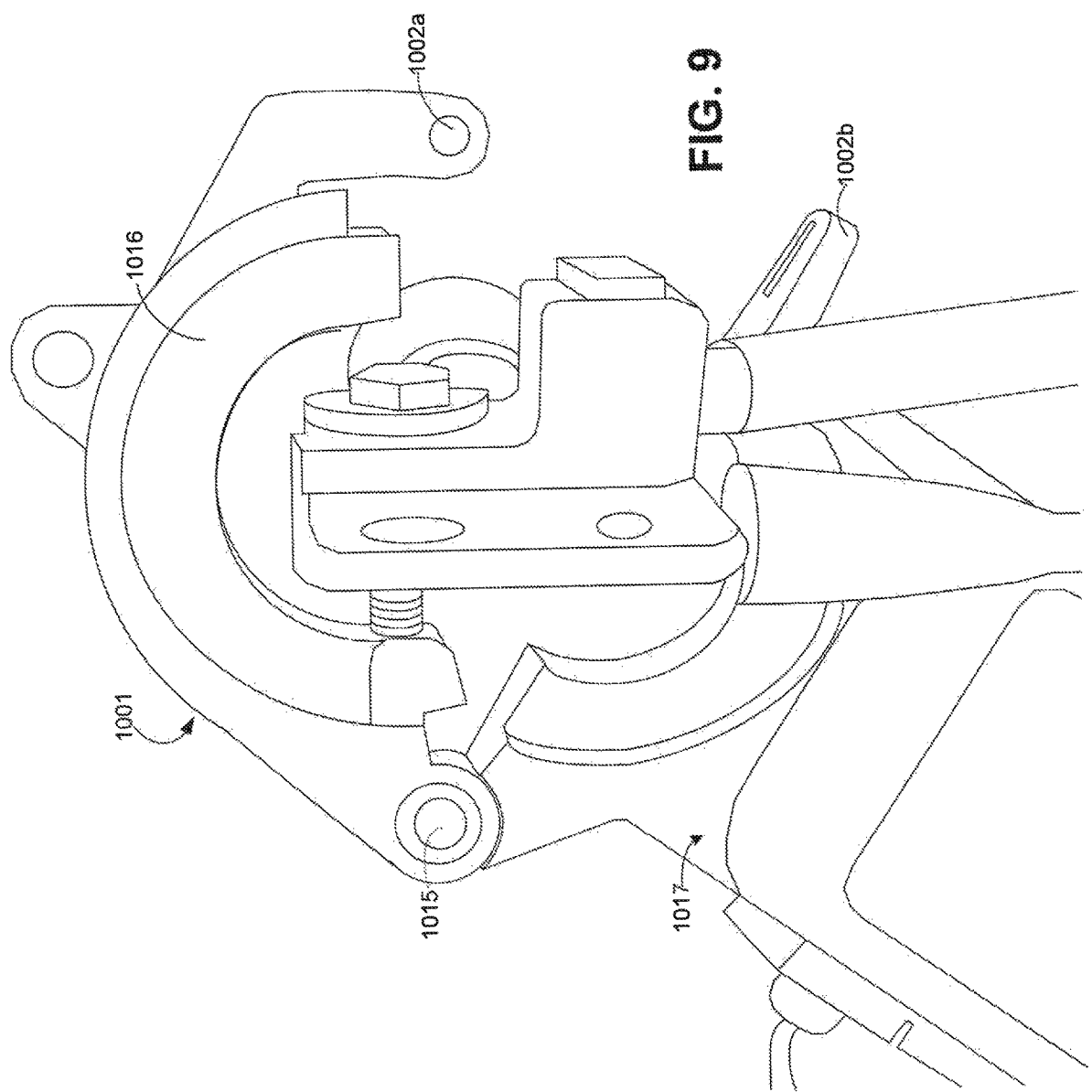
FIG. 9 is a drawing showing a main unit of the transformer monitoring device depicted in FIG. 3 installed on the transformer can depicted in FIG. 6.
Figure 10:
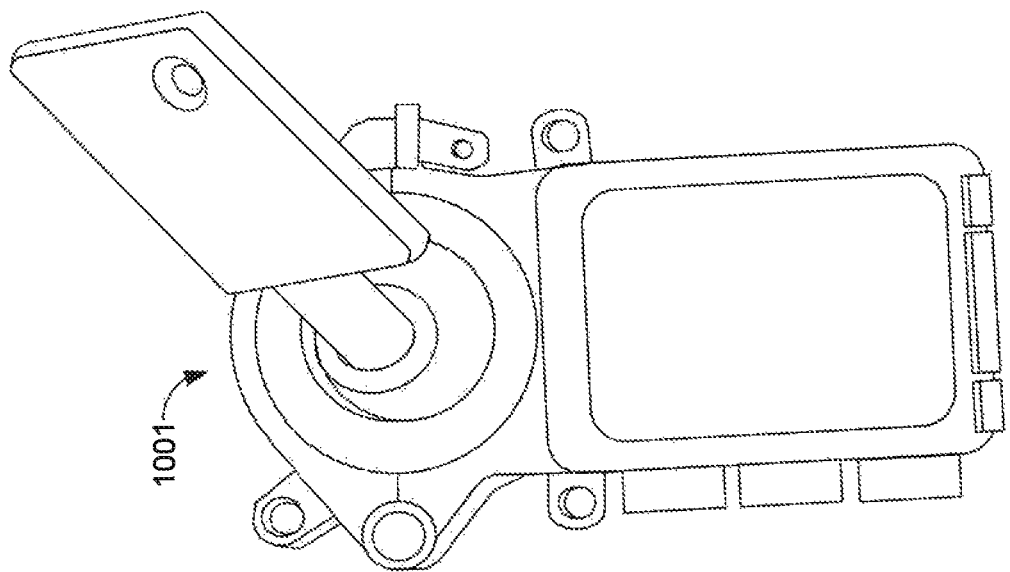
FIG. 10 is a drawing showing a main unit of the transformer monitoring device depicted in FIG. 8 installed on the transformer can depicted in FIG. 6.

FIG. 9 depicts the main unit 1001 of the transformer monitoring device 1000 being placed on one of the nodes 1064-1066, i.e., in an open position. The technician decouples the latch 1002, made up by decoupled sections 1002*a* and 1002*b*, and places the sections 1016 and 1017 around a portion of the node 1064-1066 such that the sensor unit (not shown) interfaces with the node and senses a current flowing through the node. FIG. 10 depicts the transformer monitoring device 1000 latched around the node 1064-1066. The main unit 1001 of the transformer monitoring device 1000 is latched around one of the nodes 1064-1066 and in a closed position.

In one embodiment, the cables 1004, 1007 (FIG. 3) of the main unit 1001 may be connected to one of the nodes 1064-1066 about which the respective satellite unit 1021 is coupled and one of the nodes 1064-1066 about which the main unit 1001 is coupled. One cable is connected to the node about which the satellite unit 1021 is coupled, and one cable is connected to the node about which the main unit 1001 is coupled.

During operation, the current detection device contained in the sensing unit housings 1005, 1018 (FIG. 3) sense current from the respective nodes to which they are coupled. Further, the connections made by the cables 1004, 1007 to the nodes and reference conductor sense the voltage at the respective nodes, i.e., the node around which the main unit is coupled and the node around which the satellite unit is coupled.

In one embodiment, the analytic logic 308 receives current data for each node and voltage data from each node based upon the current sensors and the voltage connections. The analytics logic 308 uses the collected data to calculate power over a period, which the analytic logic 308 transmits to the operations computing device 287 (FIG. 2A). In another embodiment, the analytic logic 308 may transmit the voltage data and the current data directly to the operations computing device 287 without performing any calculations.

Figure 11:
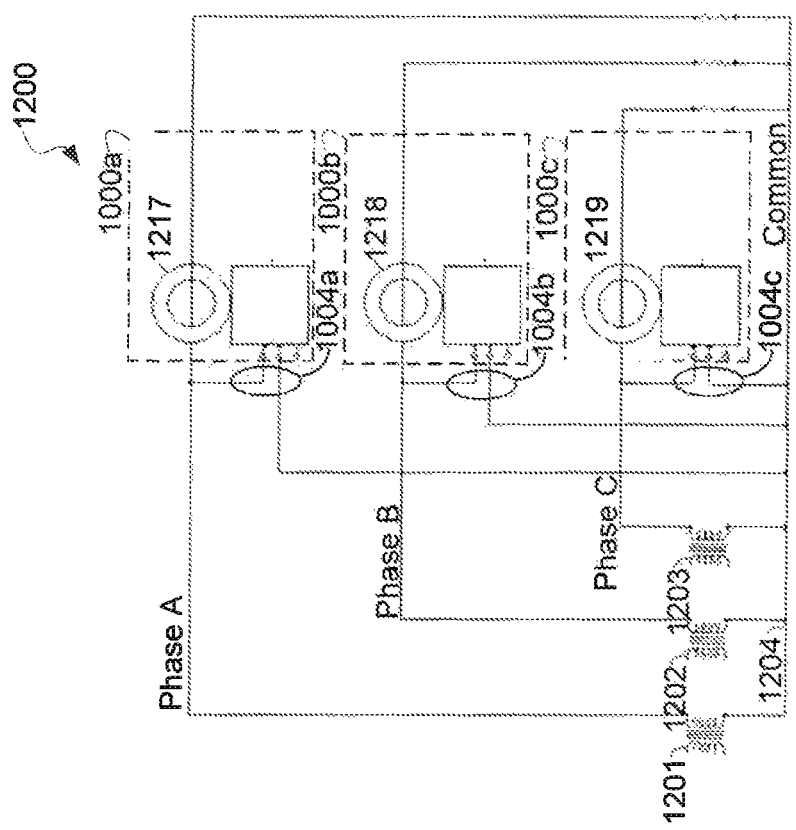
FIG. 11 is a diagram depicting a method of monitoring power in accordance with the system such as is depicted in FIG. 1 for a wye transformer configuration.
Figure 12:
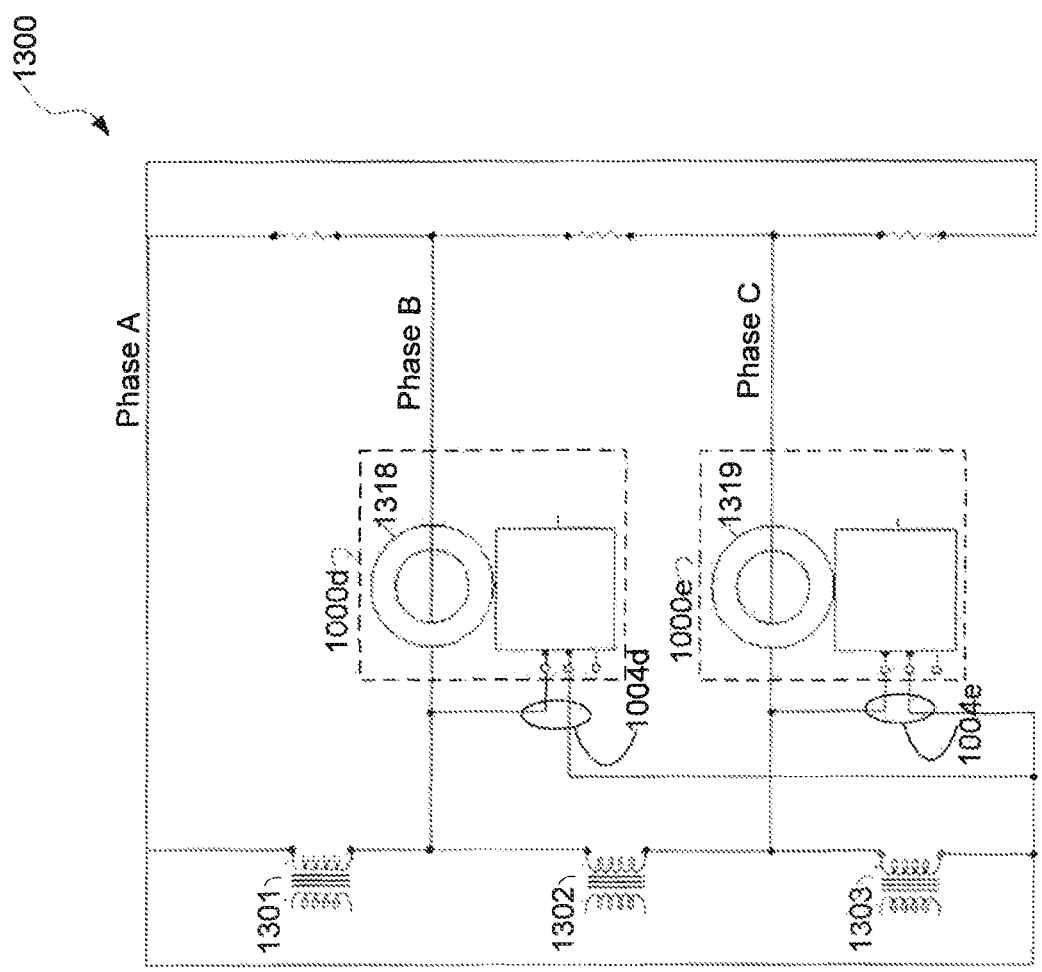
FIG. 12 is a diagram depicting a method of monitoring power in accordance with the system such as is depicted in FIG. 1 for a Delta transformer configuration.
Figure 13:
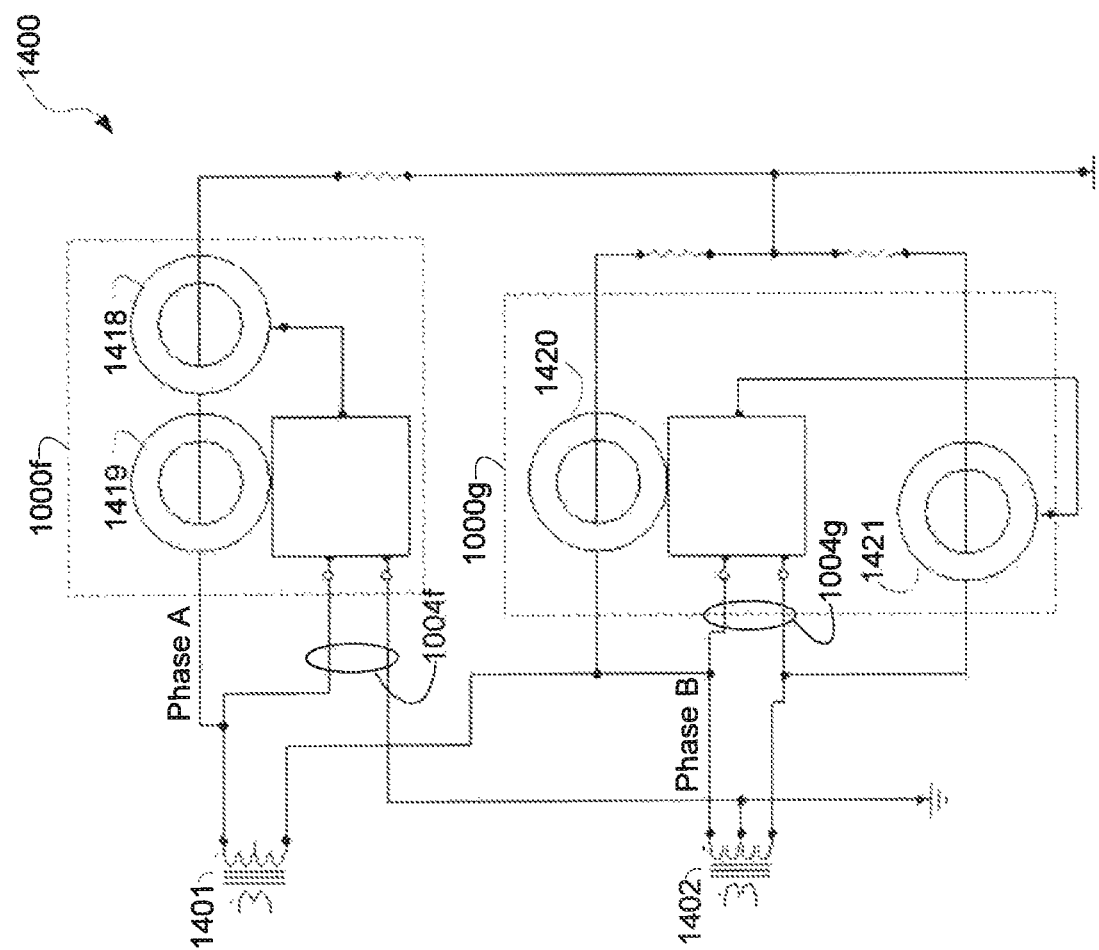
FIG. 13 is a diagram depicting a method of monitoring power in accordance with the system such as is depicted in FIG. 1 for an Open Delta transformer configuration.

FIGS. 11-13 further illustrate methods that may be employed using the monitoring device 1000 (FIG. 3) in a system 100 (FIG. 1). As described hereinabove, the monitoring device 1000 may be coupled to a conductor cable (not shown) or a bushing (not shown) that attaches the conductor cable to a transformer can 1022 (FIG. 6). In operation, the transformer monitoring device 1000 obtains a current and voltage reading associated with the conductor cable to which it is coupled, as described hereinabove, and the main unit 1001 (FIG. 3) uses the current reading and the voltage reading to calculate power usage.

Note for purposes of the discussion hereinafter, a transformer monitoring device 1000 (FIG. 3) comprises two current sensing devices, including one contained in housing 1005 (FIG. 3) and one contained in the housing 1018 (FIG. 3) of the satellite unit 1021 (FIG. 3) and the main unit 1001 (FIG. 3), respectively.

FIG. 11 is a diagram depicting a distribution transformer 1200 for distributing three-phase power, which is indicative of a "wye" configuration. In this regard, three-phase power comprises three conductors providing AC power such that the AC voltage waveform on each conductor is 120° apart relative to each other, where 360° is approximately one sixtieth of a second. As described hereinabove, three-phase power is transmitted on three conductor cables and is delivered to distribution substation transformer 103 (FIG. 1) and distribution transformer 104 (FIG. 1) on three conductor cables. Thus, the receiving distribution transformer 104 has three winding pairs (one for each phase input voltage received) to transform the voltage of the power received to a level of voltage needed for delivery to the consumers 106-108 (FIG. 1).

In the distribution transformer 1200, three single-phase transformers 1201-1203 are connected to a common (neutral) lead 1204. For purposes of illustration, each transformer connection is identified as a phase, e.g., Phase A/transformer 1201, Phase B/transformer 1202, and Phase C/transformer 1203.

In the embodiment depicted in FIG. 11, three monitoring devices 1000*a*, 1000*b*, and 1000*c* (each configured substantially like monitoring device 1000 (FIG. 3)) are employed to obtain data (e.g., voltage and current data) used to calculate the power at the distribution transformer 1200.

In this regard, at least one of current sensing devices 1217 of monitoring device 1000*a* is used to collect current data for Phase A. Notably, the sensing device 1217 of the monitoring device 1000*a* used to collect current data may be housed in the satellite unit 1021 (FIG. 3) or the main unit 1001 (FIG. 3). The voltage lead 1004*a* of the monitoring device 1000*a* is connected across the Phase A conductor cable and common 1204 to obtain voltage data. Note that in one embodiment both current sensing devices in the satellite unit 1021 and the main unit 1001 (current sensing device 1217) may be coupled around the Phase A conductor cable.

Further, a current sensing device 1218 of monitoring device 1000*b* is used to collect current data for Phase B. As described above with reference to Phase A, the sensing device 1218 of the monitoring device 1000*b* used to collect current data may be housed in the satellite unit 1021 (FIG. 3) or the main unit 1001 (FIG. 3). The voltage lead 1004*b* of the monitoring device 1000*b* is connected across the Phase B conductor cable and common 1204 to obtain voltage data. Like the Phase A implementation described above, in one embodiment both current sensing device in the satellite unit 1021 and the main unit 1001 (current sensing device 1218) may be coupled around the Phase B conductor cable.

Additionally, a current sensing device 1219 of monitoring device 1000*c* is used to collect voltage and current data for Phase C. As described above regarding Phase A, the sensing device 1219 of the monitoring device 1000*c* that is used to collect current data may be housed in the satellite unit 1021 (FIG. 3) or the main unit 1001 (FIG. 3). The voltage lead 1004*c* of the monitoring device 1000*c* is connected across the Phase C conductor cable and common 1204 to obtain voltage data. Like the Phase A implementation described above, in one embodiment both current sensing devices in the satellite unit 1021 and the main unit 1001 (current sensing device 1219) may be coupled around the Phase C conductor cable.

During monitoring, control logic 2003 (FIG. 5) of the monitoring devices 1000*a*-1000*c* use current measurements and voltage measurements to calculate total power. As described hereinabove, the power calculated from the measurements made by the transformer monitoring devices 1000*a*, 1000*b*, and 1000*c* may be used in various applications to provide information related to the power transmission and distribution system 100 (FIG. 1).

FIG. 12 is a diagram depicting a distribution transformer 1300 for distributing three-phase power, which is indicative of a delta configuration. Such distribution transformer 1300 may be used as the distribution transformer 104 (FIG. 1). The distribution transformer 1300 (like the distribution transformer 1200 (FIG. 11)) has three single phase transformers to transform the voltage of the power received on three conductor cables (i.e., three-phase power) to a level of voltage needed for delivery to the consumers 106-108 (FIG. 1).

The distribution transformer 1300 comprises three single-phase transformers 1301-1303. For purposes of illustration, each transformer connection is identified as a phase, e.g., Phase A/transformer 1301-transformer 1303, Phase B/transformer 1302-transformer 1301, and Phase C/transformer 1303-transformer 1302.

In the embodiment depicted in FIG. 12, two transformer monitoring devices 1000d and 1000e are employed to obtain voltage and current data, which are used to calculate power at the distribution transformer 1300. In this regard, transformer monitoring device 1000d is coupled about one of three incoming conductor cables, identified in FIG. 12 as Phase B, and transformer monitoring device 1000e is coupled about another one of the three incoming conductor cables, identified in FIG. 12 as Phase C. The monitoring devices 1000d and 1000e (each configured substantially like monitoring device 1000 (FIG. 3)) are employed to obtain data (e.g., voltage and current data) used to calculate the power at the distribution transformer 1300.

In this regard, a current sensing device 1318 of monitoring device 1000d is used to collect current data for Phase B. Notably, the sensing device 1318 of the monitoring device 1000d used to collect current data may be housed in the satellite unit 1021 (FIG. 3) or the main unit 1001 (FIG. 3). The voltage leads 1004d of the monitoring device 1000d are connected across the Phase B conductor cable and the Phase A conductor cable which measures a voltage differential. Note that in one embodiment both current sensing devices in the satellite unit 1021 and the main unit 1001 (current sensing device 1318) may be coupled around the Phase B conductor cable. Further note that in the delta configuration, Phase A may be arbitrarily designated as a "common" such that power may be calculated based on the voltage differentials between the current-sensed conductor cables and the designated "common," which in the present embodiment is Phase A.

Further, like Phase B measurements, a current sensing device 1319 of monitoring device 1000e is used to collect current data for Phase C. As described above regarding Phase B, the sensing device 1319 of the monitoring device 1000e used to collect current data may be housed in the satellite unit 1021 (FIG. 3) or the main unit 1001 (FIG. 3). The voltage leads 1004e of the monitoring device 1000e are connected across the Phase C conductor cable and Phase A conductor cable. Notably, in one embodiment both current sensing devices in the satellite unit 1021 and the main unit 1001 (current sensing device 1319) may be coupled around the Phase C conductor cable.

During monitoring, control logic 2003 (FIG. 5) of the monitoring devices 1000d and 1000e use current measurements and voltage measurements to calculate total power. As described hereinabove, the power calculated from the measurements made by the transformer monitoring devices 1000d and 1000e may be used in various applications to provide information related to the power transmission and distribution system 100 (FIG. 1).

FIG. 13 is a diagram depicting a distribution transformer 1400 for distributing power, which is indicative of an open delta configuration. The distribution transformer 1400 has two single phase transformers 1401 and 1402 to transform the voltage received to a level of voltage needed for delivery to the consumers 106-108 (FIG. 1).

The distribution transformer 1400 comprises two single-phase transformers 1401-1402. In the embodiment depicted in FIG. 13, two transformer monitoring devices 1000f and 1000g are employed to obtain voltage and current data, which are used to calculate power at the distribution transformer 1400.

Transformer monitoring device 1000f is coupled about one of three conductor cables identified as Phase A and transformer monitoring device 1000g is coupled about another one of the conductor cables identified as Phase B. The monitoring devices 1000f and 1000g (each configured substantially like monitoring device 1000 (FIG. 3)) are employed to obtain data (e.g., voltage and current data) used to calculate the power at the distribution transformer 1400.

In this regard, at least one of the current sensing devices 1418 or 1419 of monitoring device 1000f is used to collect voltage and current data for Phase A. While both sensing devices are shown coupled about Phase A, both are not necessarily needed in other embodiments. Notably, a sensing device of the monitoring device 1000f used to collect current data may be housed in the satellite unit 1021 (FIG. 3) or the main unit 1001 (FIG. 3). The voltage leads 1004f of the monitoring device 1000f are connected across the Phase A conductor cable and ground. Note that in one embodiment both current sensing devices in the satellite unit 1021 and the main unit 1001 may be coupled around the Phase A conductor cable, as shown.

Further, current sensing device 1420 housed in the main unit 1001 (FIG. 3) of monitoring device 1000g and current sensing device 1421 housed in the satellite unit 1021 (FIG. 3) of monitoring device 1000g is used to collect current data for Phase B. The voltage lead 1004g of the monitoring device 1000g is connected across the voltage outputs of the secondary of transformer 1402.

During monitoring, control logic 2003 (FIG. 5) of the transformer monitoring devices 1000f and 1000g uses current measurements and voltage measurements to calculate total power. As described hereinabove, the power calculated from the measurements made by the transformer monitoring devices 1000f and 1000g may be used in various applications to provide information related to the power transmission and distribution system 100 (FIG. 1).

Figure 14:
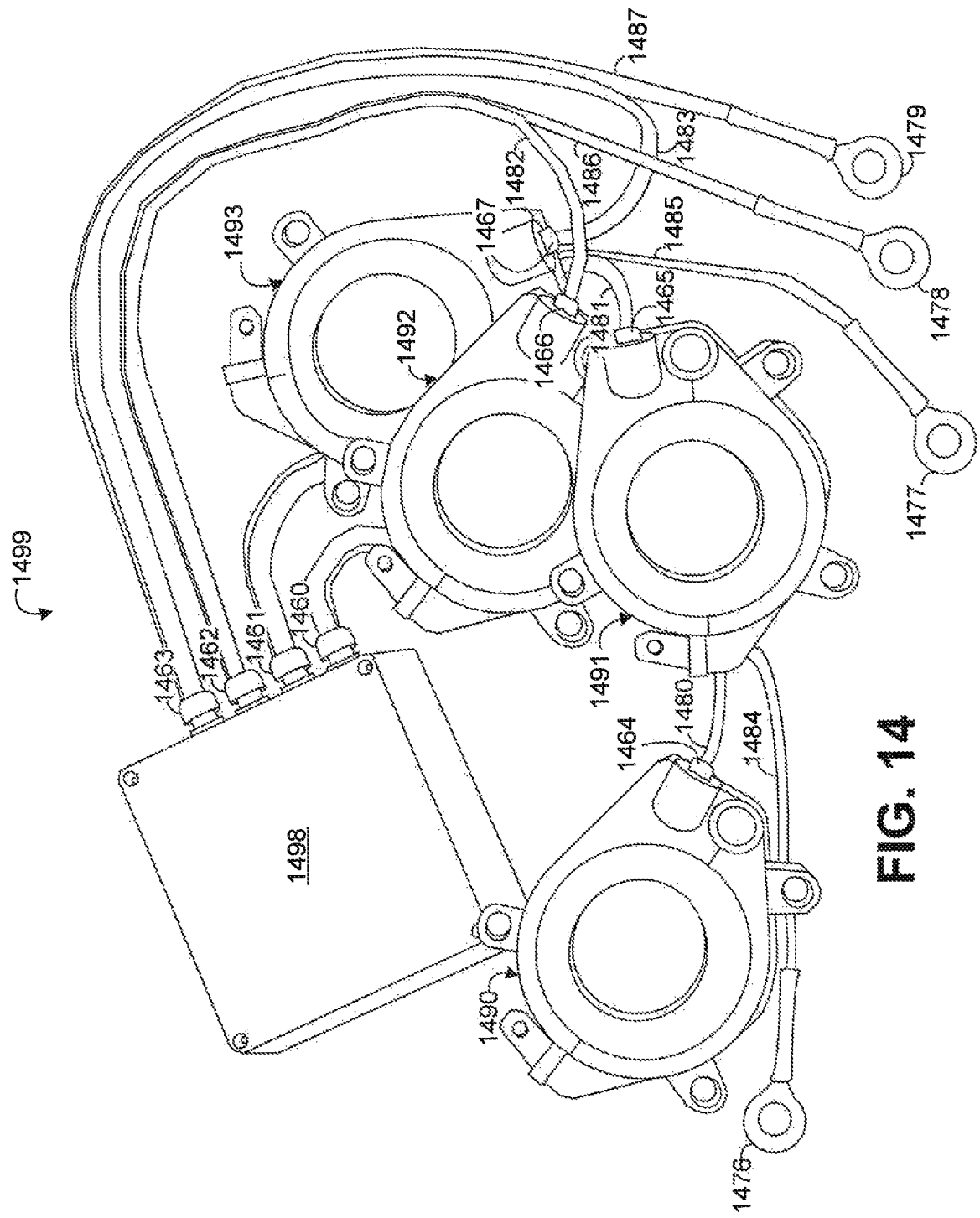
FIG. 14 depicts a polyphase distribution transformer monitoring (PDTM) device in accordance with an embodiment of the present disclosure.

FIG. 14 depicts an exemplary polyphase distribution transformer monitor (PDTM) 1499 in accordance with an embodiment of the present disclosure. For purposes of this disclosure, in one embodiment, polyphase refers to a system for distributing alternating current electrical power and has three or more electrical conductors wherein each carry alternating currents having time offsets one from the others. Note that while the PDTM 1499 is configured to monitor up to four conductors (not shown), the PDTM may be used to monitor one or more conductors, e.g., single phase or two-phase power, which is substantially like monitoring three-phase power, which is described further herein.

Notably, regarding FIG. 2A, the PDTM 1499 may serve the purpose and functionality and is a type of transformer monitoring device 244, 243 (FIG. 2A). Thus, the PDTM collects power and electrical characteristic data related to a distribution transformer 104, 121 (FIG. 1).

The PDTM 1499 comprises a control box 1498, which is a housing that conceals a plurality of electronic components that control the PDTM 1499. Additionally, the PDTM 1499 comprises a plurality of satellite current sensors 1490-1493.

The satellite current sensors 1490-1493 are structurally and functionally substantially like the satellite unit 1021 described regarding FIGS. 3, 7, and 8. In this regard, the satellite current sensors 1490-1493 detect a current through an electrical cable, bus bar, or any other type of node through which current passes into and/or from a distribution transformer, such as the distribution transformer shown in FIG. 6.

Further, the satellite current sensors 1490-1493 are electrically connected to the control box 1498 (and to the electronics (not shown) contained therein). In this regard, the satellite current sensor 1490 may be electrically connected via connectors 1464, 1460 on the satellite current sensor 1490 and the control box 1498, respectively, by a voltage current cable 1480. Similarly, the satellite current sensor 1491 is electrically connected via connectors 1465, 1461 on the satellite current sensor 1491 and the control box 1498, respectively, by a voltage current cable 1481, the satellite current sensor 1492 is electrically connected via connectors 1466, 1462 on the satellite current sensor 1492 and the control box 1498, respectively, by a voltage current cable 1482, and the satellite current sensor 1493 is electrically connected via connectors 1467, 1463 on the satellite current sensor 1493 and the control box 1498, respectively, by a voltage current cable 1483.

Note that the current cables 1480-1483 may be an American National Standards Institute (ANSI)-type cable. In one embodiment, the current cables 1480-1483 are insulated, and may be any other type of cable known in the art or future-developed configured to transfer data indicative of current measurements made by the satellite current sensors 1490-1493 to the control box 1498.

In addition, each current cable 1480-1483 is further associated with a voltage cable 1484-1487. In this regard, each voltage cable 1484-1487 extends from the connectors 1460-1463 on the control box 1498 and terminates with ring terminals 1476-1479, respectively.

Note that in one embodiment of the PDTM 1499, connectors 1460-1463 may be unnecessary. In this regard, the conductors 1480-1483 and conductors 1484-1487 may be connected to electronics directly without use of the connectors 1460-1463.

During operation, one or more of the satellite current sensors 1490-1493 are installed about conductors (e.g., cables), bus bars, or other type of node through which current travels. In addition, each of the ring terminals 1476-1479, respectively, are coupled to the conductor, bus bar, or other type of node around which their respective satellite current sensor 1490-1493 is installed.

More specifically, each satellite current sensor 1490-1493 takes current measurements over time of current that is flowing through the conductor cable, bus bar, or node around which it is installed. Also, over time, voltage measurements are sensed via each of the satellite current sensor's respective voltage cables 1484-1487. As will be described herein, the current measurements and voltage measurements taken over time are correlated and thus used to determine power usage corresponding to the conductor cable, bus bar, or node.

Figure 15A:
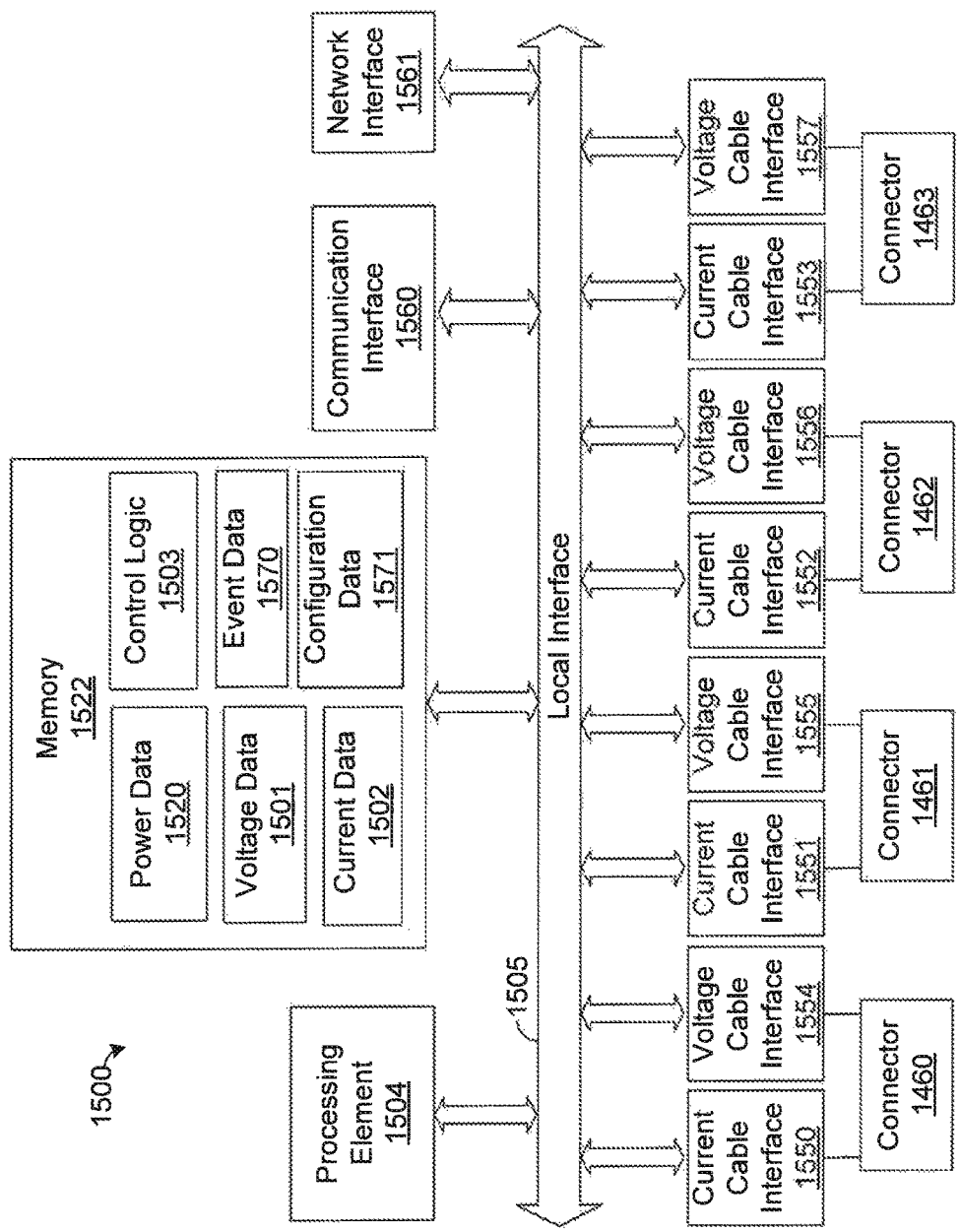
FIG. 15A is block diagram depicting an exemplary PDTM device, such as is depicted in FIG. 14.

FIG. 15A depicts an exemplary embodiment of a controller 1500 that is housed within the control box 1498. As shown by FIG. 15A, the controller 1500 comprises control logic 1503, voltage data 1501, current data 1502, and power data 1520 stored in memory 1522. In addition, the controller 1500 comprises event data 1570 and configuration data 1571.

The control logic 1503 controls the functionality of the controller 1500, as will be described in more detail hereafter. It should be noted that the control logic 1503 can be implemented in software, hardware, firmware or any combination thereof. In an exemplary embodiment illustrated in FIG. 15A, the control logic 1503 is implemented in software and stored in memory 1522.

Note that the control logic 1503, when implemented in software, can be stored and transported on any computer-readable medium for use by or in connection with an instruction execution apparatus that can fetch and execute instructions. In the context of this document, a "computer-readable medium" can be any means that can contain or store a computer program for use by or in connection with an instruction execution apparatus.

The exemplary embodiment of the controller 1500 depicted by FIG. 15 comprises at least one conventional processing element 1504, such as a digital signal processor (DSP) or a central processing unit (CPU), that communicates to and drives the other elements within the controller 1500 via a local interface 1505, which can include at least one bus. Further, the processing element 1504 is configured to execute instructions of software, such as the control logic 1503.

In addition, a network interface 1561, such as a modem or wireless transceiver, enables the controller 1500 to communicate with the network 280 (FIG. 2A).

In one embodiment, the controller 1500 further comprises a communication interface 1560. The communication interface 1560 is any type of interface that when accessed enables power data 1520, voltage data 1501, current data 1502, or any other data collected or calculated by the controller 1500 to be communicated to another system or device, e.g., the computing device 287.

As an example, the communication interface 1560 may be a serial bus interface that enables a device that communicates serially to retrieve the identified data from the controller 1500. As another example, the communication interface 1560 may be a universal serial bus (USB) that enables a device configured for USB communication to retrieve the identified data from the controller 1500. Other communication interfaces may use other methods and/or devices for communication including radio frequency (RF), cellular, power line, Wi-Fi and/or optical communications.

The controller 1500 further comprises one or more current cable interfaces 1550-1553 and voltage cable interfaces 1554-1557 that receive data transmitted via the current cables 1480-1483 (FIG. 14) and voltage cables 1484-1487 (FIG. 14), respectively. In this regard, each current cable interface/voltage cable interface pair is associated with a single connector. For example, connector 1460 receives cables 1480 (FIG. 14) (current) and 1484 (FIG. 14) (voltage), and the current cable interface 1550 receives data indicative of current and the voltage cable interface 1554 receives data indicative of current associated with the conductor about which the satellite current sensor 1490 is installed.

Similarly, connector 1461 receives cables 1481 (FIG. 14) (current) and 1485 (voltage) (FIG. 14), and the current cable interface 1551 receives data indicative of current and the voltage cable interface 1555 receives data indicative of current associated with the conductor about which the satellite current sensor 1491 (FIG. 14) is installed. The connector 1462 receives cables 1482 (FIG. 14) (current) and 1486 (FIG. 14) (voltage), and the current cable interface 1552 receives data indicative of current and the voltage cable interface 1556 receives data indicative of current associated with the conductor about which the satellite current sensor 1492 (FIG. 14) is installed. Finally, connector 1463 receives cables 1483 (FIG. 14) (current) and 1487 (FIG. 14) (voltage), and the current cable interface 1553 receives data indicative of current and the voltage cable interface 1557 receives data indicative of voltage associated with the conductor about which the satellite current sensor 1493 (FIG. 14) is installed During operation, the control logic 1503 receives the voltage and current data from the interfaces 1550-1557 and stores the current data as current data 1502 and the voltage data as voltage data 1501. The control logic 1503 performs operations on and with the voltage data 1501 and current data 1502, including periodically transmitting the voltage data 1501 and current data 1502 to, for example, the operations computing device 287 (FIG. 2A). Note that the control logic 1503 may perform calculations with the voltage data 1501 and the current data 1502 prior to transmitting the voltage data 1501 and the current data 1502 to the operations computing device 287. For example, the control logic 1503 may calculate power usage using the voltage data 1501 and current data 1502 over time and periodically store resulting values as power data 1520.

During operations, the control logic 1503 may transmit data to the operations computing device 287 via the cables using a power line communication (PLC) method. In other embodiments, the control logic 1503 may transmit the data via the network 280 (FIG. 2A) wirelessly, optically, or otherwise.

The configuration data 1571 comprises data indicative of thresholds for operational data related to the transformers 104, 121 (FIG. 1) or the system 100 (FIG. 1). The configuration data 1571 may comprise data indicative of values of such that if a read value falls below, meets, or exceeds one of the threshold values stored in configuration data 1571, the control logic 1503 triggers an event. In this regard, the control logic 1503 compares the read value to a value in the configuration data 1571. If the comparison qualifies as an event, the control logic 1503 stores data indicative of the event in event data 1570. Further, the control logic 1503 transmits data indicative of the event to the operations computing device 287. Note that types of events are described further herein.

Figure 15B:
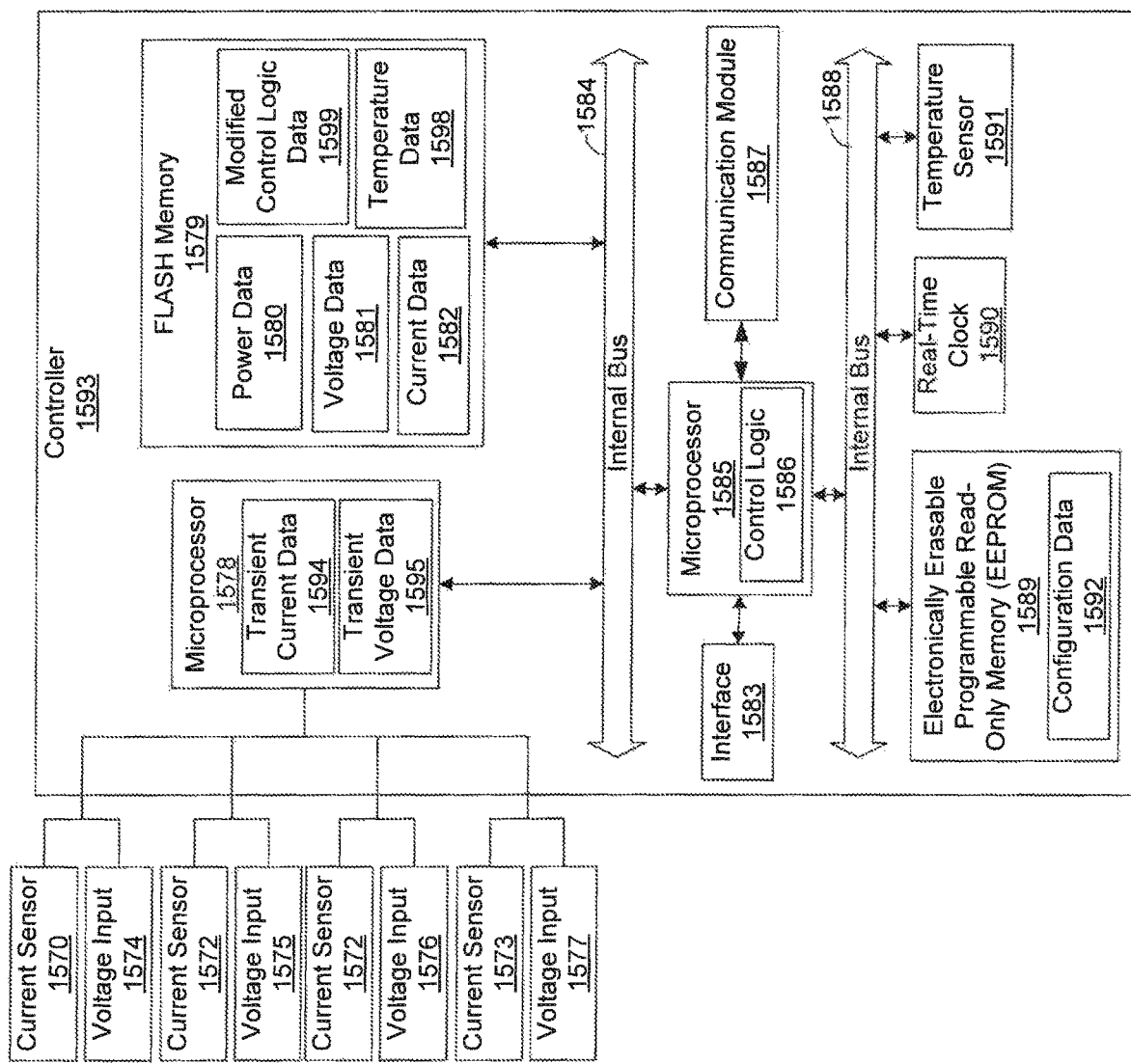
FIG. 15B is a block diagram depicting another exemplary PDTM device, such as is depicted in 14.

FIG. 15B depicts another embodiment of an exemplary controller 1593 that may be housed within the control box 1498 (FIG. 14). As shown by FIG. 15B, the controller 1593 comprises control logic 1586, which behaves similarly to the control logic 1503 (FIG. 15A) shown and described with reference to FIG. 15A. However, in the embodiment depicted in FIG. 15B, the control logic 1586 resides on a microprocessor 1585 that communicates with an internal bus 1584. The control logic 1586 may be software, hardware, or any combination thereof.

In one embodiment, the control logic 1586 is software and is stored in a memory module (not shown) on the microprocessor 1585. In such an embodiment, the control logic 1586 may be designed and written on a separate computing device (not shown) and loaded into the memory module on the microprocessor 1585.

Additionally, the controller 1593 comprises a microprocessor 1578 and FLASH memory 1579 that communicate with the microprocessor 1585 over the internal bus 1584. Further, the controller 1593 comprises an input/output interface 1583 and a communication module 1587 each of which communicates with the microprocessor 1585 directly. Note that the interface 1583 and the communication module 1587 may communicate with the microprocessor 1585 indirectly, e.g., vie the buses 1584 or 1585, in other embodiments.

The microprocessor 1578 is electrically coupled to four current sensors 1570-1573 and four voltage inputs 1574-1577. Note that with reference to FIG. 14, such current sensors 1570-1573 and voltage inputs 1574-1577 correlate with satellite units 1490-1493 (FIG. 14) and voltage leads 1476-1479 (FIG. 14), respectively.

While four current sensors 1570-1573 and respective voltage inputs 1574-1577 are depicted in FIG. 15B, there can be additional or fewer current sensors 1570-1573 and respective voltage inputs 1574-1577 used in other embodiments. In this regard, the controller 1593 may be used to gather information related to a single phase or two-phase power using device, e.g., a transformer, in other embodiments.

Note that the communication module 1587 is any type of communication module known in the art or future-developed. The communication module 1587 receives data from the microprocessor 1585 and transmits the received data to another computing device. For example, with reference to FIG. 2A, the communication module 1587 may be communicatively coupled to the operations computing device 287 (FIG. 2A) and transmit the current data 1594 and the voltage data 1595 to the operations computing device 287. In one embodiment, the communication module 1587 may be wirelessly coupled to the operations computing device 287; however, other types of communication are possible in other embodiments.

The controller 1593 further has electronically erasable programmable read-only memory (EEPROM) 1589, a real-time clock 1590, and a temperature sensor 1591. The EEPROM 1589, the clock 1590, and the sensor 1591 communicate with the microprocessor 1585 via another internal bus 1588.

Note that as shown in the embodiment of the controller 1593, the controller 1593 may comprise two separately accessible internal buses, e.g., buses 1584 and 1588. However, additional or fewer internal buses are possible in other embodiments.

During operation, the microprocessor 1578 receives signals indicative of current and voltage from current sensors 1570-1573 and voltage inputs 1574-1577, respectively. When received, the signals are analog signals. The microprocessor 1578 receives the analog signals, conditions the analog signals, e.g., through filtering, and converts the analog signals indicative of current and voltage measurements into transient current data 1594 and transient voltage data 1595. The microprocessor transmits the data 1594 and 1595 to the microprocessor 1585, and the control logic 1586 stores the data 1594 and 1595 as current data 1582 and voltage data 1581, respectively, in the FLASH memory 1579. Note that while FLASH memory 1579 is shown, other types of memory may be used in other embodiments.

The control logic 1586 may further compute power usage based upon the data 1594 and 1595 received from the microprocessor 1578. In this regard, the control logic 1586 may store the power computations in the FLASH memory 1579 as power data 1580.

Further, during operation, the control logic 1586 may receive real-time time stamps associated with a subset of the digital data 1594 and 1595 received from the microprocessor 1578. In such an embodiment, in addition to data indicative of the current and voltage readings taken by the current sensors 1570-1573 and the voltage inputs 1574-1577, the control logic 1586 may also store associated with the current and voltage data indicative of the time that the reading of the associated current and/or voltage was obtained. Thus, the FLASH memory 1579 may store historical data for a given time.

During operation, a user (not shown) may desire to load an updated version or modified version of the control logic 1586 onto the microprocessor 1585. In this scenario, the user may transmit data (not shown) indicative of a modified version of the control logic 1586 via the communication module 1587. Upon receipt by the control logic 1586, the control logic 1586 may store data 1599 indicative of the modified version in the FLASH memory 1579. The microprocessor 1585 may then replace the control logic 1586 with the modified control logic data 1599 and continue operation executing the modified control logic data 1599.

The EEPROM 1589 stores configuration data 1592. The configuration data 1592 is any type of data that may be used by the control logic 1586 during operation. For example, the configuration data 1592 may store data indicative of scale factors for use in calibration of the controller 1593, including offset or other calibration data. The configuration data 1592 may be stored in the EEPROM 1589 at manufacturing. In other embodiments, the configuration data 1592 may be updated via the communication module 1587 or the interface 1583, as described hereinafter.

Additionally, the input/output interface 1583 may be, for example, an optical port that connects to a computing device (not shown) or other terminal for interrogation of the controller 1593. In such an embodiment, logic (not shown) on the computing device may request data, e.g., power data 1580, voltage data 1581, current data 1582, or configuration data 1592, via the interface 1583, and in response, the control logic 1586 may transmit data indicative of the data 1580-1582 or 1592 via the interface 1583 to the computing device.

Further, the temperature sensor 1591 collects data indicative of a temperature of the environment in which the sensor resides. For example, the temperature sensor 1591 may obtain temperature measurements within the housing 1498 (FIG. 14). The control logic 1586 receives data indicative of the temperature readings and stores the data as temperature data 1598 in FLASH memory 1579. As described hereinabove regarding time stamp data, the temperature data 1598 may also be correlated with voltage data 1581 and/or current data 1582.

Figure 18:
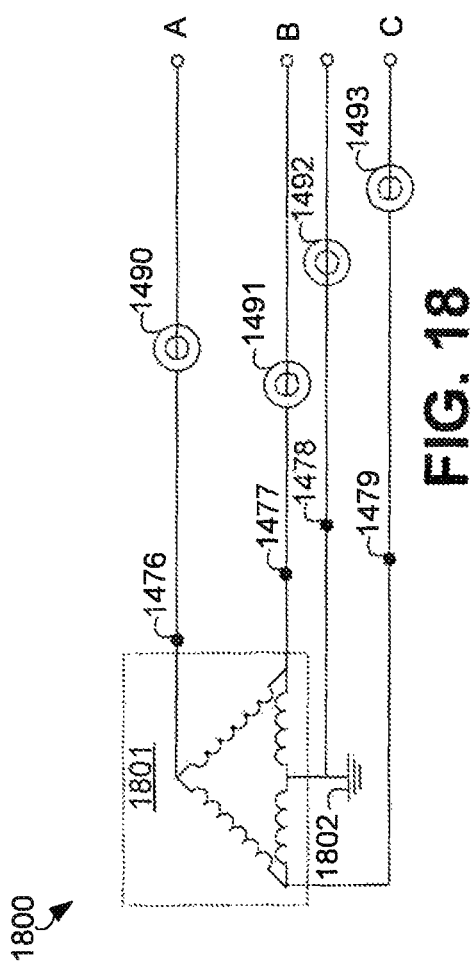
FIG. 18 is a diagram depicting a method of monitoring power with a PDTM of FIG. 14 in accordance with the system such as is depicted in FIG. 1 for a Delta transformer configuration having a center-tapped leg.

FIGS. 16-18 depict exemplary installations on differing types of electrical service connections for three-phase electric power installations. In this regard, FIG. 16 depicts a four-wire grounded "Wye" installation 1600, FIG. 17 depicts a three-wire Delta installation 1700, and FIG. 18 depicts a four-wire tapped Delta neutral grounded installation 1800. Each of these is discussed separately in the context of installing and operating a DTM 1000 or a PDTM 1499 for the collection of voltage and current data for the calculation of power usage data on the secondary windings (shown per FIGS. 16-18) for each type of installation.

FIG. 16 is a diagram depicting a Wye installation 1600 (also referred to as a "star" three-phase configuration. While the Wye installation can be a three-wire configuration, the installation 1600 is implemented as a four-wire configuration. The installation comprises the secondary windings of a transformer, which are designated generally as 1601. The installation comprises four conductors, including conductors A, B, C, and N (or neutral), where N is connected to ground 1602. In the installation 1600, the magnitudes of the voltages between each phase conductor (e.g., A, B, and C) are equal. However, the Wye configuration that includes a neutral also provides a second voltage magnitude, which is between each phase and neutral, e.g., 208/120V systems.

As an example, during operation, the PDTM 1499 (FIG. 14) is connected to the installation 1600 as indicated. The satellite current sensor 1490 is coupled about conductor A, and its corresponding voltage ring terminal 1476 is electrically coupled to conductor A. Thus, the control logic 1503 (FIG. 15A) receives data indicative of voltage and current measured from conductor A and stores the corresponding data as voltage data 1501 (FIG. 15A) and current data 1502 (FIG. 15A). Similarly, satellite current sensor 1491 (FIG. 14) is coupled about conductor B, and its corresponding voltage ring terminal 1477 (FIG. 14) is electrically coupled to conductor B, satellite current sensor 1492 (FIG. 14) is coupled about N (neutral), and its corresponding voltage ring terminal 1478 (FIG. 14) is electrically coupled to N, and satellite current sensor 1493 (FIG. 14) is coupled about conductor C, and its corresponding voltage ring terminal 1479 (FIG. 14) is electrically coupled to conductor C. Thus, over time the control logic 1503 receives and collects data indicative of voltage and current measured from each conductor and neutral and stores the corresponding data as voltage data 1501 and current data 1502. The control logic 1503 uses the collected data to calculate power usage over the period of time for which voltage and current data is received and collected.

Further, FIG. 17 is a diagram depicting a Delta installation 1700. The Delta installation 1700 shown is a three-wire configuration. The connections made in the Delta configuration are across each of the three phases, or the three secondary windings of the transformer. The installation comprises the secondary windings of a transformer, which are designated generally as 1701. The installation comprises three conductors (i.e., three-wire), including conductors A, B, and C. In the installation 1700, the magnitudes of the voltages between each phase conductor (e.g., A, B, and C) are equal.

During operation, the PDTM 1499 (FIG. 14) is connected to the installation 1700 as indicated. In this regard, satellite current sensor 1490 is coupled about conductor A, and its corresponding voltage ring terminal 1476 is electrically coupled to conductor A. Thus, the control logic 1503 receives data indicative of voltage and current measured from conductor A and stores the corresponding data as voltage data 1501 and current data 1502, respectively. Similarly, satellite current sensor 1491 is coupled about conductor B, and its corresponding voltage ring terminal 1477 is electrically coupled to conductor B, and satellite current sensor 1492 is coupled about C, and its corresponding voltage ring terminal 1478 is electrically coupled to C. In regards to the fourth satellite current sensor 1492, because the installation 1700 is a three-wire set up, the fourth satellite current sensor 1493 is not needed, and may therefore not be coupled to a conductor. Over time the control logic 1503 receives and collects data indicative of voltage and current measured from each conductor (A, B, and C) and stores the corresponding data as voltage data 1501 and current data 1502. The control logic 1503 may then use the collected data to calculate power usage over the period for which voltage and current data is received and collected.

FIG. 18 is a diagram depicting a Delta installation 1800 in which one winding is center-tapped to ground 1802, which is often referred to as a "high-leg Delta configuration." The Delta installation 1800 shown is a four-wire configuration. The connections made in the Delta installation 1800 are across each of the three phases and neutral (or ground), or the three secondary windings of the transformer and ground. The installation 1800 comprises the secondary windings of a transformer, which are designated generally as 1801. The installation comprises three conductors, including conductors A, B, and C and the center-tapped N (neural) wire. The installation 1800 shown is not symmetrical and produces three available voltages.

As an example, during operation, the PDTM 1499 (FIG. 14) is connected to the installation 1800 as indicated. In this regard, satellite current sensor 1490 is coupled about conductor A, and its corresponding voltage ring terminal 1476 is electrically coupled to conductor A. Thus, the control logic 1503 receives data indicative of voltage and current measured from conductor A and stores the corresponding data as voltage data 1501 and current data 1502. Similarly, satellite current sensor 1491 is coupled about conductor B, and its corresponding voltage ring terminal 1477 is electrically coupled to conductor B, satellite current sensor 1492 is coupled about N, and its corresponding voltage ring terminal 1478 is electrically coupled to N, and satellite current sensor 1493 is coupled about conductor C, and its corresponding voltage ring terminal 1479 is electrically coupled to C. Like the installation 1600, over time the control logic 1503 receives and collects data indicative of voltage and current measured from each conductor (A, B, C, and N) and stores the corresponding data as voltage data 1501 and current data 1502. The control logic 1503 may then use the collected data to calculate power usage over the period for which voltage and current data is received and collected.

Figure 19:
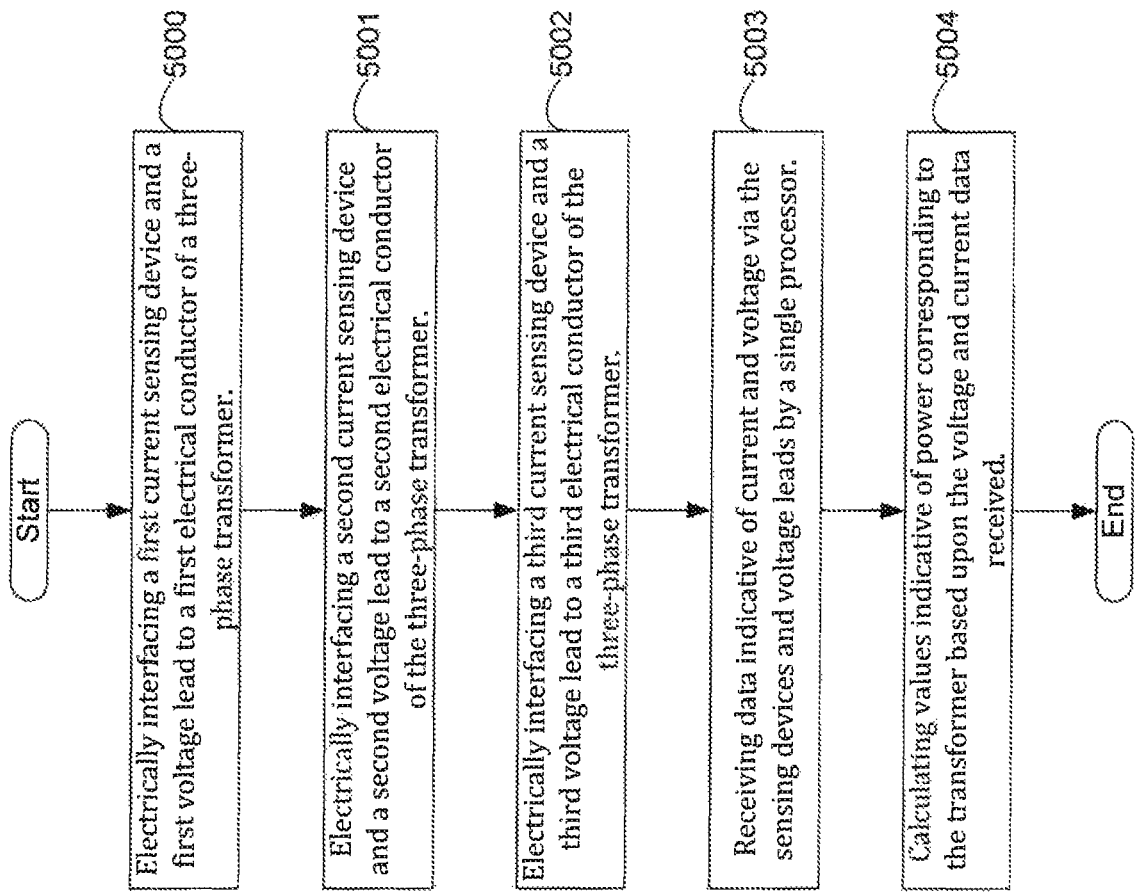
FIG. 19 is a flowchart depicting exemplary architecture and functionality of monitoring the power transmission and distribution system such as is depicted in FIG. 1 with a PDTM of FIG. 14.

FIG. 19 is a flowchart depicting exemplary architecture and functionality of the system 100 depicted in FIG. 1.

In step 1900, electrically interfacing a first transformer monitoring device 1000 (FIG. 3) to a first electrical conductor of a transformer at a first location on a power grid, and in step 1901 measuring a first current through the first electrical conductor and a first voltage associated with the first electrical conductor.

In step 1902, electrically interfacing a second transformer monitoring device 1000 with a second electrical conductor electrically connected to the transformer, and in step 1903 measuring a second current through the second electrical conductor and a second voltage associated with the second electrical conductor.

Finally, in step 1904, calculating values indicative of power corresponding to the transformer based upon the first current and the first voltage and the second current and the second voltage.

Figure 20:
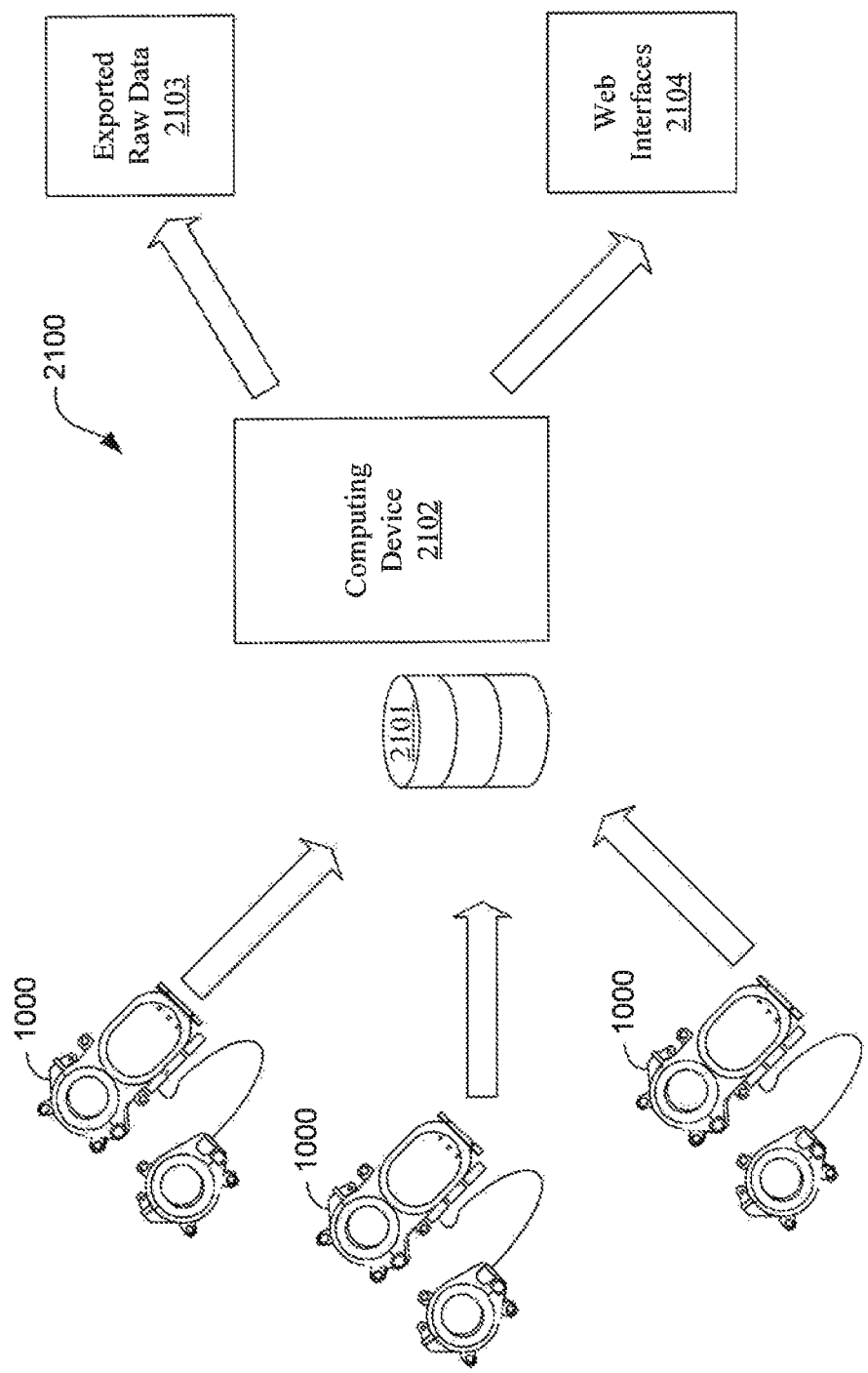
FIG. 20 is a diagram depicting an exemplary system of the present disclosure showing distribution transformer monitoring devices wirelessly communicating with a computing device.

FIG. 20 is an exemplary embodiment of a transformer monitoring and data analysis system 2100 in accordance with an embodiment of the present disclosure. The system 2100 comprises a plurality of DTM devices 1000. Note that structure, function, and operation of the DTM devices 1000 are described above with reference to FIGS. 3, 5, and 7-10.

Further note that three DTM devices 1000 are shown in FIG. 20. However, additional or fewer DTM devices 1000 may be used in other embodiments of the present disclosure.

Each DTM device 1000 is installed around a node (not shown) of a transformer 2101. Each DTM device 1000 collects data indicative of current flow and voltage of their respective node. This collected data is transmitted to a computing device 2102, via a communication interface 2050 (FIG. 5). As described hereinabove, the communication interface 2050 may employ any type of technology that enables the DTMs 1000 to communicate with the computing device 2102. As a mere example, the communication interface 2050 may be a wireless transceiver, and each DTM communicates its collected data to the computing device 2102 wirelessly. In another embodiment, the DTMs 1000 may communicate via an optical connection.

In one embodiment, the computing device 2102 is configured to analyze the data received from the DTM devices 1000 to determine if an event has occurred for which reporting is appropriate, e.g., a power outage. In another embodiment, the DTMs 1000 determine whether an event has occurred and transmits data indicative of the event to the computing device 2101, which is described with reference to FIG. 5 and is further described herein.

In the embodiment wherein the computing device 2102 determines an event, the computing device 2102 determines at the very least when an event has occurred. Events are described further herein. Also, the computing device 2102 transmits a notification to utility personnel and/or transmits data to a Web interface 2104 that may be accessed by a user. Note that in the described embodiment, the determination of an event is effectuated by the computing device 2101.

In another embodiment, each DTM 1000 is configured to analyze the data received and determine when an event has occurred. In such an embodiment, the DTM 1000 transmits data indicative of the event to the computing device 2102, and the computing device 2102 transmits notifications, serves informative Web pages via a Web interface 2104, and tracks historical data, as described hereafter.

In the embodiment, the computing device 2102 collects, compiles, and stores at the very least historical data related to each DTM communication. The computing device 2102 is further configured to export raw data 2103 of the historical data via any type of mechanism capable of exporting raw data including, but not limited to distributed network protocol (dnp), file transfer protocol (ftp), or web services.

Figure 21:
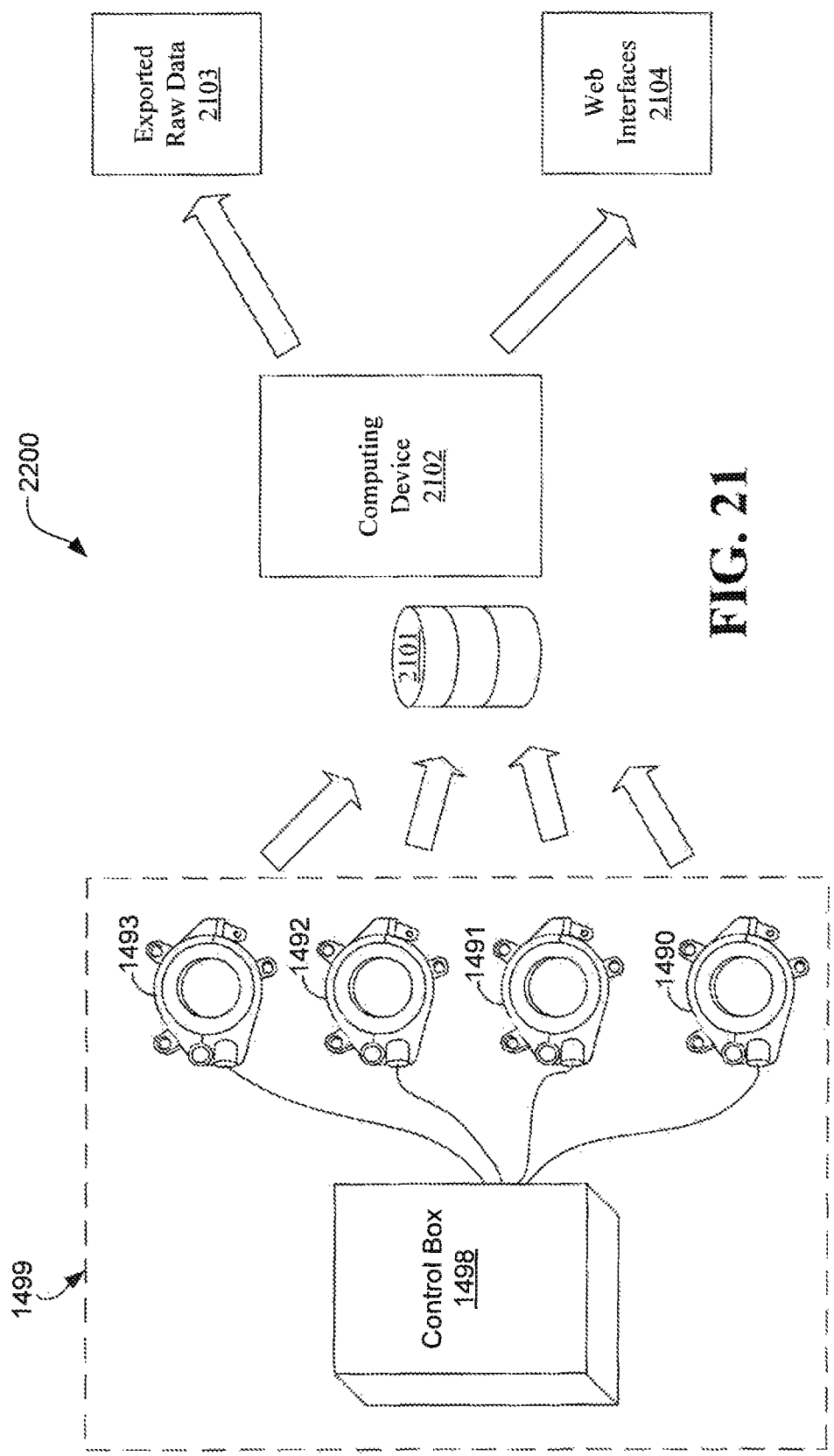
FIG. 21 is a diagram depicting polyphase distribution transformer device coupled to a control box and wirelessly communicating with a computing device.

FIG. 21 is an exemplary embodiment of another transformer monitoring and data analysis system 2200 in accordance with an embodiment of the present disclosure. However, different from the system 2100 (FIG. 20), system 2200 comprises a polyphase distribution transformer monitor (PDTM) 1499.

As described hereinabove with reference to FIGS. 14 and 15A, the PDTM comprises a plurality of satellite units 1490-1493. Each satellite unit 1490-1493 is installed around a node (not shown) of the transformer 2101 or other type of electricity delivery system. Further, each satellite unit 1490-1493 is configured to measure voltage and current in each of their respective nodes. The measurements collected are transmitted to the control box 1498 via wires or other type of transmission.

Note that while four satellite units are shown in FIG. 21, fewer or additional satellite units may be used. As an example, one satellite unit may be used to obtain measurements from a single-phase transformer. Additionally, three satellite units may be used for three phase transformers.

The control box 1498 comprises a communication interface 1560 (FIG. 15A). The communication interface 1560 is configured to transmit the collected data to the computing device 2102. The computing device 2102 behaves as described with reference to FIG. 20, that is exporting raw data 2103 and providing data to Web interfaces 2104.

In one embodiment, the computing device 2102 is configured to analyze the data received from the DTM devices 1000 to determine if an event has occurred for which reporting is appropriate, e.g., a power outage. In another embodiment, the DTMs 1000 determine whether an event has occurred and transmits data indicative of the event to the computing device 2101, which is described with reference to FIG. 5 and is further described herein.

Figure 22:
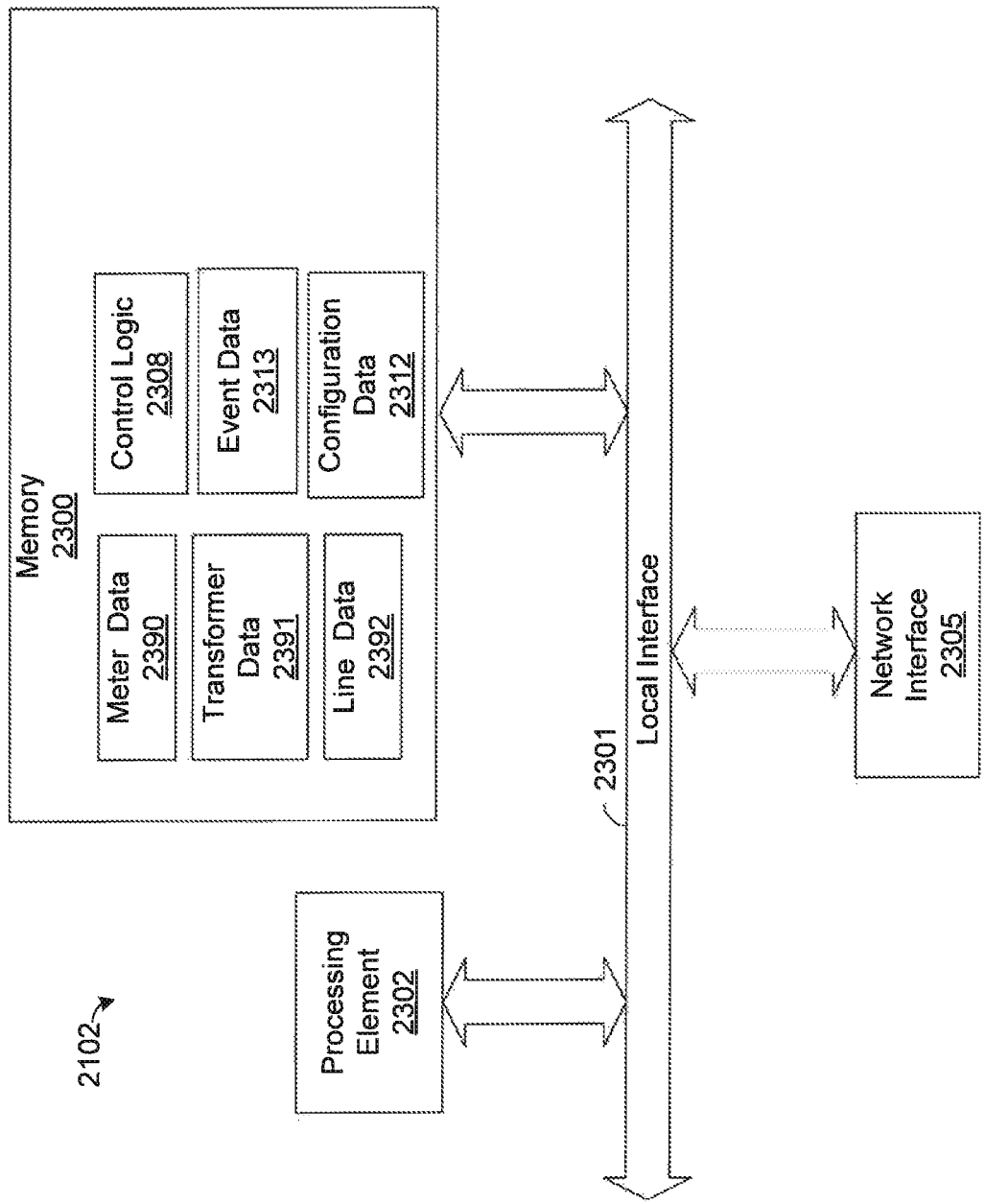
FIG. 22 is a block diagram depicting an exemplary computing device of FIGS. 20 and 21 in accordance with an embodiment of the present disclosure.

FIG. 22 depicts an exemplary embodiment of the computing device 2102 such is depicted in FIGS. 21 and 22. As shown by FIG. 22, the computing device 2102 comprises computing device control logic 2308, meter data 2390, transformer data 2391, line data 2392, event data 2313, and configuration data 2312, all stored in memory 2300.

The computing device control logic 2308 generally controls the functionality and operations of the computing device 2102, as will be described in more detail hereafter. It should be noted that the computing device control logic 2308 can be implemented in software, hardware, firmware or any combination thereof. In an exemplary embodiment illustrated in FIG. 22, the computing device control logic 2308 is implemented in software and stored in memory 2300.

Note that the computing device control logic 2308, when implemented in software, can be stored and transported on any computer-readable medium for use by or in connection with an instruction execution apparatus that can fetch and execute instructions. In the context of this document, a "computer-readable medium" can be any means that can contain or store a computer program for use by or in connection with an instruction execution apparatus.

The exemplary embodiment of the computing device 2102 depicted by FIG. 22 comprises at least one conventional processing element 2302, such as a digital signal processor (DSP) or a central processing unit (CPU), which communicates to and drives the other elements within the operations computing device 2102 via a local interface 2301, which can include at least one bus. Further, the processing element 2302 is configured to execute instructions of software, such as the computing device control logic 2308.

In addition, the computing device 2102 comprises a network interface 2305. The network interface 2305 is any type of interface that enables the computing device 2102 to export raw data 2103 or deliver web interfaces 2104 to a user (not shown). As an example, the network interface 2305 may communicate with the Internet (not shown) to deliver the Web Interfaces 2104 to a user's browser or communicate with a wide area network (WAN) to deliver exported raw data 2103. Notably, the network interface 2305 may enable wired and wireless communication.

The remaining discussion focuses on the PDTM system 2200 depicted in FIG. 21. Note however, that the transformer 2101, the computing device 2102, the exported raw data 2103, and the Web interfaces 2104 are elements common to both system 2100 (FIG. 20) and system 2200 (FIG. 21). Thus, when describing operation of the computing device 2102, such operations can also be attributed to the system 2100 depicted in FIG. 20.

Note that in one embodiment the configuration data 2312 comprises data indicative of ranges of operation tolerances expected at the transformer and program tolerances for each phase or node of the transformer 2101 (FIGS. 21 and 22). During operation, the computing device control logic 2308 analyzes the data received from the controller 1500 (FIG. a). In one embodiment, the computing device control logic 2308 compares the value received to the corresponding threshold in the configuration data 2312. If the comparison indicates that the value meets, falls below or exceeds a threshold value, the computing device control logic 2308 automatically generates a notification to be sent to utility personnel (not shown) who have been designated to oversee the condition indicated.

Note that notification may be effectuated using a variety of communication modes. For example, the computing device control logic 2308 may email or text the utility personnel. In another embodiment, the computing device control logic 2308 may automatically call the utility personnel with a preprogrammed message. Additionally, the computing device control logic 2308 may store the data received and/or the results of the analysis in historic data 2306.

In another embodiment, which is described hereinabove regarding FIG. 5 and FIG. 15A, the DTM 1000 (FIG. 5) and the PDTM (FIG. 15A) have control logic 2003, 1503, respectively. In operation, the control logic 2003 (DTM) stores event data 2060 (FIG. 5) in memory 2000 (FIG. 5). Further, the control logic 1503 (PDTM) stores event data in memory 1522. The control logic 2003, 1503 (FIG. 15A) stores event data based upon predetermined thresholds, which are stored as configuration data 2061 (FIG. 5) and configuration data 1571 (FIG. 15A), respectively. If an event of interest occurs, the control logic 2003, 1502 transmit data indicative of the event to the computing device 2101. Upon receipt, the computing device control logic 2308 determines whether to take an action, e.g., transmit a notification to utility personnel. The notifications may be for many different types of events. The following discussion outlines exemplary events.

Note that for ease of discussion, the control logic 2003 (DTM) and the control logic 1503 (PDTM) is hereinafter referred to collectively as "Control Logic."

In one embodiment, the power may be lost (or restored) at the transformer 2101 (FIG. 21). Prior to powering down, the Control Logic is configured to transmit a message to the computing device 2102 that power has been lost at the transformer. In response, the computing device 2102 stores data indicative of the event, updates a status of the transformer, and transmits an instant message (e.g., a text message) as well as time-stamped event data that indicates the time power was lost. Once power is restored, the Control Logic transmits a message to the computing device 2102 indicating that the power is restored to the transformer 2101. The computing device 2102 determines, based upon a predetermined setting, if a notification is indicated in the configuration data, when to notify the utility personnel, and to whom to send the notification. This event notification allows utilities accurate power loss evaluation and reporting.

Note that when power is lost at the transformer 2101, power is also lost at the DTM 1000 (FIG. 20) or the PDTM 1499 (FIG. 21). In the event power is lost, the DTM and the PDTM devices comprise a circuit, which includes an electronic component, e.g., a supercapacitor, that enables the Control Logic to continue operating for a time period after power is lost. During this period of time, the Control Logic sends a notification as described hereinabove to the computing device 2102.

In one embodiment, the Control Logic monitors the ambient temperature within the DTM 1000 (FIG. 20) or the PDTM 1499 (FIG. 21) or the ambient temperature of the transformer 2101. In either case, the Control Logic may periodically transmit, or transmit upon request, data indicative of the temperature being monitored. If the value exceeds a threshold value, the Control Logic transmits data indicative of the event to the computing device 2102. At the computing device 2102, the control logic 2308 determines whether to send a notification, to whom to send the notification, and when to send the notification. Further, the control logic 2308 stores event data 2313 in memory 2300. In one embodiment, the Control Logic transmits the total power being consumed by the satellite units 1490-1493 (FIG. 21) or each DTM 1000 (FIG. 20). If the total power equals and/or exceeds a threshold value or equals and/or falls below a threshold value, the Control Logic transmits data indicative of the power consumption to the computing device 2102. The control logic 2308 determines whether to transmit a message to utility personnel, to whom to transmit the message and when to transmit the message. Note that in one embodiment, the computing device 2102 may compare the data indicative of the power consumption to configuration data 2312, and transmit a message based upon the comparison.

In one embodiment, the Control Logic monitors the reverse power being supplied through a distributed generation (DG) or a distributed energy resources (DER). If the total reverse power exceeds a high threshold limit as indicated in the configuration data, the Control Logic transmits data indicative of the reverse power to the computing device 2102, and the control logic 2308 determines whether to send a notification to utility personnel, to whom to send the notification, and when to send the notification.

Additionally, the Control Logic independently monitors the three phases of power, phase A, B, and C for energy, voltage, and current. The Control Logic compares the data indicative of the energy, voltage, and current with threshold values in the configuration data 2312, and if a threshold value is met or exceeded, the Control Logic transmits data indicative of the energy, voltage, and current to the computing device 2102. The computing device 2102 stores the data as transformer data 2391. The computing device control logic 2308 compares the meter data 2390 with corresponding configuration data 2312, and determines whether to transmit a notification, to whom to transmit the notification, and when to transmit a notification based on the tolerances that are violated.

In one embodiment, the Control Logic measures voltage imbalance of the transformer 2101. If the voltages are imbalanced, the Control Logic transmits a notification to the computing device 2102. The computing device control logic 2308 determines whether to send a notification, to whom to send the notification, and when to send the notification. As an example, the values indicative of voltage imbalance may exceed the industry standard balance, i.e., 2-4% imbalance is acceptable, and greater imbalances can be harmful to downstream equipment and appliances. If the Control Logic determines that the imbalance is greater than 2-4%, the Control Logic sends a notification to the computing device 2102, and the computing device control logic 2308 determines whether to send utility personnel a notification, to whom to send the notification, and when to send the notification.

In one embodiment, the Control Logic monitors a power factor for the transformer 2101. If the power factor exceeds a threshold value, the Control Logic transmits data indicative of the power factor to the computing device 2102. In response, the computing device control logic 2308 determines whether to send a notification, to whom to send the notification, and when to send the notification.

In one embodiment, the Control Logic is configured to monitor power based upon different threshold limits for different parts of a 24-hour period. For example, some assets may not be active at different times of the day, e.g., photovoltaic system. If the Control Logic determines that the power monitored meets or exceeds or falls below the threshold values, the Control Logic transmits data indicative of the power to the computing device 2102. The computing device control logic 2308 is configured to determine whether to transmit a notification to utility personnel, to whom to send the notification, and when to send the notification.

Other events that are monitored and analyzed by the Control Logic include high and low per phase, high root mean square (RMS) current per phase, high and low frequency and period overall, and high diversion. Additionally, other operational values that generate events include low RMS current per phase, RMS voltage imbalance, RMS current imbalance, forward interval kilowatt (KW) and kilovolt-amp (KVA), reverse interval KW and KVA, and low cellular signal strength. In one embodiment, the energy data (KW) may be reconciled against downstream meters to identify power theft or a mismatch of transformers to meters. In any event, in one embodiment, the Control Logic is configured to determine whether to transmit data indicative of the event to the computing device 2102, and the computing device control logic 2308 determines whether to notify utility personnel, to whom to send a notification, and when to send the notification. There is often unmetered authorized energy consumption, which includes consumption by street lights, traffic lights, etc. The Control Logic is configured to extract the unmetered authorized energy consumption from the remaining energy consumption. Thus, in determining the difference between the transformer and associated downstream meters, the Control Logic can with some degree of certainty determine that the energy difference may be due to pilfered power, or there is a mismatch of transformer to meter association.

Further, transformer energy data may also be used to properly identify which downstream meters are associated with their respective transformer. In this regard, the system 1499 remedies this scenario by using the power data to identify the proper meter-transformer association.

Figure 23:
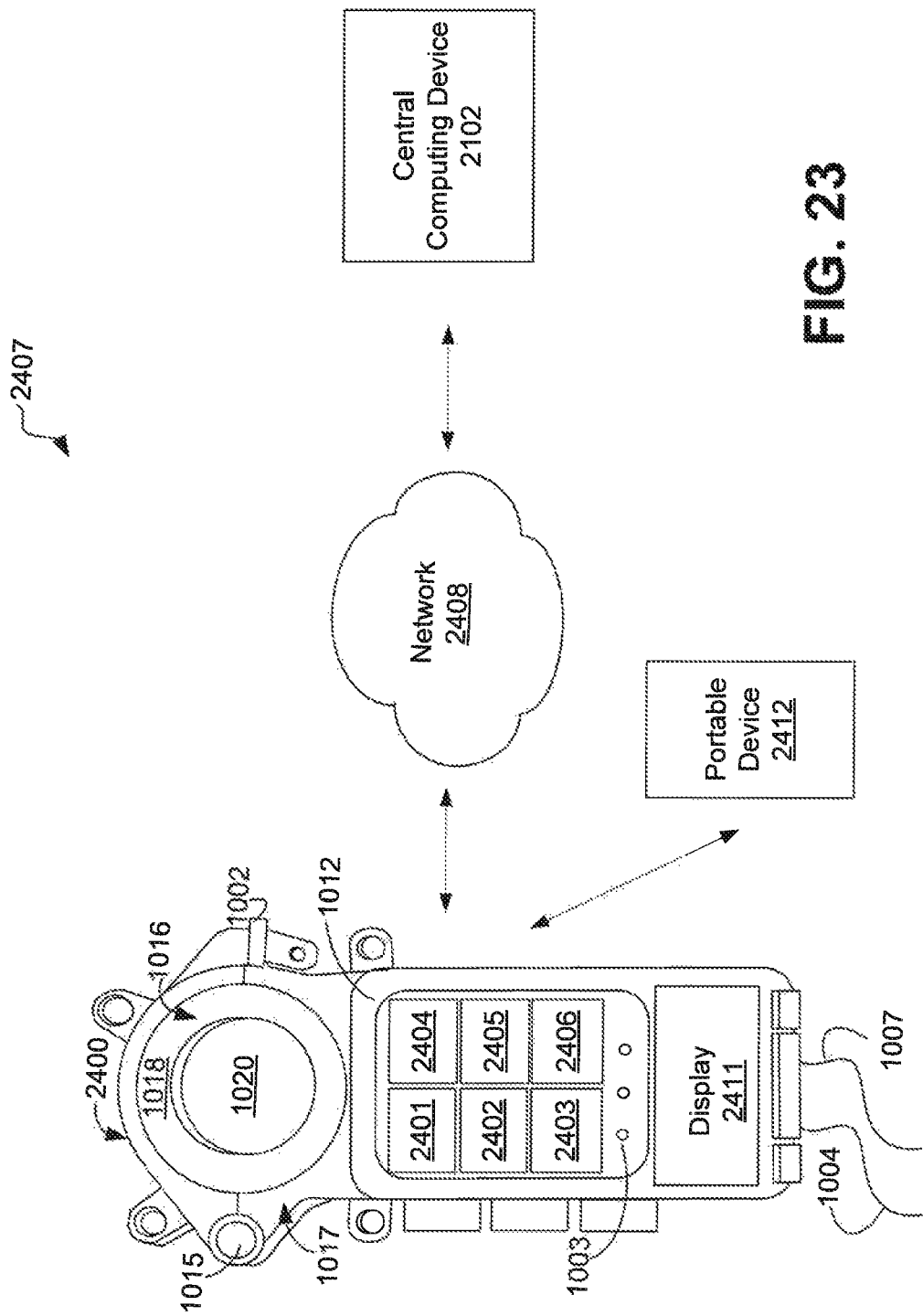
FIG. 23 is a diagram depicting another exemplary system wherein the distribution transformer monitoring device is communicatively coupled to a central computing device and a portable device.

FIG. 23 shows a system 2407 that comprises another embodiment of a monitoring device 2400. The system 2407 further comprises the central computing device 2102 that is communicatively coupled to the monitoring device 2400 via a network 2408.

The monitoring device 2400 is similar to the main unit 1000 shown in FIG. 3; however, inclusion of the satellite unit 1021 (FIG. 3) is optional. Note that like numerals are used from FIG. 3 on the monitoring device 2400 of FIG. 23.

The monitoring device 2400 comprises an extended box-like housing section 1012. Within the housing section 1012 resides one or more printed circuit boards (PCB) (not shown), semiconductor chips (not shown), and/or other electronics (not shown) for performing operations related to the general purpose of the monitoring device 2400. In one embodiment, the housing section 1012 is a substantially rectangular housing; however, differently sized and differently shaped housings may be used in other embodiments.

Additionally, the monitoring device 2400 further comprises one or more cables 1004, 1007. The cables 1004, 1007 may be coupled to a conductor cable or corresponding bus bars (not shown) and ground or reference voltage conductor (not shown), respectively, for the corresponding conductor cable, which will be described further herein. Voltage readings are taken through the cables 1004 and 1007.

Note that methods in accordance with an embodiment of the present disclosure use the described monitoring device 2400 for collecting current data, voltage data, and other operational data related to the transformer to which the monitoring device is coupled. The monitoring device 2400 further comprises at least one sensor 2401-2403 for detecting signals, i.e., data. In one embodiment, the monitoring device 2400 collects voltage and current data on a low voltage (LV) side of a transformer circuit. Further, there may be some other type of sensor (not shown) installed near the monitoring device 2400 coupled to the low-voltage (LV) or medium voltage (MV) side that is configured to communicate with the monitoring device 2400. One example of a nearby sensor (not shown) on the MV side may be a fault indicator, which transmits data indicative of a fault on the transformer circuit. In such an embodiment, the sensor 2401 would detect the data indicative of the fault and transmit data indicative of the fault to the central computing device 2102, thereby alleviating the need for an operator to manually read the fault indicator.

Note that a fault indicator is one of numerous types of sensors that may be used to gather data from the circuit to which the monitoring device 2400 is coupled. One such method, which will be described further herein, is that the monitoring device may collect data from sensors on transformer circuits up or down the power line to which the transformer circuit is coupled from other sensors. Thus, the monitoring device 2400 may further have an interface or communications bus, either wired (including a serial port, a usb port, etc.), wireless (including a Bluetooth Wi-Fi (a trademark representing IEEE 802.11x, etc.) or optical. The monitoring device 2400 transmits data through the interface or communication bus via the network 2408 and to the central computing device 2102.

In another embodiment, the monitoring device 2400 further comprises at least one port 2404-2406 for wired or wireless coupling to a sensor used in the transformer circuit. Using the example above, the port 2404 may be coupled to the fault indicator via a wire (not show). The fault detector may detect a fault in the transformer circuit and transmit data indicative of the fault over the wire to the port 2404, and the monitoring device 2400 transmits data indicative of the fault to the central computing device 2102 either wired or wirelessly through the network 2408. The central computing device 2101 alerts an operator to the fault without the operator having to manually check the fault indicator.

In one embodiment, the monitoring device 2400 further comprises a display device 2411. One such display device may be a liquid crystal display (LCD). The display device 2411 allows user interface with the functionality and operation of the monitoring device 2400

In this regard, once the monitoring device 2400 is coupled to power, the display device 2411 may display data indicative of device booting, connecting to the network, connected to the network (with the internet protocol (IP) address), and the like. Additionally, the display device 2411 may display data indicating provisioning with the server. Furthermore, the display device 2411 may indicate that the transformer monitoring device 2400 is reading voltages and/or currents, and the display device 2411 may show the power factor. Notably, the display device 2411 is configured for showing any fault conditions either with the monitoring device or in the power, voltage, current, power factor, or any operational value measured by the monitoring device 2400. This indication on the display device 2411 may alert an installer to a problem with the transformer circuit, the installation, or any other alert detected by the monitoring device 2400.

In one embodiment, the display device 2411 may display operational values. For example, the display device 2411 may display kWh consumption in a similar way to an AMI meter.

The system 2407 may further comprise a portable device 2412 configured to communicate with the communication interface of the monitoring device 2700. The portable device 2412 may be, for example, a Smartphone with a controlling app, a laptop personal computer with custom software, or a custom device.

Figure 24:
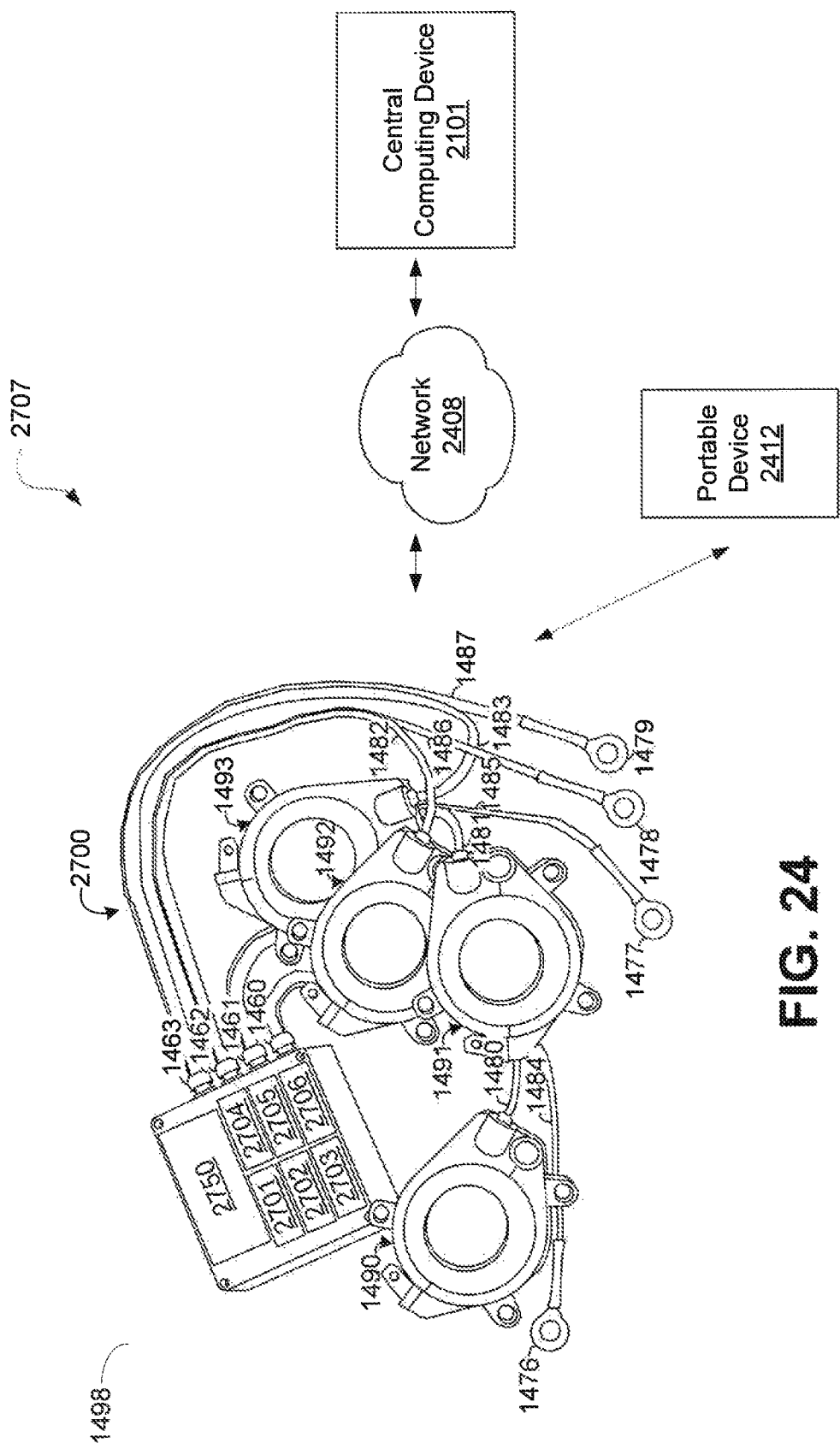
FIG. 24 is a diagram depicting another exemplary system wherein a polyphase distribution transformer device is communicatively coupled to a central computing device and a portable device.

FIG. 24 shows a system 2707 that comprises another embodiment of a monitoring device 2700. The system 2707 further comprises the central computing device 2101 that is communicatively coupled to the monitoring device 2700 via the network 2408.

The polyphase distribution transformer monitor (PDTM) 2700 in accordance with an embodiment of the present disclosure is substantially like PDTM 1400 shown regarding FIG. 14. Thus, for purposes of this disclosure, polyphase refers to a system for distributing alternating current electrical power and has two or more electrical conductors wherein each carry alternating currents having time offsets one from the others. Note that while the PDTM 2700 is configured to monitor four conductors, the PDTM may be used to monitor one or more conductors, e.g., single phase or two-phase power, which is substantially like monitoring three-phase power, which is described further herein.

The PDTM 2700 comprises the control box 1498, which is a housing that conceals a plurality of electronic components, discussed further above, that control the PDTM 2700. Additionally, the PDTM comprises a plurality of satellite current sensors 1490-1493.

The satellite current sensors 1490-1493 are structurally and functionally substantially like the satellite unit 1021 described regarding FIGS. 3, 7, and 8. In this regard, the satellite current sensors 1490-1493 detect a current through an electrical cable, bus bar, or any other type of node through which current passes into and/or from a distribution transformer.

During operation, one or more of the satellite current sensors 1490-1493 is installed about conductor(s) (e.g., cables), bus bars, or other type of node through which current travels. In addition, each of the ring terminals 1476-1479, respectively, are coupled to the conductor, bus bar, or other type of node around which their respective satellite current sensor 1490-1493 is installed.

More specifically, each satellite current sensor 1490-1493 takes current measurements over time of current that is flowing through the conductor cable, bus bar, or node around which it is installed. Also, over time, voltage measurements are sensed via each of the satellite current sensor's respective voltage cables 1484-1487. As will be described herein, the current measurements and voltage measurements taken over time are correlated and thus used to determine power usage corresponding to the conductor cable, bus bar, or node.

The PDTM 2700 further comprises a set of sensors 2701-2703. The sensors may be any type of sensor known in the art or future developed. The sensors 2701-2703 are configured to communicate with a sensor contained in a transformer circuit to which the PDTM is coupled. Note that three sensors are shown, but the PDM can comprise more or fewer sensors in other embodiments. These sensors may be infra-red sensors, probes, thermocouples, gyroscopes, tilt sensors, transducers or the like.

The PDTM 2700 further comprises a communication interface. For example, the communication interface may be a Wi-Fi interface.

Upon detection of operational data associated with the transformer circuit by the sensors 2701-2703, the PDTM, via its communication interface, is configured to transmit data indicative of the detected operational data to the central computing device 2102. Thus, an operator at the location of the central computing device 2102 may be alerted to the operational data, including a change in the transformer circuit without the need for manually inspecting the transformer circuit to which the PDTM 2700 is coupled. Note that above, a fault sensor is given as an exemplary device that may detect a fault, transmit data of the detected fault to one of the sensors, and the communication interface transmits data indicative of the detected fault to the central computing device 2102.

The system 2707 additionally comprises ports 2704-2706, like those described in FIG. 23. The ports 2704-2706 may be physically wired to a sensor. The ports 2704-2706 receive data indicative of operational data of the transformer circuit to which the PDTM is coupled and the communication interface transmits the operational data to the central computing device 2102 via the network 2408.

In one embodiment, the monitoring device 2700 further comprises a display device 2750. One such display device may be a liquid crystal display (LCD). The display device 2750 allows user interface with the functionality and operation of the monitoring device 27800.

In this regard, once the monitoring device 2700 is coupled to power, the display device 2750 may display data indicative of device booting, connecting to the network, connected to the network (with the internet protocol (IP) address), and the like. Additionally, the display device 2750 may data indicate provisioning with the server, that the monitoring device 2700 is reading voltages and/or currents, and the display shows the power factor. Notably, the display device 2750 is configured for showing any fault conditions either with the monitoring device or in the power, voltage, current, power factor, or any operational value measured by the monitoring device 2700. This indication on the display device 2750 may alert an installer to a problem with the transformer circuit, the installation, or any other alert condition associated with the monitoring device 2700.

In one embodiment, the display device 2750 may display operational values. For example, the display device 2750 may display kWh consumption in a similar way to an AMI meter.

Note that the following description describes functionality and architecture that may be attributed to both the system 2407 and the system 2707. Thus, hereinafter in the description the terms DTM 2400 and PDTM 2700 are collectively referred to as "Monitoring Devices." Further, portable device 2412 is collectively referred to as "Portable Devices." Also, the central computing devices 2102 are collectively referred to as "Central Computing Devices." Additionally, sensors 2401-2403 and 2701-2706 are collectively referred to as "Sensor Devices" and ports 2404-2406 and ports 2704-2706 are collectively referred to as "Ports." Also, networks 2408 are referred to as "Networks."

Through the Portable Devices, a user may configure the Monitoring Devices, view real-time data (e.g., power, voltage, current, power factor, etc.), and/or download historical data that may be stored in memory of the Monitoring Devices.

In another embodiment, each of the Portable Devices is further configured with a communication interface to assist in connecting to a cellular data network, mesh radio frequency (RF) network, RF local area network (LAN), or any other type of network, as appropriate. By using the described networks an installer of the Monitoring Devices can determine if the Monitoring Devices are experiencing an acceptable network condition.

In one embodiment, a utility may utilize wireless mesh networks to implement their automatic meter reading (AMR) and/or advanced metering infrastructure (AMI) networks. Many of these types of networks rely on a high density of meter devices or network repeaters to improve network integrity and capability.

The Monitoring Devices are configured to increase the density of the mesh network devices by repeating signals received, i.e., being a network repeater. Additionally, Monitoring Devices allow the utility to monitor the distribution transformer data simultaneously.

Where a utility has an AMR network that requires sending meter readers into the field who physically drive to locations nearby the electric meters to read them via a short range wireless network, the Monitoring Devices may replace these drive-by readings by implementing the same wireless network function ability and then back-hauling the meter reading data over the associated wide area network (WAN) that the Monitoring Devices use. As a mere example, a cellular Monitoring Device would take meter readings via the AMR network's native short range RF technology and then upload that meter data to the Central Computing Devices via WAN technology.

In one embodiment, Monitoring Devices may comprise a neighborhood area network (NAN) wireless mesh for communications. In such scenario, the Monitoring Devices serve as a bridge to that network to backhaul the data via the WAN connection, such as a cellular data network, a Wi-Fi connection to a broadband internet connection, etc.

In one embodiment, one of the Ports is a fiber optic port. The fiber optic port allows direct connection to utility-owned fiber optic networks. Because fiber does not conduct electricity, there is limited safety risks. In such a scenario, the Monitoring Devices are programmed to communicate via the fiber optic network to a plurality of network destinations such as the Central Computing Devices or any other server to which the Monitoring Devices are communicatively coupled. Utility customers would also have the benefit of directly integrating the Monitoring Devices with the sensors directly in their Supervisory Control and Data Acquisition (SCADA) systems or other monitoring and control systems.

In one embodiment, Monitoring Devices monitor operational values such as harmonics, transients, sags, swells, voltage and current spikes, noise, etc., via their respective Sensors. A user of the Central Computing Devices with access to the Monitoring Devices, via the Networks, can set thresholds to trigger automated alerts when the thresholds are met or exceeded. The Monitoring Devices keep a sliding window, e.g., for a predetermined period of time, of real-time values to report with the automated alert. As an example, a user would set a threshold on total harmonic distortion (THD) a particular value. When the Monitoring Devices detect that the threshold value has been met or exceeded, the Monitoring Devices access the last thirty seconds of real-time waveform data collected, append to it the next 30 seconds of real-time waveform data, and upload data to the Central Computing Devices for presentation to the user. In response, the user can view the transformer behavior before and after the THD event to determine the cause of the THD event.

In one embodiment, one of the Ports may be coupled to a device for downloading user-defined software, firmware, or the like to the Monitoring Devices. In this regard, a customer, or service provider could write custom logic programs that would enhance the Monitoring Devices' performance. As a mere example, a script of the software or firmware may read (MAX_CURRENT>AVG_ CURRENT*1.5) AND (MIN_VOLTAGE*0.95) THEN ALERT "Transformer is undersized." The user of the central computing device 2102 may receive this data, and takes steps to remedy the issue without physically going to the transformer site.

In one embodiment, the Monitoring Devices are configured to produce customizable, automated alerts to end users (e.g., user of the Central Computing Devices). These automated alerts are configured based on specific operational values either exceeding thresholds (maximum and minimum values), delta values (this operational value changed more than X amount since the last time it was reported, etc.), variance (this value is more than Y standard deviations from its average over time or for this time of the day), trigger (this operational value hits a specific value), or time-based (this operational value has been X for a time). Types of data that may be automatically monitored include Kilovolt ampere rating (KVA) and kilovolt ampere reactance (KVAR), power factor (overall and per phase), voltage imbalance, harmonic distortion (overall and per phase), sags, swells, line power loss and line power restored (overall and per phase, coupled with geographic information systems (GIS) data can automatically be transmitted to the Central Computing Devices with the addition of GIS information to show location of the line break/fault), and line fault. Note that as described above, the Monitoring Devices are configured to monitor a plurality of distribution transformers along a power grid line via wireless communication. In such an embodiment, the data transmitted to the Monitoring Devices may include data indicative of a transformer identifier or the GIS information so that a user can determine which transformer is experiencing issues.

When an alert activates, the Monitoring Devices transmit data indicative of the alert in real-time. The data is transmitted to the assigned system on the WAN and is processed and routed per programmed recipients and rules. As an example, the rule may designate the Central Computing Devices or the Portable Devices that are used by an operator in the field receive event data. In this way, the user of the Central Computing Devices or the operator of the Portable Devices may respond immediately to the alert.

In one embodiment, Monitoring Devices accurately compare the power recorded by downstream transformers. In such a scenario, it is impossible to detect all types of secondary power loss, and therefore accurately measures the amount of power for which the utility is not being paid by consumers. One way to stop theft power loss is to create reconciliation points at the distribution transformer to which the Monitoring Devices are coupled. This is accomplished by properly identifying power being delivered to downstream meters. The reconciliation device may be one or more of the Monitoring Devices that receive downstream power data and compare the power supplied downstream with the power used downstream. Thus, the Monitoring Devices can effectively address a power theft event or a mismatch of transformers to meters.

In this regard, Monitoring Devices not only collect loss of power data from the distribution transformer to which it is coupled. It also collects upstream and downstream data, which can be used to accurately sum the power losses to determine theft of power or a mismatch of transformers to meters.

As an example, a customer may set up a bypass for their air conditioning (A/C) system so that it doesn't register with the house meter, i.e., the power cable does not run through the meter so the power used is not detected and cumulated with the power used by the customer. When the customer has free (A/C), they crank the thermostat down several degrees. Measurements indicate that for every 2 degrees a set point is lowered, and the AC may take 10% more energy to maintain that temperature. The utility AMI system detects that this customer does not have the same load profile on hot summer days since last year, and seeks restitution for the theft. When the Monitoring Devices are coupled to the distribution transformer, the Monitoring Devices provide the exact amount of stolen power that is measured and not estimated.

In one embodiment, the Monitoring Devices communicate through next generation 4G networks with bandwidth capacity able to exceed 100 megabytes per second. Due to this extraordinary bandwidth and real-time capability, detailed data can be transmitted from the Monitoring Devices to the Central Computing Devices. In such a scenario, the Monitoring Devices can transmit waveform data to the user, which the user can use to remotely monitor the behavior of the distribution transformer. While streaming this type of data for protracted periods of time may be costly, the costs pale in comparison to the cost of rolling a truck to the site of the distribution transformer to collect the same detail of data. In such a scenario, compression and decompression tools may be used to allow even greater amounts of data to be processed and displayed for optimized cost.

The Central Computing Devices are configured to receive the detailed data from the Monitoring Devices. Further, the Central Computing Devices are configured to provide a virtual digital oscilloscope interface to analyze the performance of the distribution transformer in real-time, set triggers on various events, and capture raw digital values for trace analytics to decipher.

In one embodiment, by placement of the Monitoring Devices throughout a power grid, wherein the Monitoring Devices have GPS capability, such placement enables a Central Computing Device to generate a map of all Monitoring Devices in a general area. In this regard, if the Monitoring Devices are presented with the accurate AMI/AMR meter data assigned to a specific distribution transformer, the Monitoring Devices are configured to verify the correct mapping association of meters to transformers, or uncovers the mapping errors within the utility's system. Also, the Monitoring Devices reveal that there is some form of unmetered loss or unmetered DER/DG occurring at a given distribution transformer.

Adding an electric vehicle charging station, electric point-of-use water heater, high speed electric over or other significant load to a home or business is becoming commonplace. Adding such loads to an existing transformer places an unexpected and unplanned load on the transformer that could affect both the efficiency and the life expectancy of the asset. Without AMI/AMR systems and advanced analytics, the utility may be unaware that the distribution transformer is experiencing overloading situations from these added loads. The Monitoring Devices monitor the load at the distribution transformer so that it can accurately show a user of the Central Computing Devices or a user of the Portable Devices data indicative of the unaccepted load.

In one embodiment, the Monitoring Devices are configured to detect a transition from positive power (power flowing from the grid to residential or commercial end users) to negative power (power flowing into the grid from distributed generation (DG) energy models and from power flowing into the grid from distributed energy resources (DER). A DER energy model for purposes of the present application is a small-scale power generation source located close to where electricity is used (e.g., a home or business), which provides an alternative to or an enhancement of the traditional electric power grid. Such power resources can be, for example, wind turbines or photovoltaic solar panels. The DG energy model for purposes of this application is power generation at the point of consumption by generating power on-site, which eliminates the cost, complexity, interdependencies, and inefficiencies associated with transmission and distribution of energy.

The DG/DER energy models make this ongoing/daily transition (from positive power to negative power), for example as the sun sets in the evening, the grid control systems and power maintenance subsystems must be prepared to activate power delivery while reserving DG and reserve assets that come online. A distribution network with a full deployment of Monitoring Devices can provide, via transmitting an automated alert to the Central Computing Devices or the Portable Devices, the information needed to accurately determine when and how much power must be brought online to compensate for the decrease/loss of DER/DG energy being driven up into the grid. In response, the operator of the Portable Device or a user of the Central Computing Device can take steps to ensure that during the transition, power needed or not needed is effectively provided to ensure proper continuous power delivery by the grid.

Note that the life expectancy of a distribution transformer can be significantly affected by the loads that the transformer bares over a lifetime. Pushing a distribution transformer past its rated capacity can reduce the life expectancy of this critical grid asset. In such an embodiment, the Monitoring Devices provide accurate, time-based measurements of transformer loading that can feed into mathematical models at the Central Computing Devices to calculate the life expectancy based upon the load profile the distribution transformer experiences. This load profile is generated by the data transmitted to the Central Computing Devices from the Monitoring Devices.

Note that balancing the load across all three phases on an electrical distribution feeder circuit can drastically affect the efficiency of the distribution grid. Also, unbalanced loading of a feeder can stress grid assets (e.g., distribution transformers) and could potentially cause voltage imbalances and circuit failure. In such a scenario, Monitoring Devices coupled to distribution transformers are connected to the distribution grid with no regard for which phase to which the Monitoring Device is coupled. For example, in emergency power restoration scenarios, like one that would occur during a major storm, priority is placed on speed of reconnection and not on load balancing.

In such a scenario, the Monitoring Devices determines to what phase a single-phase distribution transformer is connected and the cumulative loads on that feeder. With highly accurate clocks set by sub-millisecond times servers such as a global positioning system (GPS) clocks, the Monitoring Devices can take measurements of the AC voltage line cycle zero crossing and work in concert with other Monitoring Devices, which is described above, to determine which Monitoring Devices are connected to which phase of each monitoring device.

Note that distribution transformers have a capability known as tap setting that allows the distribution transformer to be configured for slight variances in the primary voltage along the feeder. These tap settings adjust the secondary voltage slightly up or down to present the correct voltage range to the end customers. Setting the tap setting to the wrong value results in very high or very low voltage being supplied to the home or business and could cause damage to electrical equipment and systems at those locations.

The Monitoring Devices provide data that allows a utility engineer to locate distribution transformers that do not have their voltage tap settings adjusted to the proper values. In this regard, Monitoring Devices upstream or downstream from the Monitoring Devices receive data indicative of tap settings, compares the tap settings to an effective tap setting, and alerts the Portable Devices or the Central Computing Devices of the comparison. Note that a distribution transformer that lies outside of the "group" usually indicates an invalid tap setting.

Weather is one of the most important factors that affect the electrical grid. Temperature increases and decreases trigger heating ventilation and cooling (HVAC) systems to operate activate and/or deactivate. In such a scenario, the Monitoring Devices, because they communicate over some form of wide area network that could cover a utility's entire distribution grid space, offer a Monitoring Devices in a network that communicate weather data back that would not just represent the overall weather at a city or county level, but the specific weather at a given location.

In such a scenario, the Monitoring Devices comprise an integral weather Sensor such as temperature and humidity sensors. Data from the Sensors communicate over a wireless network to weather stations providing access by the Monitoring Devices with a full array of weather data. Utilities could purchase and install inexpensive wireless weather sensor packages and the Monitoring Devices report the weather data to the Central Computing Devices. In response, a user of the Central Computing Devices may take steps to ensure the vitality of the power grid based upon the weather data received from the Monitoring Devices.

In one embodiment, one of the Sensors may be a vibration sensor to detect movement or vibration. Detection of movement may indicate potential tampering or a catastrophic failure, such as a broken utility pole. The Monitoring Device may comprise threshold vibration data, and if the vibration detected by the Sensor meets or exceeds the threshold, the Monitoring Devices can report data indicative of vibration to the Portable Devices or the Central Computing Device so that proper action may be taken to ensure against complete failure of a distribution transformer.

In another embodiment of the Monitoring Devices a Sensor may detect sound. Note that the sound of a distribution transformer can indicate the health of the distribution transformer. In this regard, most distribution transformers create a small hum during operation. An increase in the volume of the hum may indicate that the load on the distribution transformer has increased. However, excessive noise, boiling sounds, loud bangs, etc. can indicate that the distribution transformer has a serious problem.

The Monitoring Devices can use the audio Sensor to record sounds. The Monitoring Device may compare the sounds to a pre-determined sound data indicating a sound threshold. Thus, if the comparison indicates a problem, the Monitoring Devices transmit data indicative of the sounds or a simple sound alert to the Central Computing Devices or the Portable Devices, so that the problem may be remedied prior to a failure of the distribution transformer.

In one embodiment, the Monitoring Devices may stream the data to the Portable Devices or the Central Computing Devices. Thus, a user or operator can hear the actual sound occurring at the distribution transformer. Note that other sounds may be detected by the audio Sensor that indicates, for example, gunshots, which could also trigger an alert or event.

Note that distribution transformers are filled with oil to maintain cooling and help with the electrolytic properties of the distribution transformer. However, when the oil leaks out, not only does this create a situation that can affect the operation of the distribution transformer, but the leak can also have an environmental impact.

In one embodiment, the Monitoring Devices comprise a vapor Sensor. The vapor sensor detects the presence of the oils used in the distribution transformer. The Monitoring Device compares the data retrieved by the sensor to a threshold value. If the data meets or exceeds the threshold value, the Monitoring Devices transmit data indicative of an alert related to the excess vapor to the Portable Devices or the Central Computing Device so that personnel can be sent to the transformer for inspection.

In one embodiment, the Monitoring Devices comprise Sensors for detecting tampering. In this regard, the Sensors may detect motion indicating that the Monitoring Devices have been moved. In addition, the Sensors may detect that the current sensors have been unlocked and opened to remove the Monitoring Devices from the distribution transformer. The Sensors may also detect that the unit has been unsealed and/or opened or that an external device has been introduced to the conductors to shield the current signature in some way.

Upon detection of any of the foregoing, the Monitoring Devices may transmit data to the Portable Devices or the Central Computing Device. Utility personnel may then be sent to the physical distribution transformer to determine the problem.

The Monitoring Devices further have a global positioning system (GPS). The GPS records data indicative of the exact location of the Monitoring Devices on the planet. In one embodiment, the location data may be transmitted to the Central Computing Device upon request or periodically. The Central Computing Device compares the location data with the utility's GIS data to ensure that align properly with the expected location of the transformer.

In normal operation, the Monitoring Devices and Central Computing Devices associated with the Monitoring Devices that calculate the energy balance equations consider the energy used by street lights. The street lights come on at dusk and go off at dawn. Most public street lights are not metered, and many public utilities are responsible for the maintenance of the street lights. Often lamps blow out and light sensors fail resulting in darkness at night and lights burning during the daylight hours.

In one embodiment, the Monitoring Devices align the unbalanced energy with the times the street lights should be on. In this regard, the Monitoring Devices can determine that there is no power being consumed when it should be (the light is out) or there is power being consumed when it should not be (the photocell is broken). Upon determination of either scenario, the Monitoring Devices transmit data indicative of the scenario to the Portable Devices or the Central Computing Devices so that personnel may be directed to the malfunctioning street light. Notably, determination of the location of the street light may be aided by the GPS described above.

As described above, DER/DG monitoring are becoming more prevalent on the grid every day. From solar panels to battery banks, the complexity of devices and systems that may be injecting power into the grid is quickly becoming unwieldly. The Monitoring Devices, as described above, can monitor whether the flow of energy at a distribution transformer is positive or negative and indicate the amount of energy being injected. Such data may be transmitted to the Central Computing Device, and the data may be used by the operator to determine at what location an additional distribution transformer may be necessary by identifying the transformers with the larger reverse power flows.

When a single polyphase transformer supplies power to multiple homes and businesses, the distribution transformer can become unbalanced. In such a scenario, one or two phases are supplying much more energy than the others. When unbalanced, a distribution transformer is inefficient and the unbalanced nature can affect the life expectancy of the distribution transformer is severe.

In one embodiment, the Monitoring Devices can detect when one or two phases are outputting more energy than the others. In this regard, the Monitoring Devices take every sample and compute the imbalance percentage periodically and track high and average imbalance measurements. At times of high imbalance, the Monitoring Devices can transmit data indicative of the imbalance so that corrective measures may be taken by the Utility.

In one embodiment, the Monitoring Devices monitor energy and voltage along a feeder. Additionally, the Central Computing Devices may transmit data to the Monitoring Devices a calculation of line-feet from the substation. The Monitoring Devices can calculate measurements for the line loss to accurately depict the losses that occur as the distance from the substation increases.

Voltage Optimization (VO) is the practice of using advanced voltage regulators on the grid to keep voltage at the minimum level that still provides acceptable voltage to consumers. Conservation Voltage Reduction (CVR) is the practice of lowering system voltages in response to peak demand or other situations that require the overall system demand to be lowered. To have an effective VO/CVR system, operating voltage is monitored along the feeder to ensure that minimum voltage limits are maintained. Many utilities do not have AMI networks deployed that could provide the near real-time feedback for an effective advanced voltage optimization control scheme.

In one embodiment of the present disclosure, the Monitoring Devices accurately measure secondary voltage at the distribution transformers throughout the grid. Thus, the voltage values measured by the Monitoring Devices may be used by the Central Computing Devices to keep voltage at a minimum level while still providing acceptable voltage to consumers. Also, the voltage values measured by the Monitoring Devices may be used to by the Central Computing Devices to lower voltages in response to peak demand or other situations that require the overall system demand to be lowered.

State estimation combines knowledge of system topology and steady-state behavior, i.e. voltages and currents of real and reactive power flows. The objective of state estimation is to identify the steady-state voltage magnitudes and angles at each bus in a network, which completely characterizes the operating state of the system, meaning the real and reactive power flows on every link, as well as power injected into or withdrawn from each bus.

State estimation for distribution systems is substantially more difficult than in transmission. However, if distribution systems are to be thoroughly understood and actively managed, knowledge of the steady-state operating condition in real-time is a precondition for interpreting specific information about devices or incident. It is also a precondition toto informing control actions aimed at optimizing the behavior of the system.

In one embodiment of the present disclosure, the Monitoring Devices are installed on each of the distribution transformer on a feeder. The Monitoring Devices are configured to allow accurate state estimations by estimating voltage magnitude and angle at every bus for a distribution transformer circuit because the distribution transformers effectively constitute a bus.

Figure 25:
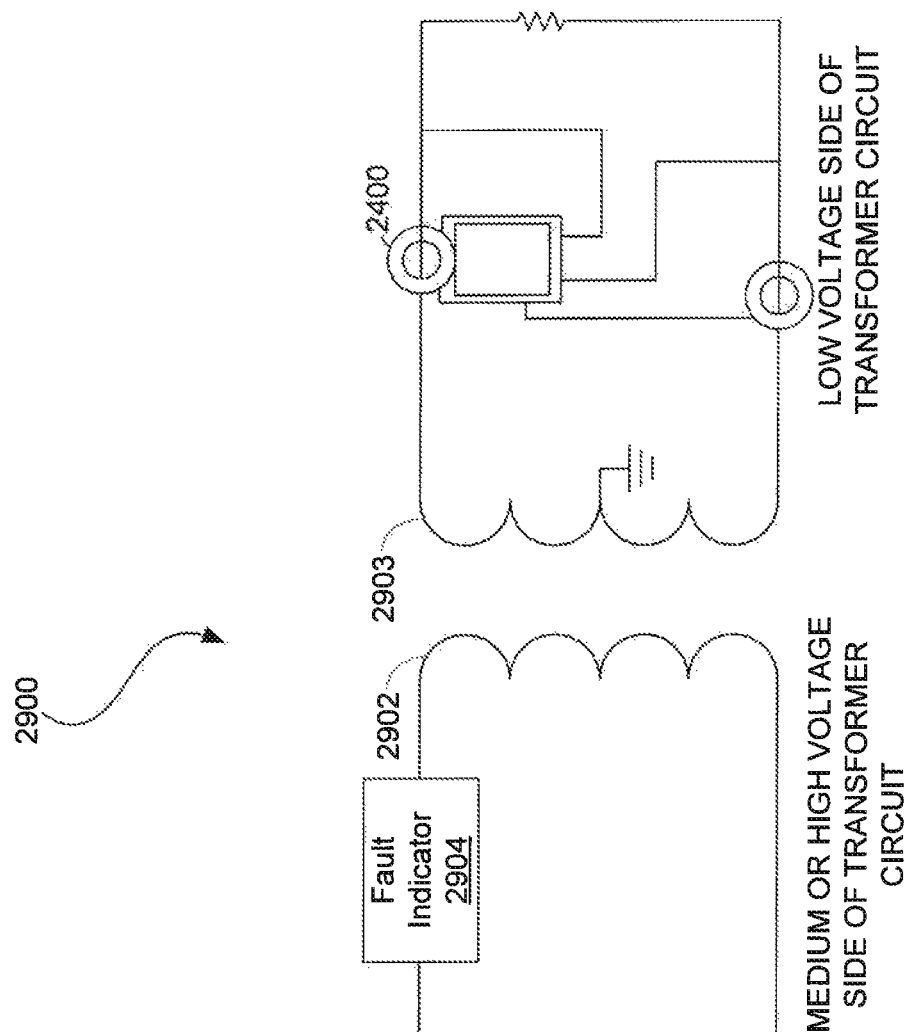
FIG. 25 is a diagram depicting a transformer circuit in accordance with an embodiment of the present disclosure.

FIG. 25 is a circuit diagram depicting a transformer circuit 2900 in accordance with an embodiment of the present disclosure. The transformer circuit 290 comprises a primary winding 2902 on the medium or high voltage side of the transformer circuit 2900. Further, the transformer circuit comprises a secondary winding 2903 on the low voltage side of the transformer circuit 2900.

A fault indicator 2904 is coupled to a medium or high voltage side of the transformer circuit 2900. Additionally, the distribution transformer monitoring device 2400, described with reference to FIG. 23, is coupled to a low voltage side of the transformer circuit 2900.

Note that the fault indicator 2904 is any type of electrical device that can detect current or voltage through the primary winding 2902. Further note that in the embodiment depicted in FIG. 28, the fault indicator 2902 is configured to transmit data indicative of a fault through the medium or high voltage side of the transformer circuit 2900.

In operation, the fault sensor 2904 is configured detect a high current passing through a conductor on the high voltage side of a transformer. Thus, if the fault indicator 2904 detects a high current through the medium or high voltage side of the transformer circuit 2900, the fault indicator 2904 transmits data indicative of the fault to the distribution transformer monitoring device 2400.

As described hereinabove, the distribution transformer monitoring device 2400 may determine, based upon the data received from the fault indicator 2904, to send data indicative of the fault to the central computing device 2102 (FIG. 23). Upon receipt, the central computing device 2102 (FIG. 23) may determine that a notification is warranted, determine to whom to send the notification, and when to send the notification.

Note that in one embodiment, the distribution transformer monitoring device 2400 may also be configured with a communication interface 2050 (FIG. 5). In such an embodiment, the distribution transformer monitoring device 2400 may be configured to transmit data indicative of the fault to the portable device 2412.

Figure 26:
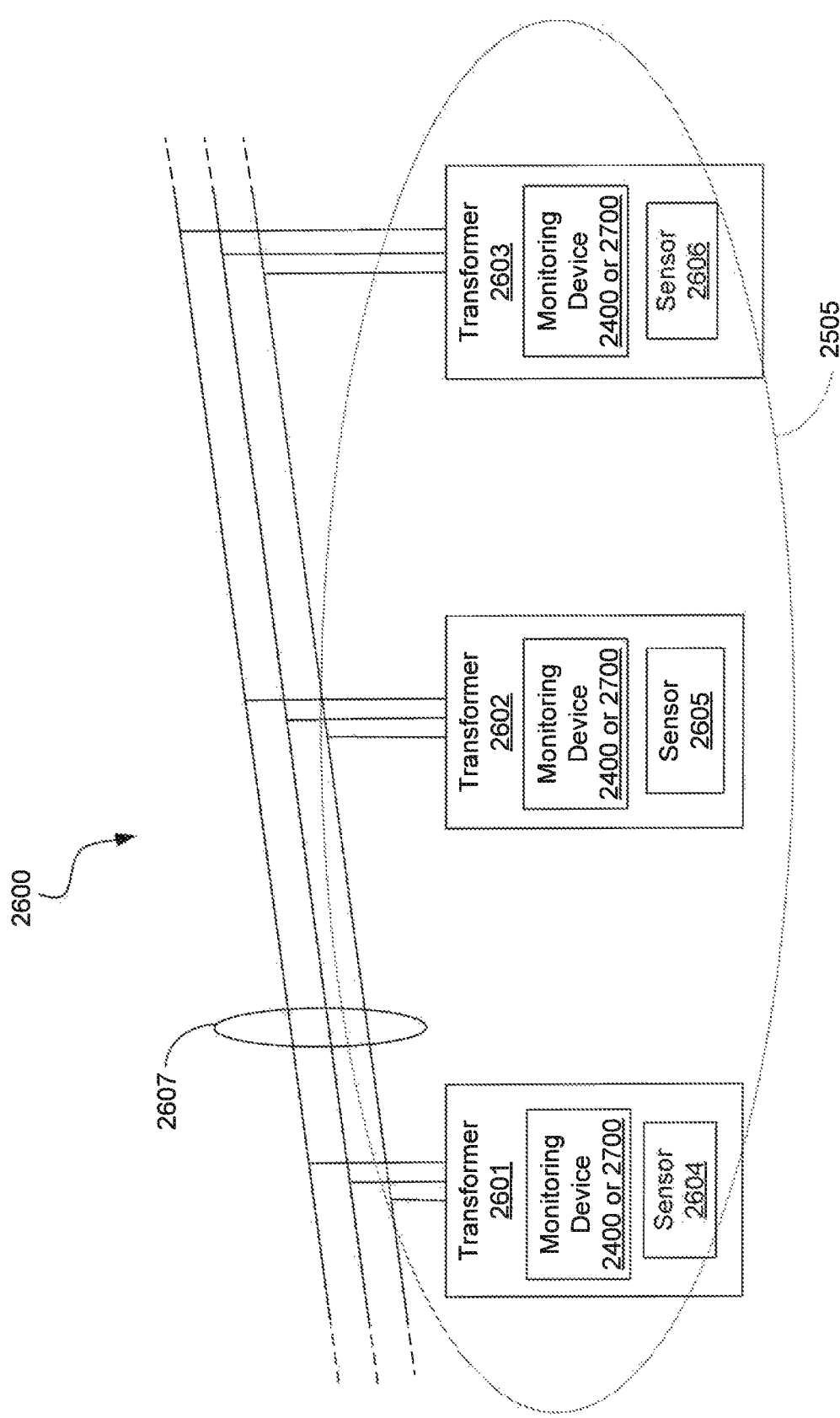
FIG. 26 is a diagram depicting multiple transformers coupled to power lines wherein at least one transformer is coupled to a monitoring device.

FIG. 26 is a system 2600 that comprises power lines 2607 that deliver power to transformer 2601 and up the line to transformer 2602 and transformer 2603. On each transformer 2601-2603, a transformer monitoring device 2400 or 2700 is installed on a low voltage side of each transformer 2601-2603. Further, on each transformer 2601-2603 is installed a sensor 2605-2606. Note that the sensors 2604-2606 may be configured to detect operational data associated with the transformers 2601-2603, respectively.

In one embodiment, the transformer monitoring devices 2400 or 2700 comprises a communication interface that communicatively couples the transformer monitoring devices 2400 and 2700. In one embodiment, the communication interface is a Wi-Fi interface for receiving and transmitting data, which is described above.

In operation, the sensors 2605 and 2606 are monitoring any type of operational data related to the transformer 2602 and transformer 2603, respectively. If an event occurs, for example an event that effects operation of the transformers 2602 or 2603, the respective distribution monitoring devices 2400 or 2700 transmit data indicative of the event wirelessly to the distribution transformer monitoring device 2400 and 2700 coupled to the transformer 2601. In turn, the monitoring devices 2400 or 2700 determine whether to transmit the data to the central computing device 2012 (FIGS. 23 and 24) or central computing device 2102 (FIGS. 23 and 24).

Figure 27:
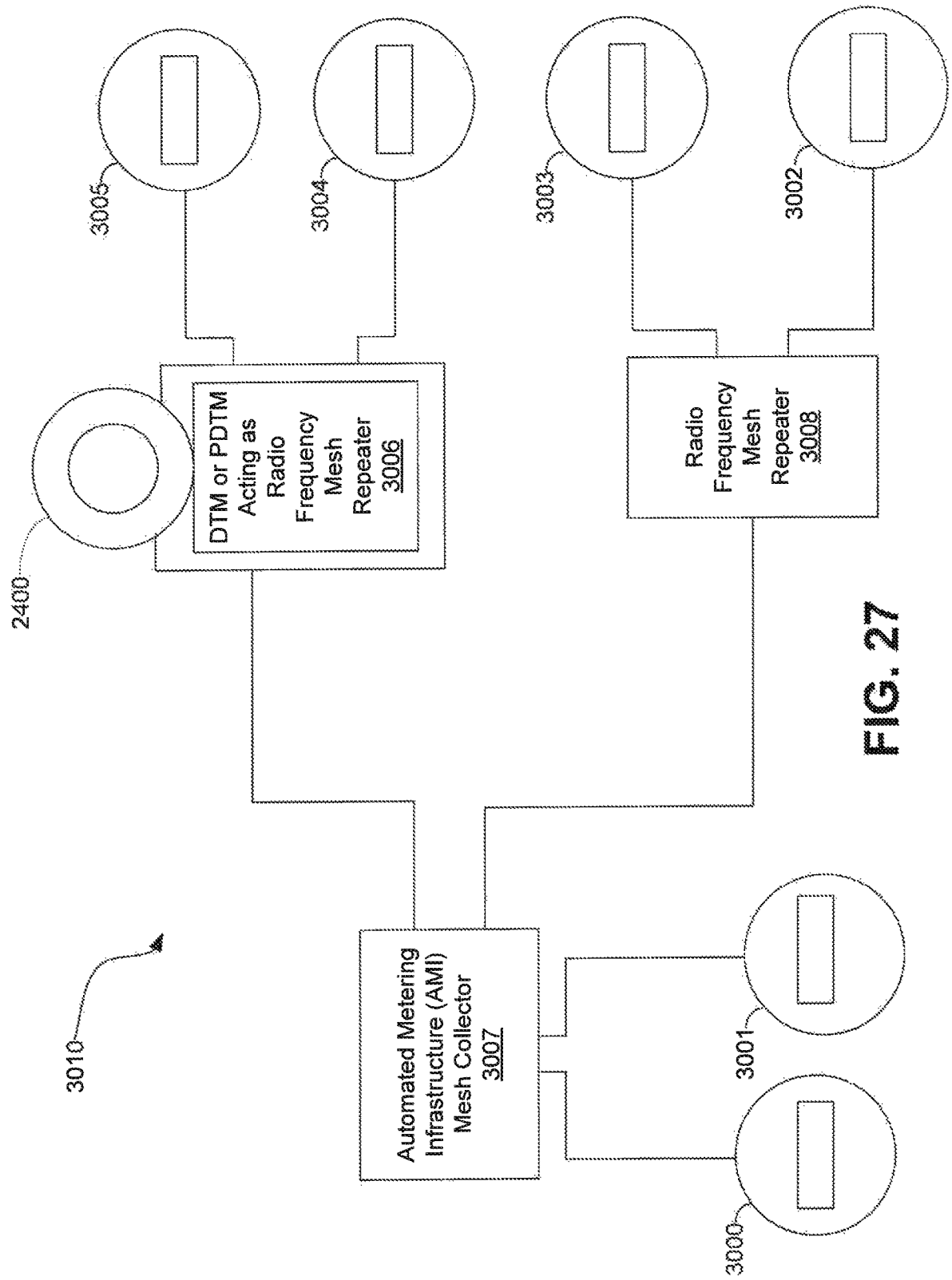
FIG. 27 is a block diagram of an exemplary distribution transformer monitoring device operating as a repeater in accordance with an embodiment of the present disclosure.

FIG. 27 depicts another system 3010 in accordance with an embodiment of the present disclosure. The system 3010 comprises a plurality of meters 3000-3005 for metering power used at customer premises (not shown).

The system 3010 comprises an automated metering infrastructure (AMI) mesh collector 3007. The mesh collector 3007 collects data from the meters 3000-3001. In the embodiment shown, the system 3010 further comprises a radio frequency (RF) mesh repeater 3008. In a typical AMI mesh system, data is obtained from meters, e.g., 3003 and 3002, and the data collected is transmitted to the AMI mesh collector.

In one embodiment, the system 3010 comprises a DTM 2400 or a PDTM 2700. The DTM 2400 or PDTM 2700 collects data from meters 3005 and 3004. In such a scenario, the DTM 2400 or the PDTM 2700 is configured as a repeater similar to the RF mesh repeater 3008. Thus, the DTM 2400 or the PDTM 2700 can transmit data collected to the AMI mesh collector 2700.

Figure 28B:
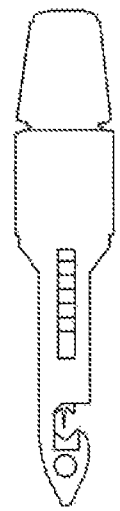
FIG. 28A-28E are depictions of exemplary voltage terminators that may be used on the monitoring devices depicted in FIGS. 23 and 24.
Figure 28D:
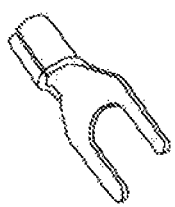
Figure 28E:
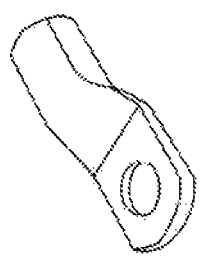
Figure 28A:
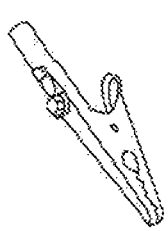
Figure 28C:
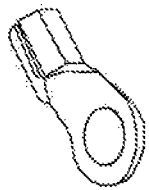

FIGS. 28A, 28B, 28C, and 28C all represent terminators for voltage cables. In this regard, FIG. 28A is an alligator clip that could be used to couple a voltage lead with a node. FIG. 29B is a piercing connector, FIG. 28C is a ring terminal, and FIG. 28D is a spade terminal. Any of these choice connectors may be used to coupled voltage cables to the distribution transformer.

Additionally, voltage cables could be offered in various lengths along with the variety of termination types. Also, since different countries and even different areas of a country tend to use different color schemes for polyphase circuit identification. These interchangeable voltage leads are offered with a variety of color bands installed so that the appropriate colors can be used for the local utility to properly identify the multiple phases for proper installation of the Monitoring Devices.

What is claimed is:

1. A monitoring system, comprising:
  one or more voltage sensors configured integral in a single housing for detecting a voltage of a power cable of a transformer;
  one or more current sensors integral in the single housing configured for detecting a current in the power cable of the transformer;
  at least one internal sensor that is not one of the voltage sensors and is not one of the current, sensors, the internal sensor integral with the voltage sensor and the current sensor, the internal sensor not configured to measure voltage and/or current but configured to collect transformer data indicative of information related to the operation of the transformer and detect an event on the transformer;
  a processor configured to receive, from the at least one internal sensor data indicative of the event, which is not only data indicative of voltage and/or current, the processor further configured to perform an analysis on the data indicative of the event and determine an action to be taken based upon the data indicative of the event.

2. The system of claim 1, further comprising at least one wired interface communicatively coupled to at least one external sensor.

3. The system of claim 2, wherein the external sensor is a fault detector, a temperature sensor, or a probe.

4. The system of claim 1, further comprising at least one wireless interface to an external sensor.

5. The system of claim 4, wherein the external sensor is a fault detector or weather sensor.

6. The system of claim 1, further comprising a network interface configured to communicatively couple the monitoring device to a remote central computing device.

7. The system of claim 6, wherein the processor is further configured to determine that an event has occurred by determining whether an operational value falls below, meets, or exceeds a threshold value and to transmit data indicative of the event to the remote central computing device.

8. The system of claim 1, further comprising a display device configured to display data corresponding to the transformer.

9. The system of claim 1, further comprising an interface configured to communicatively couple the monitoring device to a portable device.

10. The system of claim 1, wherein the processor is further configured to collect waveform data and perform operations based upon the waveform data.

11. The system of claim 1, wherein the processor is further configured to collect load data indicative of a load on the transformer and perform operations based upon the load data.

12. The system of claim 1, wherein the processor is further configured to collect power flow direction data and perform operations based upon the power flow direction data.

13. The system of claim 1, wherein the processor is further configured to determine if power theft related to the transformer is occurring.

14. The system of claim 1, wherein the processor is further configured to receive and to forward the signal received via a mesh network.

15. The system of claim 1, wherein the processor is further configured to obtain meter data through an automatic meter reading (AMR) system and transmit the meter data to a remote central computing device.

16. The system of claim 1, further comprising an electronic component configured to store power for use by the monitoring device when the transformer loses power.

17. The system of claim 16, wherein the processor is further configured to collect data indicative of operational values of the transformer prior to the transformer losing power.

18. The system of claim 17, wherein after the transformer loses power, the processor is further configured to transmit operational data indicative collected prior to the loss of power.

19. The system of claim 1, further comprising a temperature sensor, wherein the processor is configured to receive an input of an ambient temperature corresponding to the transformer, determine when the ambient temperature exceeds a threshold, and when the ambient temperature exceeds the threshold, the processor is configured to transmit data indicative of the ambient temperature to a central computing device.

20. The system of claim 1, wherein the processor is further configured to measure power, voltage, or current of at least one phase of the transformer and compare the power, voltage, or current to a threshold value.

21. The system of claim 20, wherein the processor is further configured to transmit data indicative of the power, voltage, or current exceeding the threshold to a central computing device.

22. The system of claim 1, wherein the processor is further configured to measure voltage imbalance of the transformer and when the voltage is imbalanced, transmit data indicative of the imbalance to a central computing device.

23. The system of claim 1, wherein the processor is further configured to monitor a power factor of the transformer and when the power factor exceeds a threshold value, the processor is further configured to transmit data indicative of the power factor to a central computing device.

24. The system of claim 1, wherein the processor is further configured to compare data indicative of power of the transformer to a power value corresponding to a particular time of day, and if the power of the transformer exceeds or falls below a threshold value indicative of historical data associated with the transformer, the processor is further configured to transmit data indicative of the power to a central computing device.

25. The system of claim 1, wherein the processor is further configured to capture waveform data corresponding to the transformer and transmitting the waveform data to a central computing device.

26. The system of claim 1, wherein the processor and at least one of the voltage sensors reside within a housing, wherein at least one of the current sensors is contiguous with the housing, the current sensor structurally formed as an opening having a first half-circle and a second half-circle that when the first half-circle and the second half-circle are rotated inwardly and hingedly coupled, the first half-circle and the second half circle install about a conductor.

27. The system of claim 26, wherein the processor residing in the housing detects the event and transmits data indicative of the event to a remote central computing device.

28. The system of claim 27, wherein the remote central computing device is configured to alert a user of the computing device of the event and the action to be taken to address the event.

29. The system of claim 1, wherein the processor resides on a remote central computing device, the processor configured to perform an analysis on the data indicative of the event and determine an action to be taken based upon the data indicative of the event.

30. The system of claim 29, wherein the processor on the remote central computing device is configured to perform an analysis on the data indicative of the event and determine an action to be taken based upon the data indicative of the event.

31. The system of claim 30, wherein the processor on the remote central computing device is further configured to alert a user of the remote central computing device of the event.

* * * * *